US007382815B2

(12) United States Patent
Spangler et al.

(10) Patent No.: US 7,382,815 B2
(45) Date of Patent: *Jun. 3, 2008

(54) LASER SPECTRAL ENGINEERING FOR LITHOGRAPHIC PROCESS

(75) Inventors: Ronald L. Spangler, Arlington, MA (US); Jacob P. Lipcon, Winchester, MA (US); John A. Rule, Hingham, MA (US); Robert N. Jacques, La Jolla, CA (US); Armen Kroyan, San Diego, CA (US); Ivan Lalovic, San Diego, CA (US); Igor V. Fomenkov, San Diego, CA (US); John M. Algots, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 41 days.

This patent is subject to a terminal disclaimer.

(21) Appl. No.: 10/915,517

(22) Filed: Aug. 9, 2004

(65) Prior Publication Data

US 2005/0068997 A1    Mar. 31, 2005

Related U.S. Application Data

(63) Continuation of application No. 10/036,925, filed on Dec. 21, 2001, now Pat. No. 6,853,653, which is a continuation-in-part of application No. 09/918,773, filed on Jul. 27, 2001, now Pat. No. 6,671,294, and a continuation-in-part of application No. 09/608,543, filed on Jun. 30, 2000, now Pat. No. 6,721,340, and a continuation-in-part of application No. 09/854,097, filed on May 11, 2001, now Pat. No. 6,757,316, and a continuation-in-part of application No. 09/597,812, filed on Jun. 19, 2000, now Pat. No. 6,529,531, which is a continuation-in-part of application No. 08/898,630, filed on Jul. 22, 1997, now Pat. No. 6,078,599, and a continuation-in-part of application No. 09/501,160, filed on Feb. 9, 2000, now Pat. No. 6,621,846.

(51) Int. Cl.
*H01S 5/00* (2006.01)

(52) U.S. Cl. .......................... 372/55; 372/57

(58) Field of Classification Search .................. 372/20, 372/55, 57
See application file for complete search history.

(56) References Cited

U.S. PATENT DOCUMENTS 4,223,279 A    9/1980    Bradford, Jr. et al. ..... 331/94.5

(Continued)

FOREIGN PATENT DOCUMENTS

WO    WO00/38286    6/2000
WO    WO02/093700    11/2002

OTHER PUBLICATIONS

Kroyan et al., "Modeling the effects of excimer laser bandwidths on lithographic performance". Proceedings of the SPIE—The International Society for Optical Engineering 2000 SPIE-Int. Soc. Opt. Eng. USA, vol. 4000, Jul. 2000, pp. 658-664, XP 002368470 USA.

*Primary Examiner*—Dung Nguyen
(74) *Attorney, Agent, or Firm*—William Cray

(57) ABSTRACT

An integrated circuit lithography technique called spectral engineering by Applicants, for bandwidth control of an electric discharge laser. In a preferred process, a computer model is used to model lithographic parameters to determine a desired laser spectrum needed to produce a desired lithographic result. A fast responding tuning mechanism is then used to adjust center wavelength of laser pulses in a burst of pulses to achieve an integrated spectrum for the burst of pulses approximating the desired laser spectrum. The laser beam bandwidth is controlled to produce an effective beam spectrum having at least two spectral peaks in order to produce improved pattern resolution in photo resist film. Line narrowing equipment is provided having at least one piezoelectric drive and a fast bandwidth detection control system having a time response of less than about 2.0 millisecond. In a preferred embodiment, a wavelength tuning mirror is dithered at dither rates of more than 500 dithers per second in phase with the repetition rate of the laser. In one case, the piezoelectric drive was driven with a square wave signal and in a second case it was driven with a sine wave signal. In another embodiment, the maximum displacement was matched on a one-to-one basis with the laser pulses in order to produce a desired average spectrum with two peaks for a series of laser pulses. Other preferred embodiments utilize three separate wavelength tuning positions producing a spectrum with three separate peaks.

196 Claims, 42 Drawing Sheets

U.S. PATENT DOCUMENTS

| | | | |
|---|---|---|---|
| 4,455,658 A | 6/1984 | Sutter et al. | 372/38 |
| 4,697,270 A | 9/1987 | Galkowski | 372/34 |
| 4,798,467 A | 1/1989 | Wyeth et al. | 356/349 |
| 4,817,101 A | 3/1989 | Wyeth et al. | 372/32 |
| 4,823,354 A | 4/1989 | Znotins et al. | 372/57 |
| 4,881,231 A | 11/1989 | Jain | 372/32 |
| 4,883,352 A | 11/1989 | Bruning | 353/122 |
| 4,937,619 A | 6/1990 | Fukuda et al. | 355/53 |
| 4,940,331 A | 7/1990 | Wyeth et al. | 356/349 |
| 4,959,840 A | 9/1990 | Akins et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,095,492 A | 3/1992 | Sandstrom | 372/102 |
| 5,128,601 A | 7/1992 | Orbach et al. | 372/29 |
| 5,189,678 A | 2/1993 | Ball et al. | 372/28 |
| 5,303,002 A | 4/1994 | Yan et al. | 355/53 |
| 5,315,611 A | 5/1994 | Ball et al. | 372/56 |
| 5,371,587 A | 12/1994 | De Groot et al. | 356/349 |
| 5,373,515 A | 12/1994 | Wakabayashi et al. | 372/20 |
| 5,420,877 A | 5/1995 | Sandstrom | 372/34 |
| 5,440,578 A | 8/1995 | Sandstrom | 372/59 |
| 5,448,580 A | 9/1995 | Birx et al. | 356/349 |
| 5,471,965 A | 12/1995 | Kapich | 123/565 |
| 5,524,144 A | 6/1996 | Suzuki | 359/176 |
| 5,691,989 A | 11/1997 | Rakuljic | 372/20 |
| 5,706,301 A | 1/1998 | Lagerström | 372/32 |
| 5,754,571 A | 5/1998 | Endoh et al. | 372/20 |
| 5,848,089 A * | 12/1998 | Sarkar et al. | 372/58 |
| 5,852,621 A | 12/1998 | Sandstrom | 372/25 |
| 5,856,991 A | 1/1999 | Ershov | 372/57 |
| 5,870,420 A | 2/1999 | Webb | 372/58 |
| 5,901,163 A * | 5/1999 | Ershov | 372/20 |
| 5,953,360 A | 9/1999 | Vitruk et al. | 372/87 |
| 5,978,394 A | 11/1999 | Newman et al. | 372/32 |
| 5,978,405 A | 11/1999 | Juhasz et al. | 372/57 |
| 5,991,324 A | 11/1999 | Knowles et al. | 372/57 |
| 6,005,879 A | 12/1999 | Sandstrom et al. | 372/25 |
| 6,018,537 A | 1/2000 | Hofmann et al. | 372/25 |
| 6,067,311 A | 5/2000 | Morton et al. | 372/57 |
| 6,104,735 A | 8/2000 | Webb | 372/37 |
| 6,128,323 A | 10/2000 | Myers et al. | 372/38 |
| 6,154,470 A | 11/2000 | Basting et al. | 372/19 |
| 6,164,116 A | 12/2000 | Rice et al. | 73/1.72 |
| 6,181,724 B1 * | 1/2001 | Tanaka et al. | 372/57 |
| 6,208,674 B1 | 3/2001 | Webb et al. | 372/57 |
| 6,208,675 B1 | 3/2001 | Webb | 372/58 |
| 6,219,368 B1 | 4/2001 | Gorokov | 372/59 |
| 6,263,002 B1 | 7/2001 | Hsu et al. | 372/6 |
| 6,348,357 B2 | 2/2002 | Sano | 438/16 |
| 6,477,193 B2 | 11/2002 | Oliver et al. | 372/58 |
| 6,853,653 B2 * | 2/2005 | Spangler et al. | 372/20 |
| 2002/0114362 A1 * | 8/2002 | Vogler et al. | 372/32 |

* cited by examiner

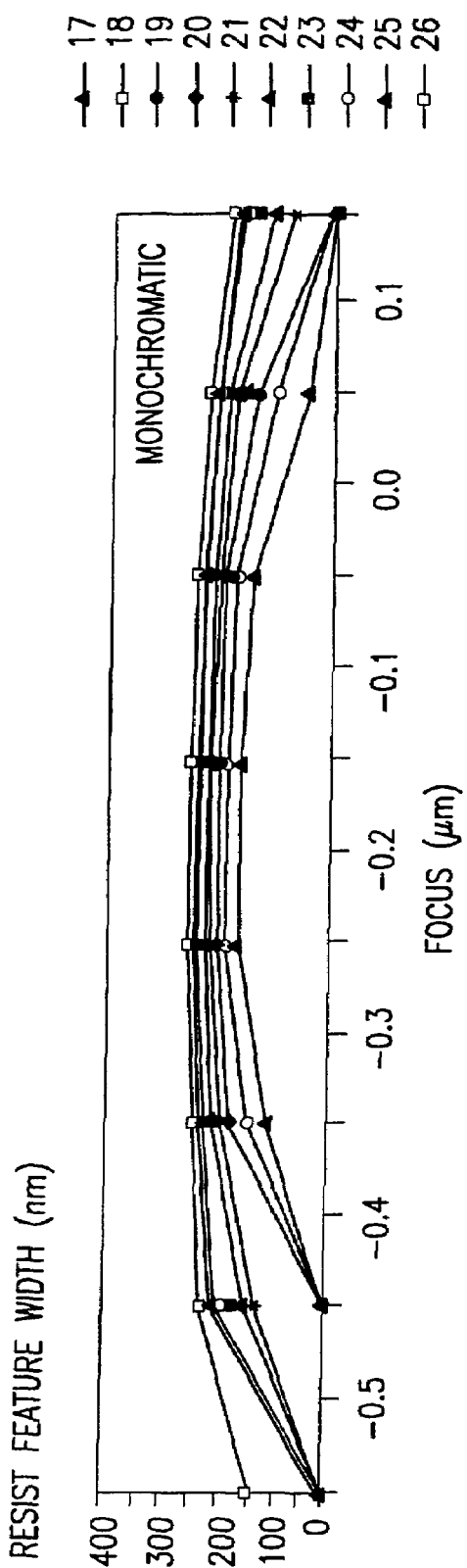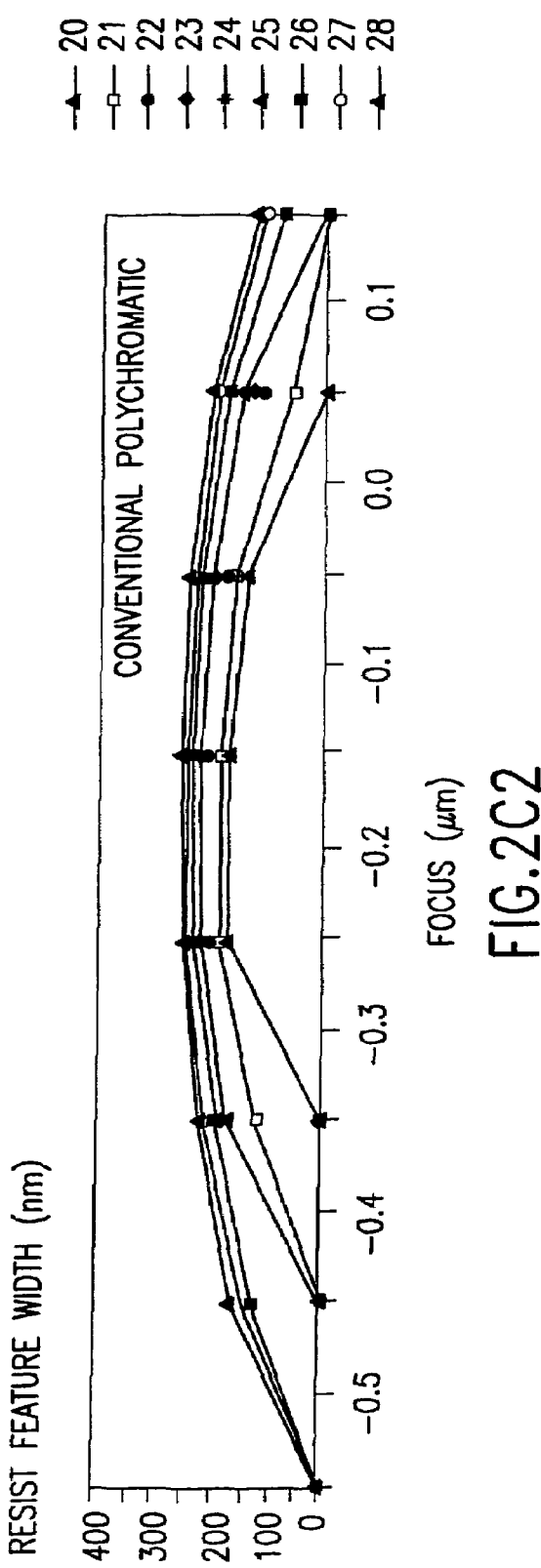

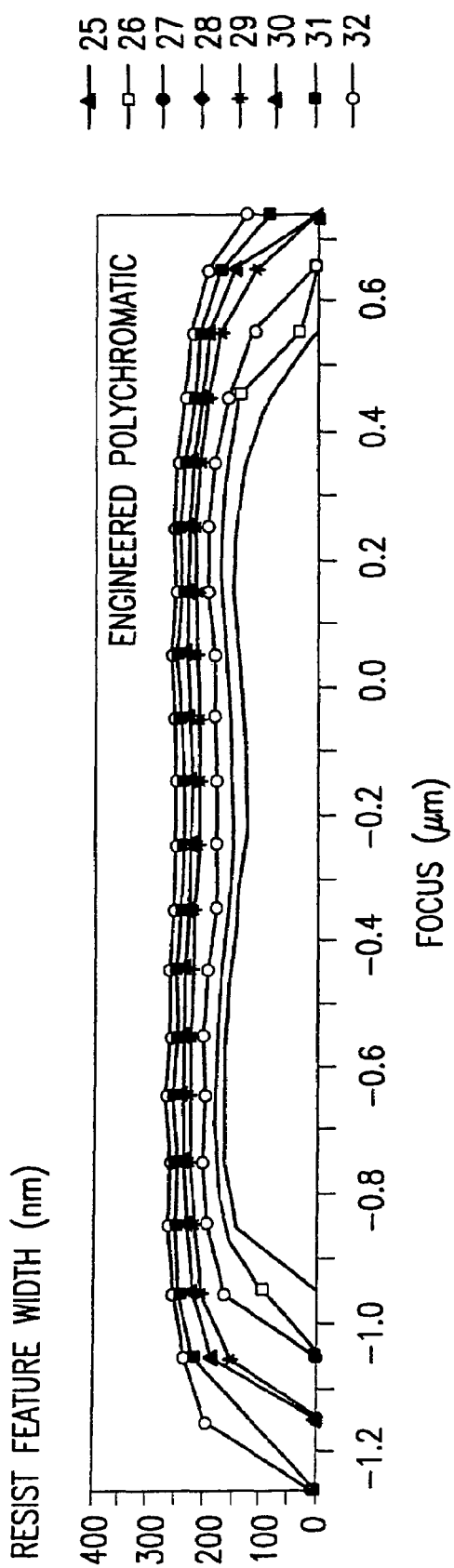
FIG.2C3

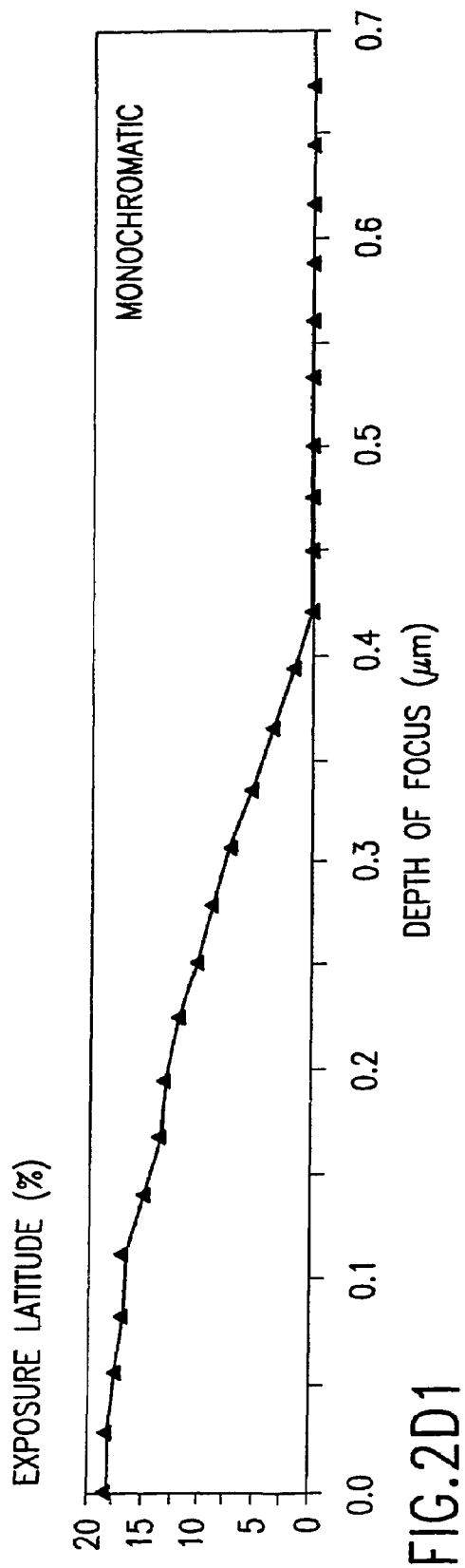
FIG.2D1
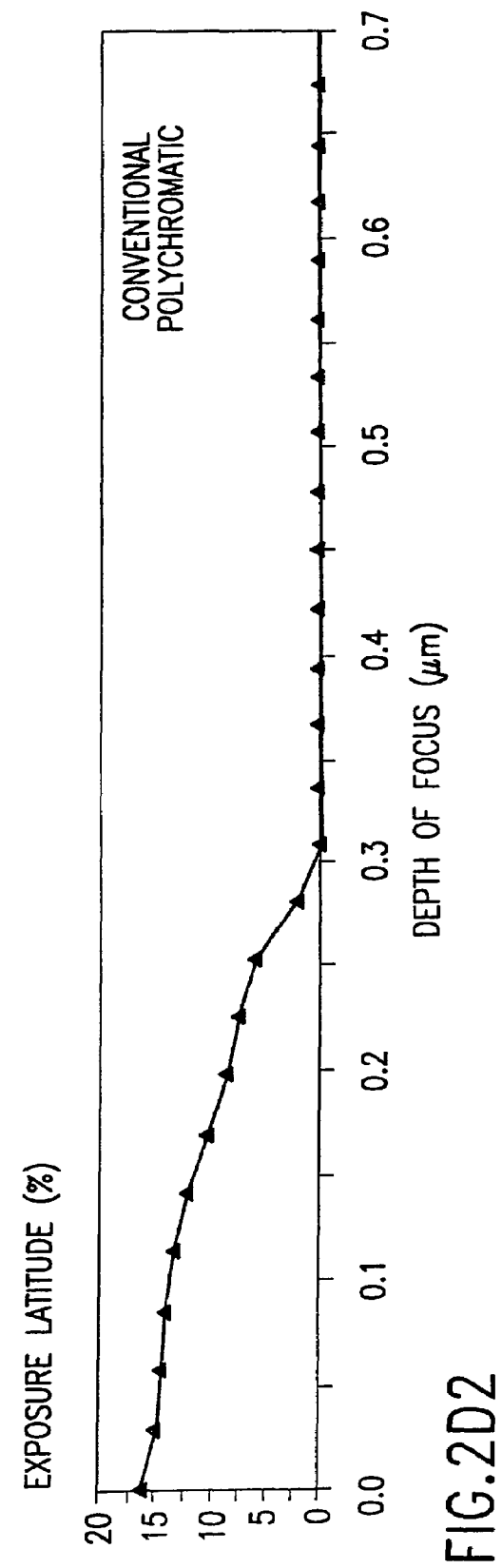
FIG.2D2

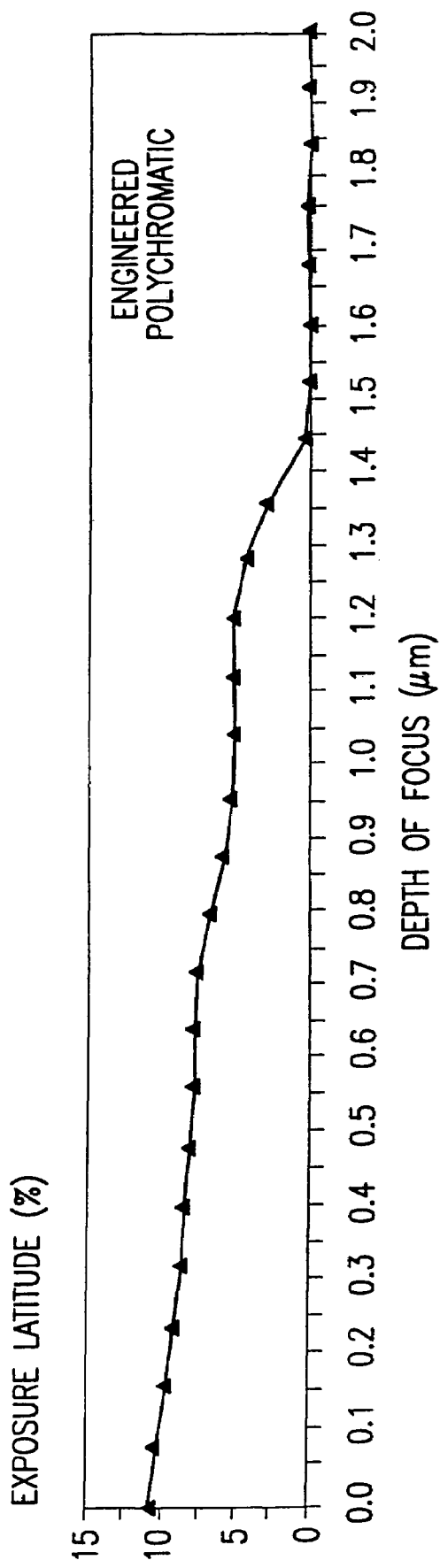
FIG.2D3

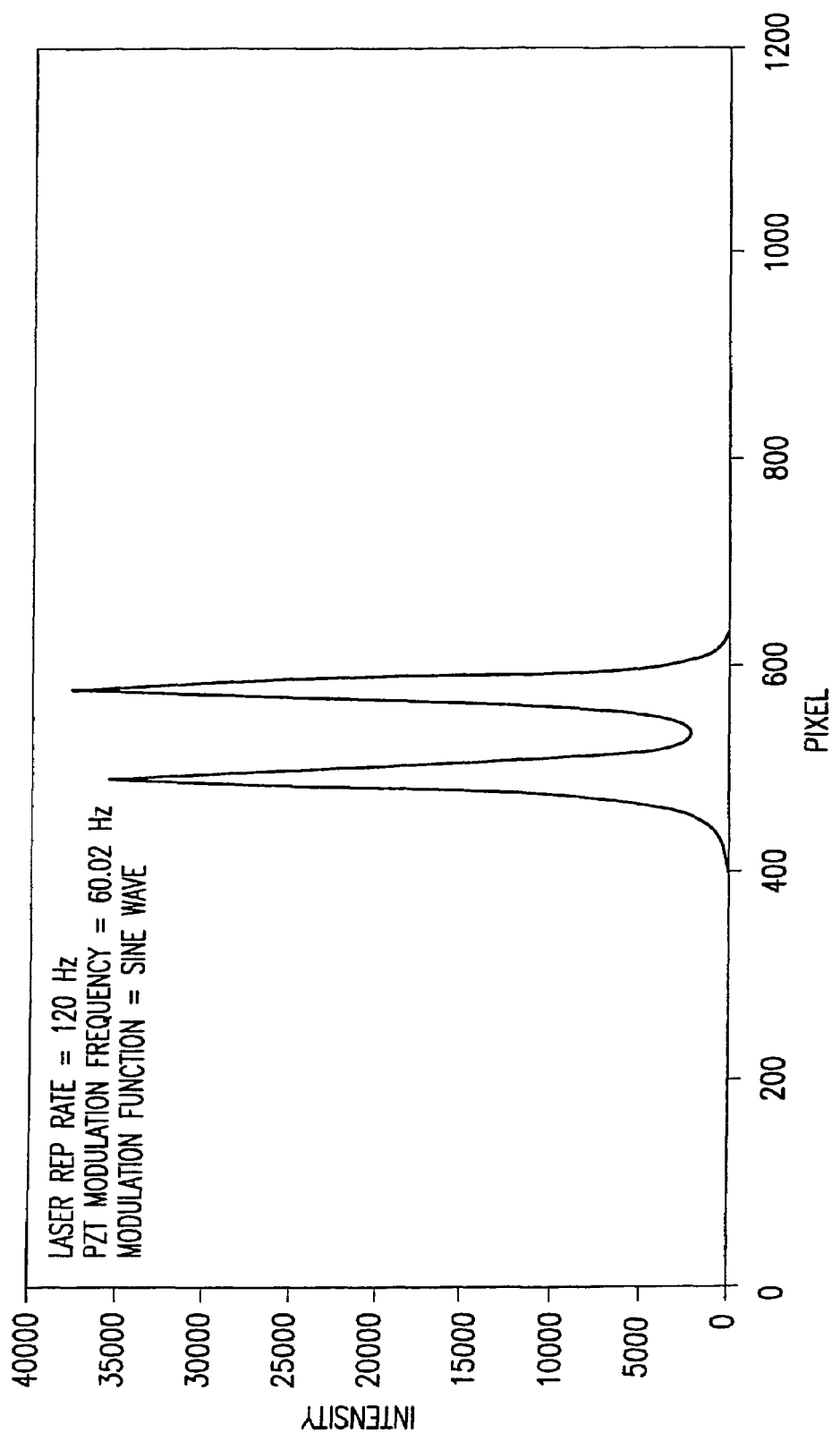

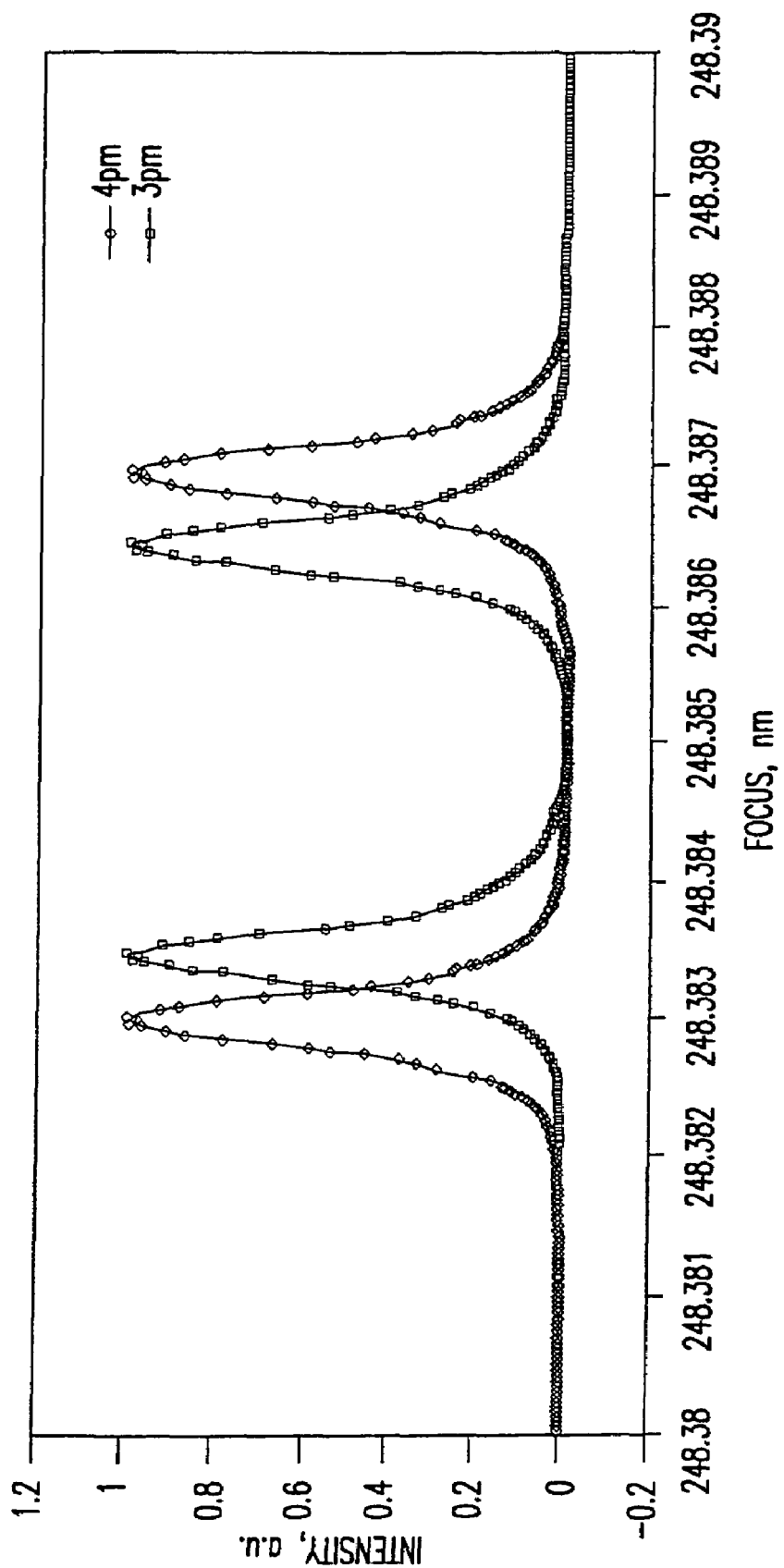
FIG. 2G1

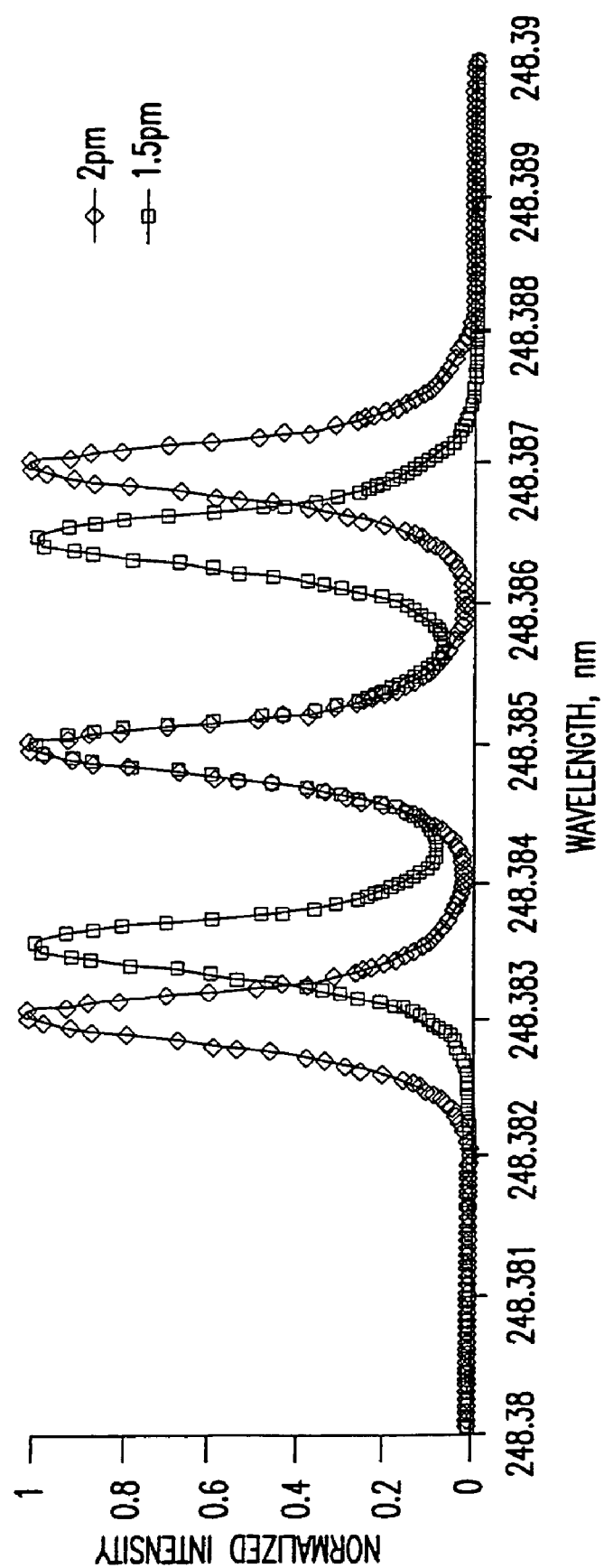
FIG. 2G2

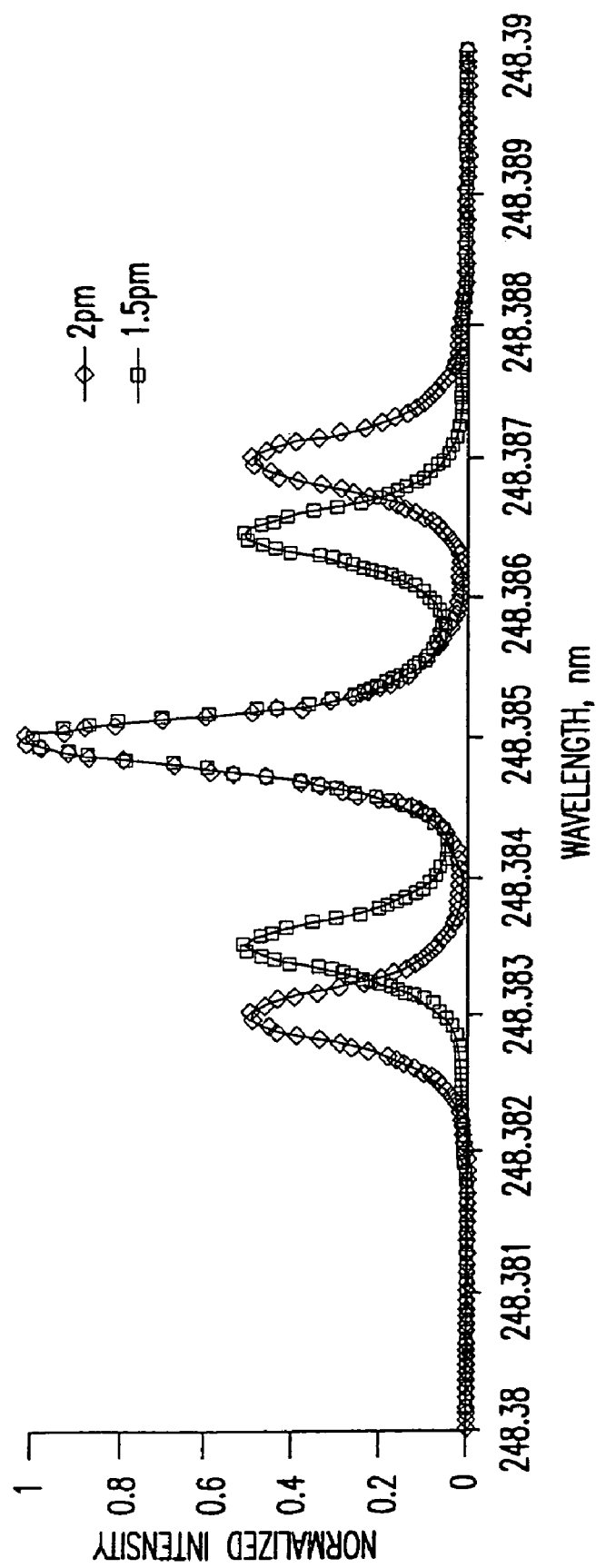
FIG. 2G3

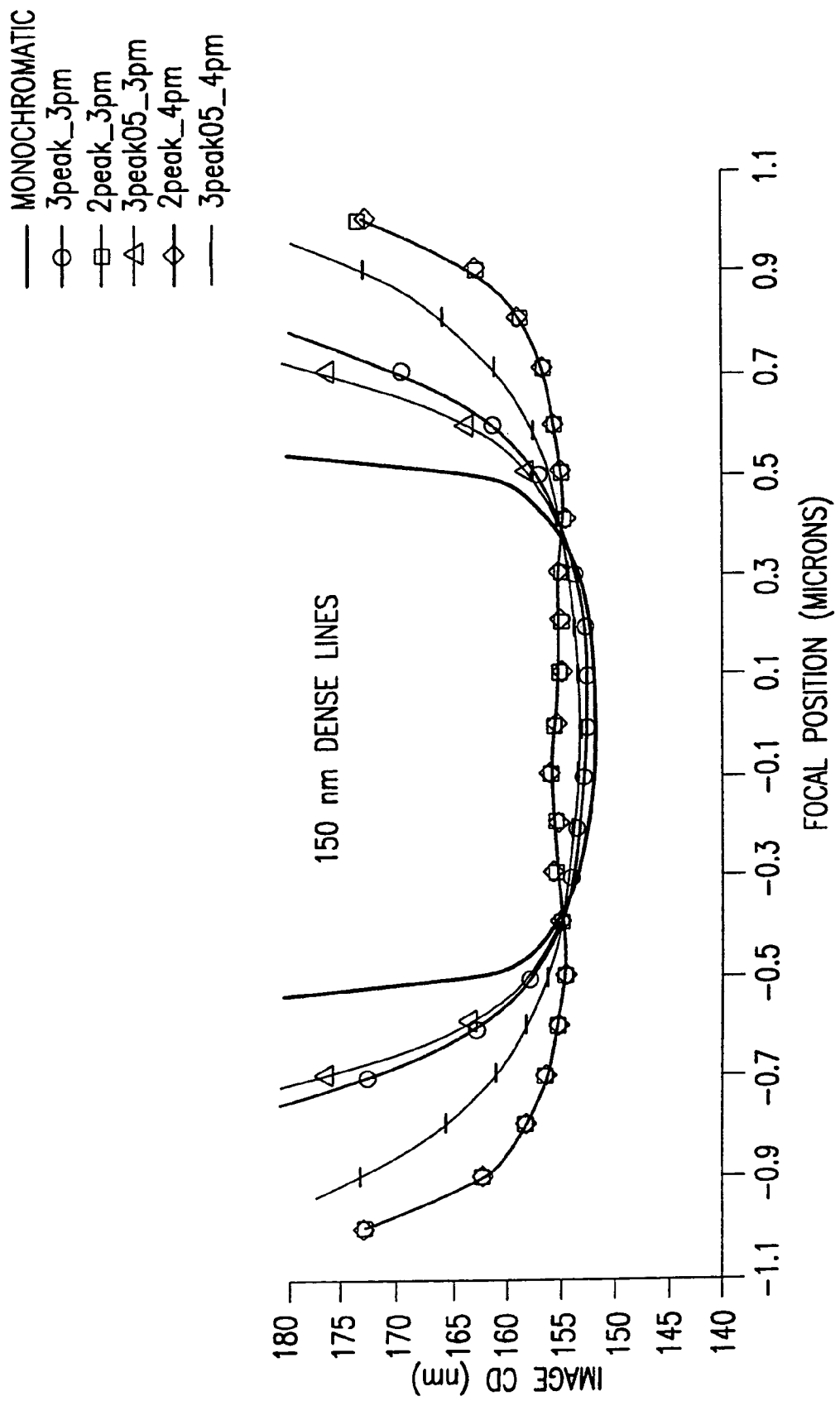
FIG.2H1

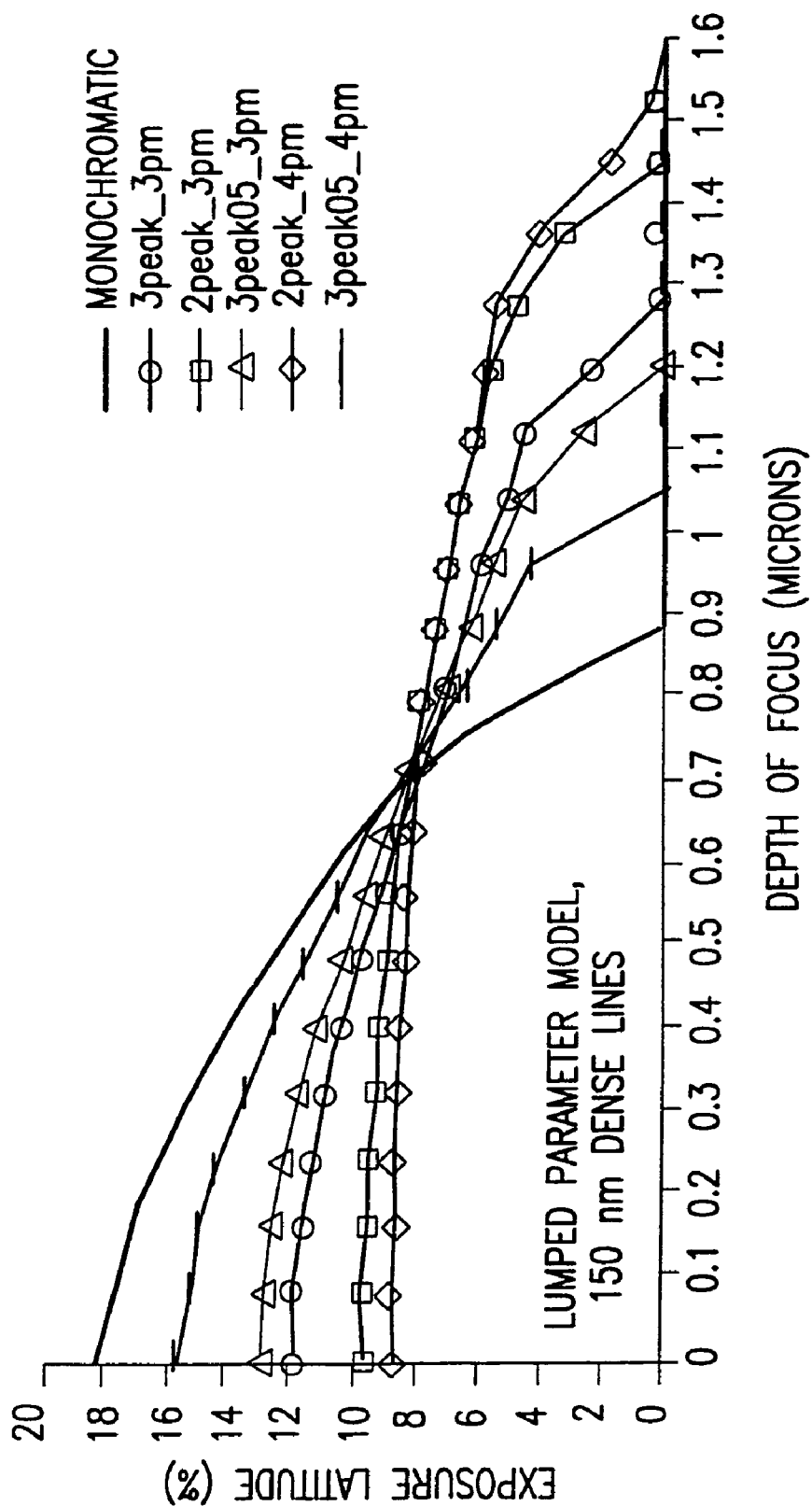
FIG.2H2

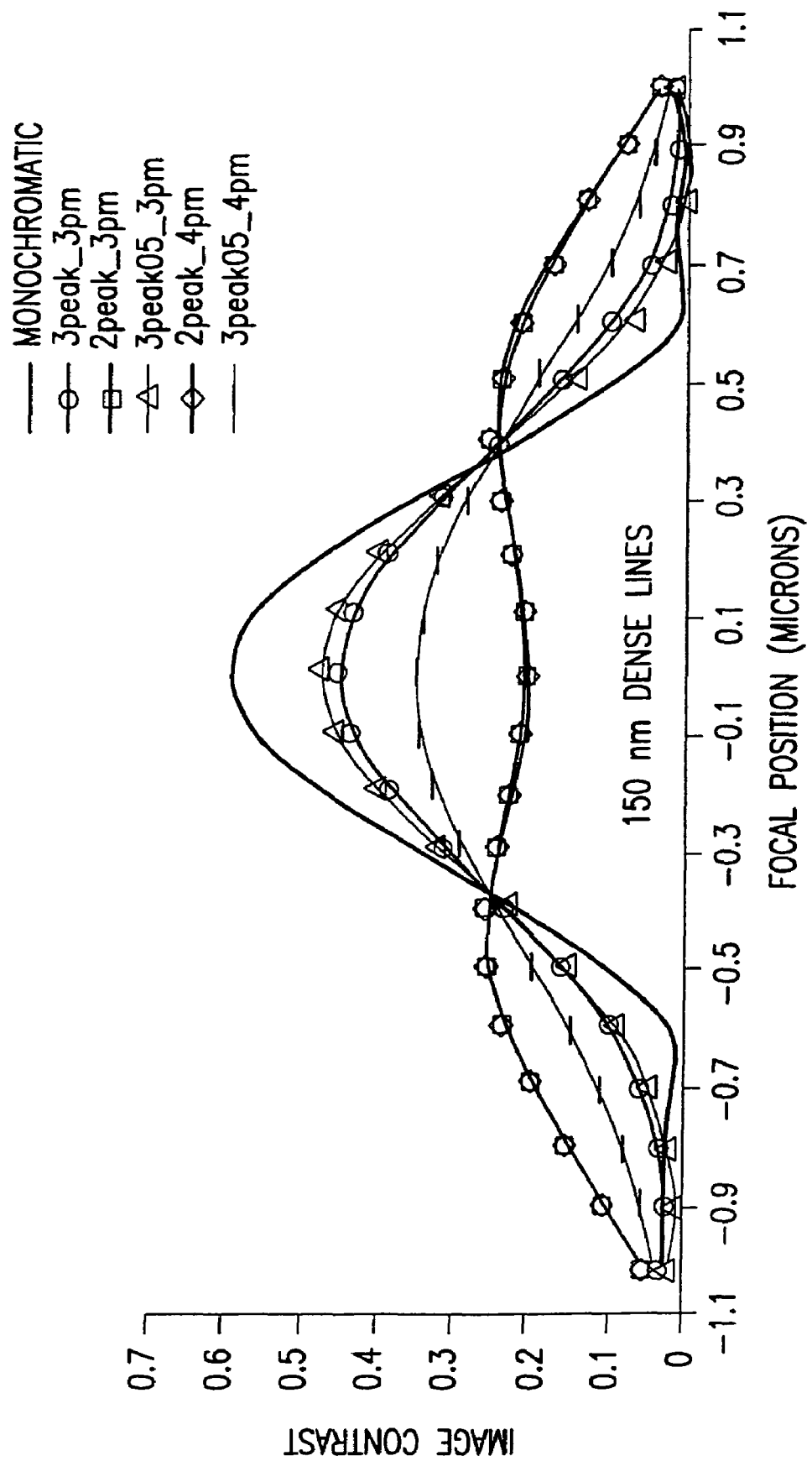
FIG.2H3

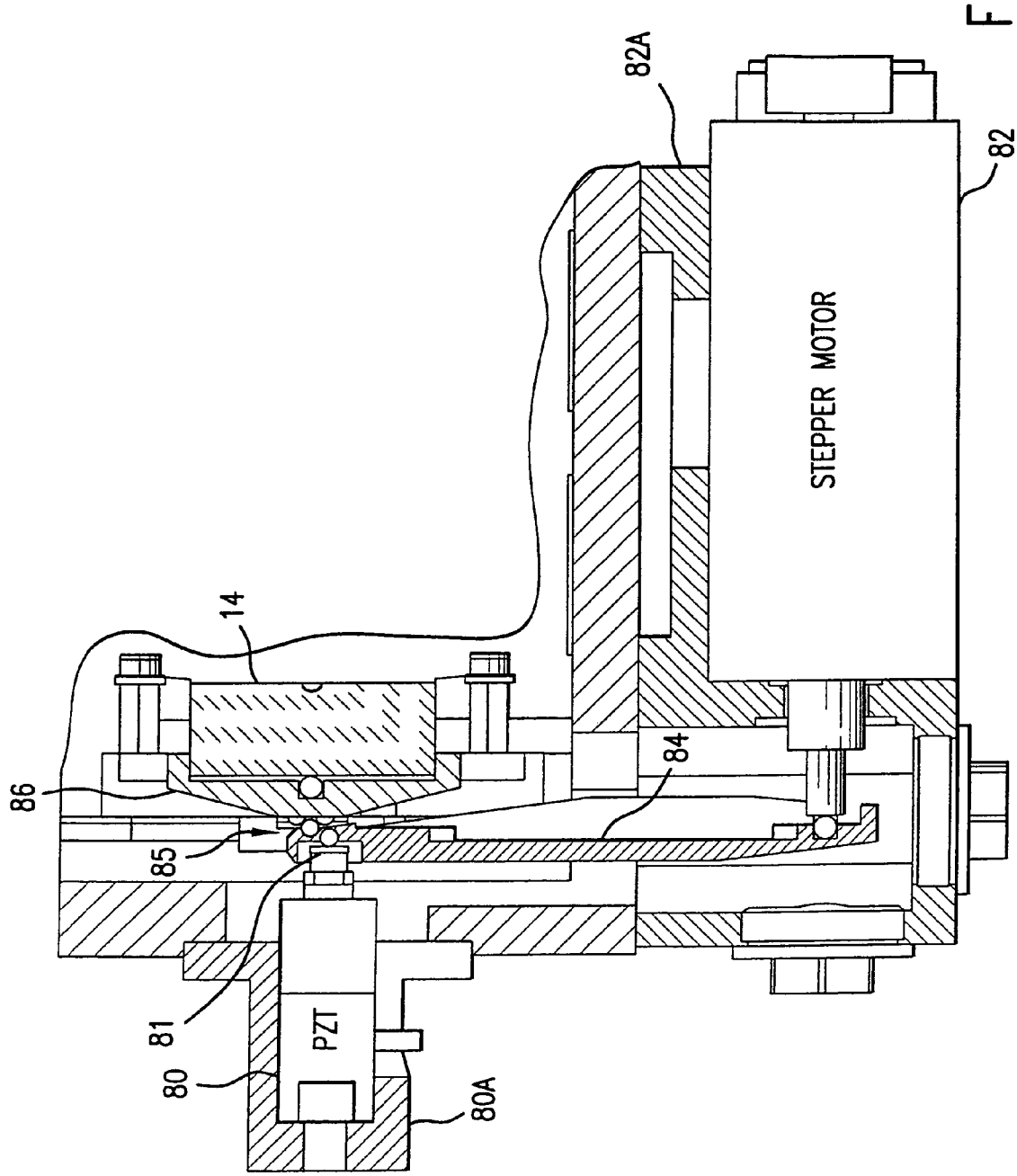
FIG. 8B1

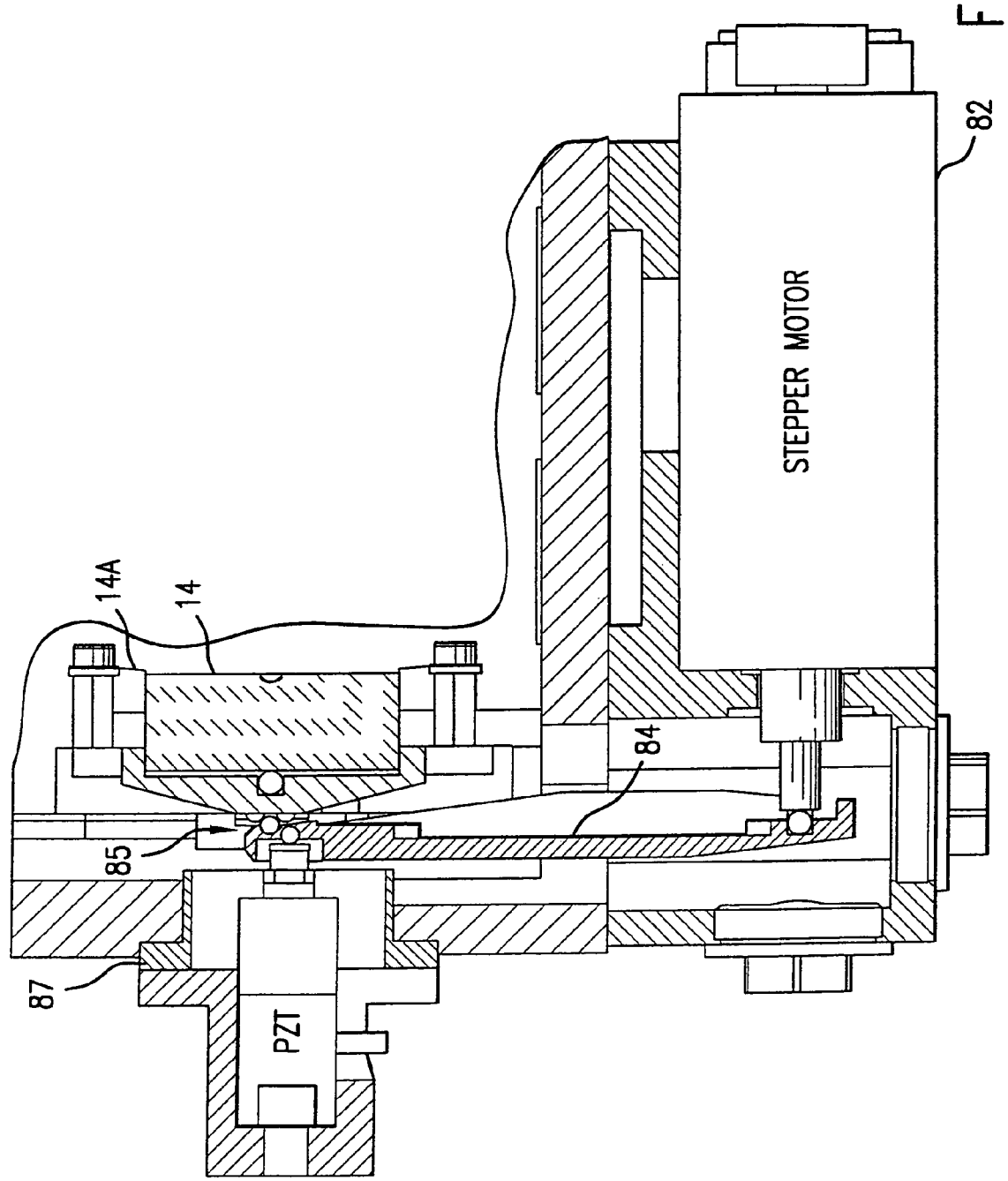

LASER SPECTRAL ENGINEERING FOR LITHOGRAPHIC PROCESS

FIELD OF THE INVENTION

This application is a continuation of Ser. No 10/036,925, filed on Dec. 21, 2001, now U.S. Pat. No. 6,853,653 which is a continuation-in-part of Ser. No. 09/918,773, filed Jul. 27, 2001, now U.S. Pat. No. 6,671,294 Ser. No. 09/608,543 filed Jun. 30, 2000 now U.S. Pat. No. 6,721,340 and Ser. No. 09/854,097 filed May 11, 2001, now U.S. Pat. No. 6,757,316 09/597,812 filed Jun. 19, 2000, now U.S. Pat. No. 6,529,531 which was a continuation-in-part of Ser. No. 08/898,630 filed Jul. 22, 1997 now U.S. Pat. No. 6,078,599 and Ser. No. 09/501,160 filed Feb. 9, 2000 now U.S. Pat. No. 6,621,846. This invention relates to lasers and, in particular, to techniques for control of the bandwidth of the output beam.

BACKGROUND OF THE INVENTION

Wavelength Control

Lasers are used for many applications. For example, lasers, such as KrF and ArF excimer lasers, are used in stepper and scanner equipment for selectively exposing photoresist in a semiconductor wafer fabrication process. In such fabrication processes, the optics in the steppers and scanners are designed for a particular wavelength of the laser. The laser wavelength may drift over time and, thus, a feedback network is typically employed to detect the wavelength of the laser and correct the wavelength as necessary.

In one type of feedback network used to detect and adjust the wavelength of a laser, an etalon receives a portion of the emitted light from the laser. The etalon creates an interference pattern having concentric bands of dark and light levels due to destructive and constructive interference by the laser light. The concentric bands surround a center bright portion. The diameter of a light band produced by an etalon is used to determine the wavelength of the laser to a fine degree, such as to within 0.01-0.03 pm. The width of a light band is used to determine the spectral width of the laser output. The interference pattern is usually referred to as a fringe pattern. A grating spectrometer is also used in prior art devices to measure wavelength to a relatively course degree. The fringe pattern and the grating signal may be optically detected by a sensitive photodetector array. A detailed description of a prior art wavemeter is disclosed in U.S. Pat. No. 5,978,394 which is incorporated herein by reference.

Various methods are well known for wavelength tuning of lasers. Typically the tuning takes place in a quickly replaceable modular device referred to as a line narrowing module or line narrowing package (LNP). A typical technique used for line narrowing and tuning of excimer lasers is to provide a window at the back of the discharge chamber through which a portion of the laser beam passes into the LNP. There, the portion of the beam is expanded in a beam expander and directed to a grating which reflects a narrow selected portion of the laser's natural broader spectrum back into the discharge chamber where it is amplified. The laser is typically tuned by changing the angle at which the beam illuminates the grating. This may be done by adjusting the position of the grating or providing a mirror adjustment with a pivoting mirror in the beam path. The adjustment of the grating position or the mirror position may be made by a mechanism which we will refer to as a laser wavelength adjustment mechanism.

In the prior art, the typical feedback network is configured to maintain the nominal wavelength within a desired range of wavelengths. Typical specifications may establish this range at values such as 0.05 pm of a target wavelength such as, for example, 248,327.1 pm, for a KrF laser as applied to the average of the wavelengths of a series of pulses referred to as "pulse window". A typical pulse window would be 30 pulses. Another typical specification is the standard deviation of the measured wavelength values for a series of pulses (such as 30 pulses). This value is referred to as wavelength sigma, $\Phi$, and is calculated using a standard formula for standard deviations. Also, sometime specifications are in terms of $3\Phi$ which is merely three times the measured standard deviation. A typical $3\Phi$ specification may be 0.15 pm.

The limitations of acceptable optical lens materials to fused silica and calcium fluoride for use with deep ultraviolet light at 248 nm and 193 nm wavelengths have meant that projection lenses for KrF and ArF lithography, to a large degree, cannot be corrected for wavelength variations. Chromatic aberrations emerge since the index of refraction of any optical material changes with wavelength, and hence, the imaging behavior of a lens also varies with wavelength.

The detrimental effects of chromatic aberrations for an uncorrected lens can be mitigated by using a light source with a very narrow range of wavelengths. Spectral line-narrowed excimer lasers have served this purpose for deep-TV lithography. In the past, laser specifications have required the FWHM bandwidth to be smaller than a specified value such as 0.5 pm but with no lower limit on bandwidth. Specifications are also directed at the 95 percent integral bandwidth. A typical 95% I specification would be less than 1.2 ppm. However, recently integrated circuit manufacturers have noticed that the quality of their integrated circuits can be adversely affected by bandwidths, such as about 0.35 pm FWHM, which are substantially narrower than the bandwidths for which their optical systems were designed.

A lithography technique, called FLEX (short for, "focus latitude enhancement exposure") has been shown (through simulation and experiment) to improve the depth of focus by utilizing multiple exposure passes of the same field with different focus settings. This technique is also commonly referred to as focus drilling, since the physical thickness of the photoresist film is exposed in multiple passes at incremental focus settings. The image in photoresist is formed by the composite of the multiple exposure passes.

Several difficulties result from this FLEX process with both step and scan as well as step and repeat exposure implementations. Multiple pass exposure results in additional overlay (image placement) errors and image blurring. This has further implications on process latitude, focus repeatability as well as wafer throughput since multiple exposures require multiple imaging passes.

What is needed is a better technique for providing improved quality integrated circuit lithographic exposures.

SUMMARY OF THE INVENTION

The present invention provides an integrated circuit lithography technique called spectral engineering by Applicants, for bandwidth control of an electric discharge laser. In a preferred process, a computer model is used to model lithographic parameters to determine a desired laser spectrum needed to produce a desired lithographic result. A fast responding tuning mechanism is then used to adjust center wavelength of laser pulses in a burst of pulses to achieve an integrated spectrum for the burst of pulses approximating the desired laser spectrum. The laser beam bandwidth is controlled to produce an effective beam spectrum having at least two spectral peaks in order to produce improved pattern resolution in photo resist film. Line narrowing equipment is provided having at least one piezoelectric drive and a fast bandwidth detection control system having a time response of less than about 2.0 millisecond. In a preferred embodiment, a wavelength tuning mirror is dithered at dither rates of more than 500 dithers per second in phase with the repetition rate of the laser. In one case, the piezoelectric drive was driven with a square wave signal and in a second case it was driven with a sine wave signal. In another embodiment, the maximum displacement was matched on a one-to-one basis with the laser pulses in order to produce a desired average spectrum with two peaks for a series of laser pulses. Other preferred embodiments utilize three separate wavelength tuning positions producing a spectrum with three separate peaks. In another preferred embodiment, effective bandwidths in the range of 0.4 pm to 2.0 pm are produced in a series of pulses (such as a 30-pulse window of pulses).

BRIEF DESCRIPTION OF THE DRAWINGS

FIGS. 2A-I demonstrate features of a preferred embodiment of the present invention.

FIGS. 8A, 8B1 and 8B2 show features of a wavelength control system with PZT drive.

DETAILED DESCRIPTION OF PREFERRED EMBODIMENTS

Simulation

Figure 1A:
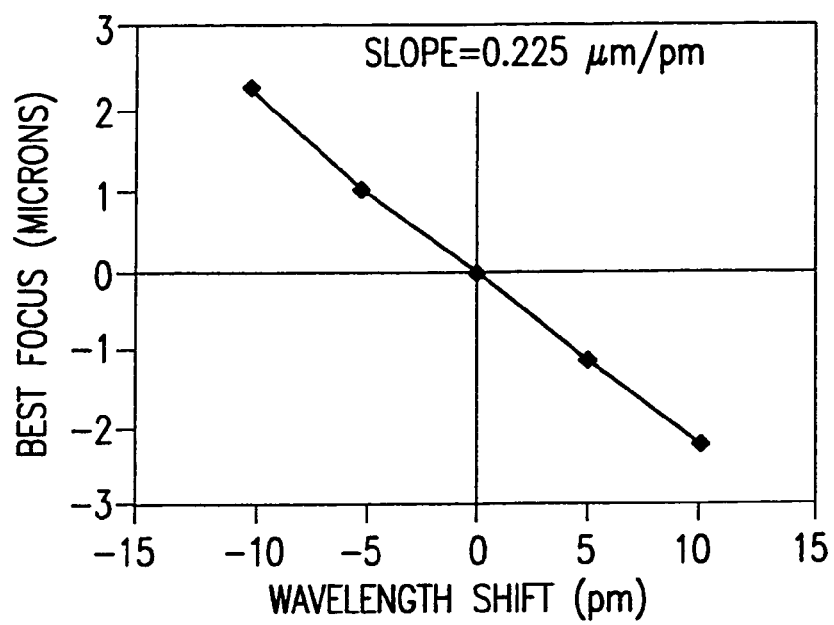
FIG. 1A is a graph showing the variation of best focus with wavelength.

Simulation of the effects of wavelength and bandwidth changes have been performed by Applicants. The main effect of changing the exposure wavelength for a non-chromatic corrected lens is a change in the position of the focal plane. Over a fairly wide range of wavelengths, this change in focus is approximately linear with the change in the nominal wavelength (i.e., the central wavelength of the illumination spectrum). The wavelength response of a lens can be determined experimentally by manually changing the central wavelength of the laser and using the imaging sensor of the stepper to monitor the shift in focus that results. FIG. 1A shows an example of such a measurement.

Figure 1B:
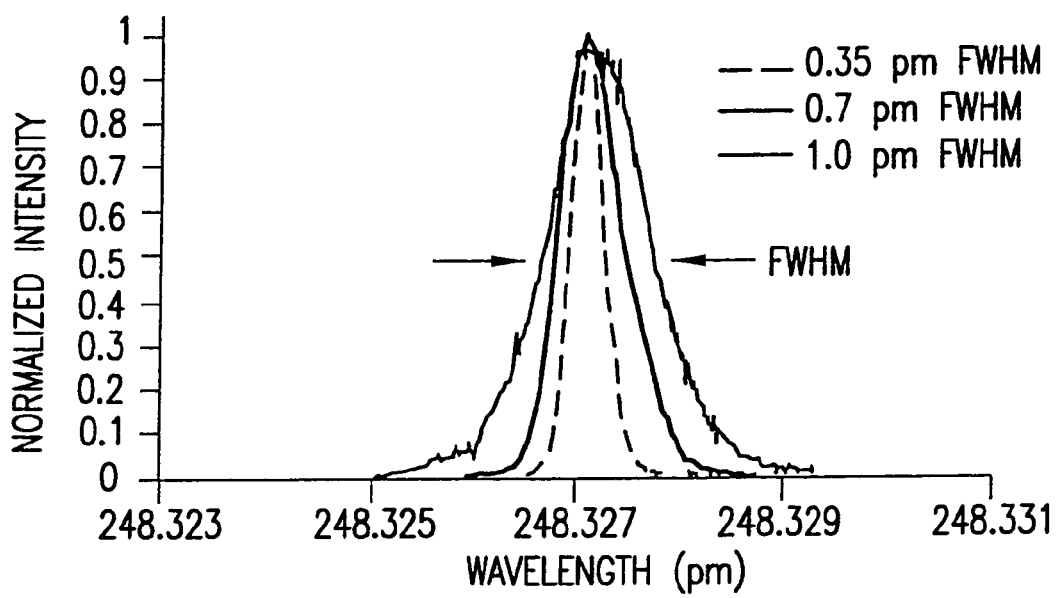
FIG. 1B shows typical narrow band gas discharge laser spectra.

Given the change in focus with change in wavelength, the use of a broadband illumination spectrum means that each wavelength in the spectrum will produce an aerial image with a different best focus. The total aerial image will be a sum of the aerial images at each focal position, weighted by the relative intensity of each wavelength in the illumination spectrum. This technique is based on multiple focal plane exposures. Latest versions of a computer program PROLITH/2 (available from KLA Tencor with offices in Austin, Tex.,) incorporate these types of effects. Actual laser spectra measured on a variety of commercially available lasers were used in this work to represent laser spectra. FIG. 1B illustrates three examples of KrF laser spectra.

Figure 3:
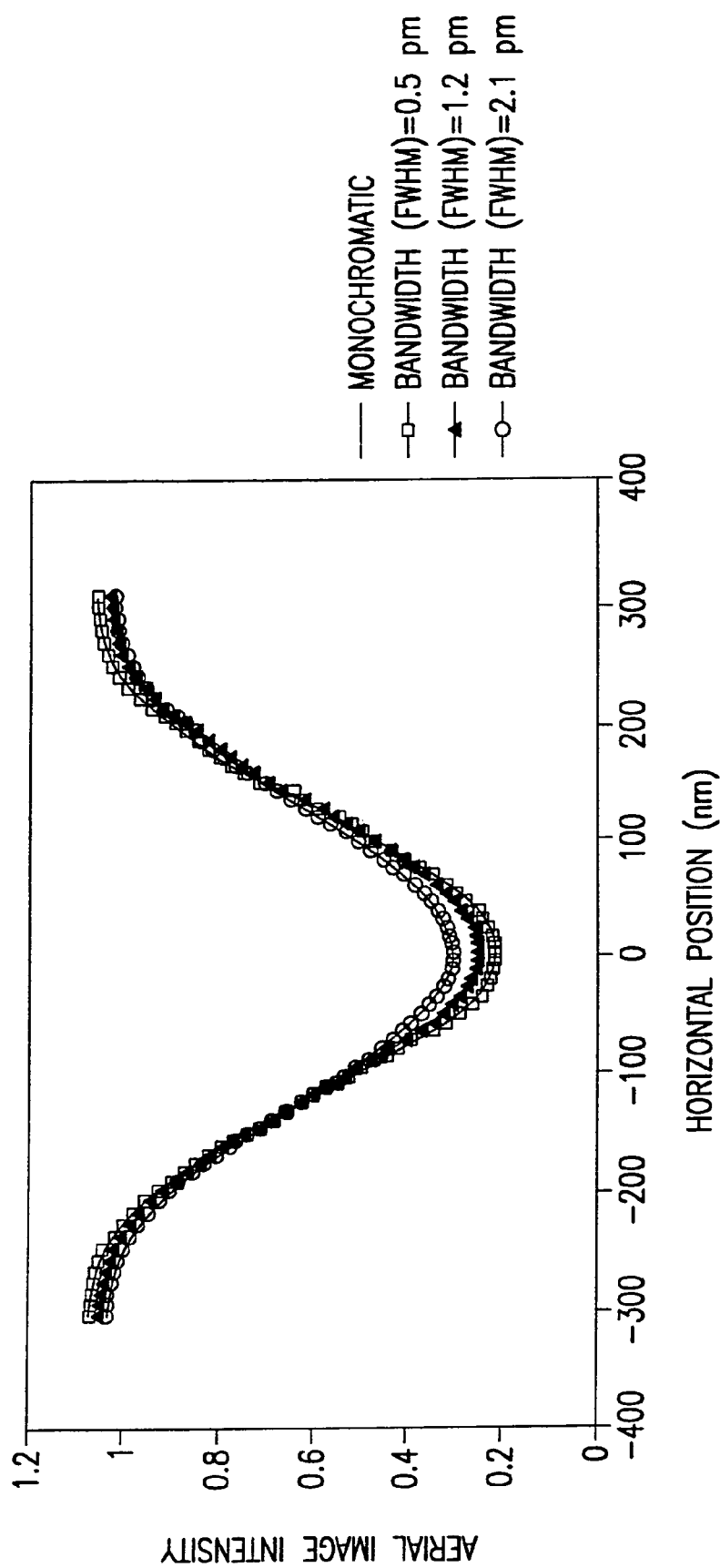
FIG. 3 shows the variation of aerial image intensity with bandwidth.

In order to understand the impact of laser bandwidth on the lithographic process in the presence of chromatic aberrations, Applicants started from investigation of the aerial image of a 180 nm isolated line. FIG. 3 shows how changing bandwidth affects the aerial image under a specific set of conditions. (The image dimension is usually assumed to correspond to the 0.3 image intensity values.) For these simulations the following input parameters were used: NA=0.6, $\phi$=0.75, $\delta_0$=248.3271 nm. Laser spectra with 0.5 pm, 1.2 pm, 2.1 pm bandwidths at FWHM and a monochromatic light source were used in this simulation study, and a chromatic aberration focus response of 0.225$\phi$m/pm was assumed. As can be seen in FIG. 3, changes in the bandwidth causes noticeable changes in the image intensity distribution.

Figure 4A:
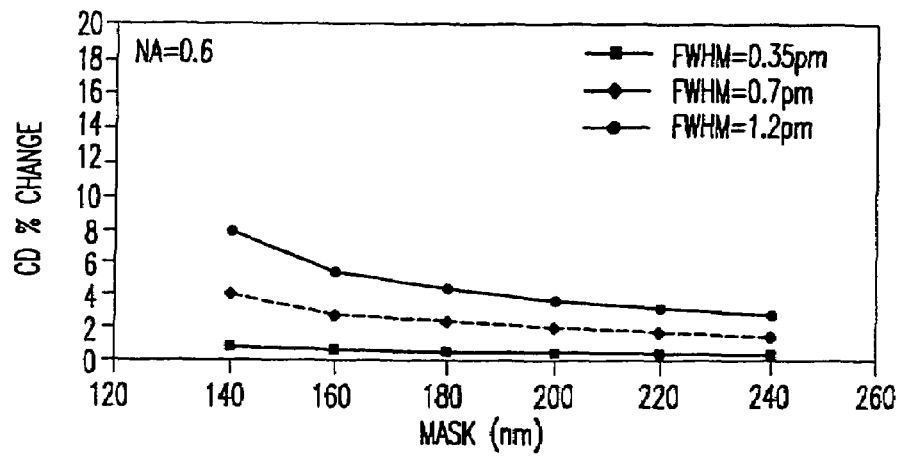
FIGS. 4A, 4B and 4C shows variation of the change in critical dimension with bandwidth.
Figure 4B:
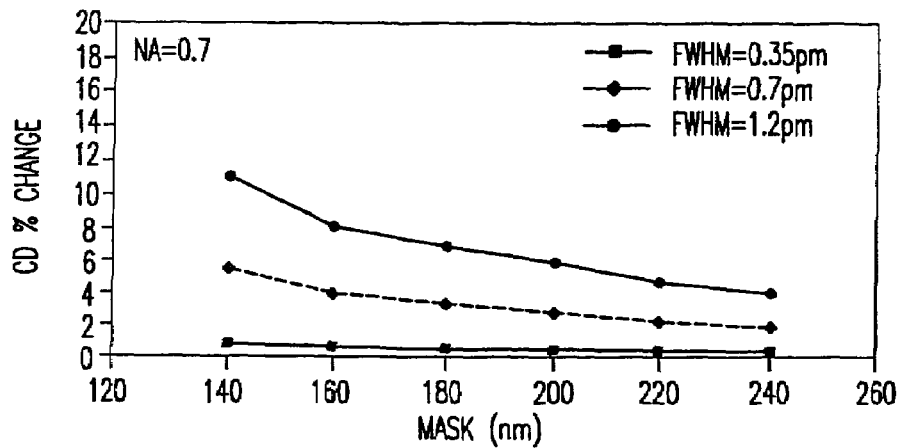
Figure 4C:
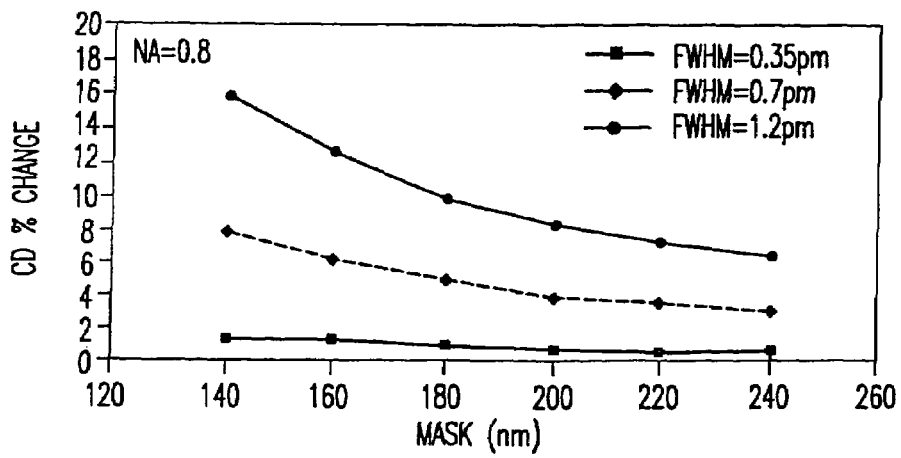

The impact of laser bandwidths on critical dimensions (CD) variations of isolated lines with different sizes was evaluated using an aerial image threshold model. In this study the following lithography input parameter settings were used: $\phi$=0.75, $\delta_0$=248.3271 nm, aerial image threshold at 30%, NA=0.6, 0.7, and 0.8. The simulations were performed for isolated lines ranging from 240 nm to 140 nm. The chromatic aberration response was assumed at 0.225$\phi$m/pm. As shown in FIGS. 4A, 4B and 4C, changes in the bandwidth (either increases or decreases) can result in substantial changes in the critical dimensions of the integrated circuit lines especially at higher numerical aperture values. As shown in FIGS. 4A-4C the smallest bandwidth (i.e., 0.35 pm) produces the smallest change in the critical dimension as a function of mask dimension. A reader might conclude from this data that lithography systems should be designed for the smallest possible bandwidth. The problem with that approach is that maintaining the bandwidth consistently at 0.35 pm over the life of the light source would be very difficult and expensive with today's technology. Therefore, the normal practice is to design lithography systems for best performance at a bandwidth which is somewhat larger than the smallest possible bandwidth, such as about 0.5 pm. But if a lithography system is designed for best performance at 0.5 pm, an "improvement" in the laser bandwidth down to 0.35 pm will often lead to a worsening of critical dimensions and decreased quality of the integrated circuit.

Dither Tuning Mirror To Simulate Desired Wavelength

The wavelength and bandwidth monitoring equipment and the wavelength tuning equipment described in detail below permit bandwidth control of the laser beam. In a first embodiment the tuning mirror is dithered at a desired frequency and amplitude to basically widen a too narrow bandwidth to an effective bandwidth having a desired value.

Figure 5:
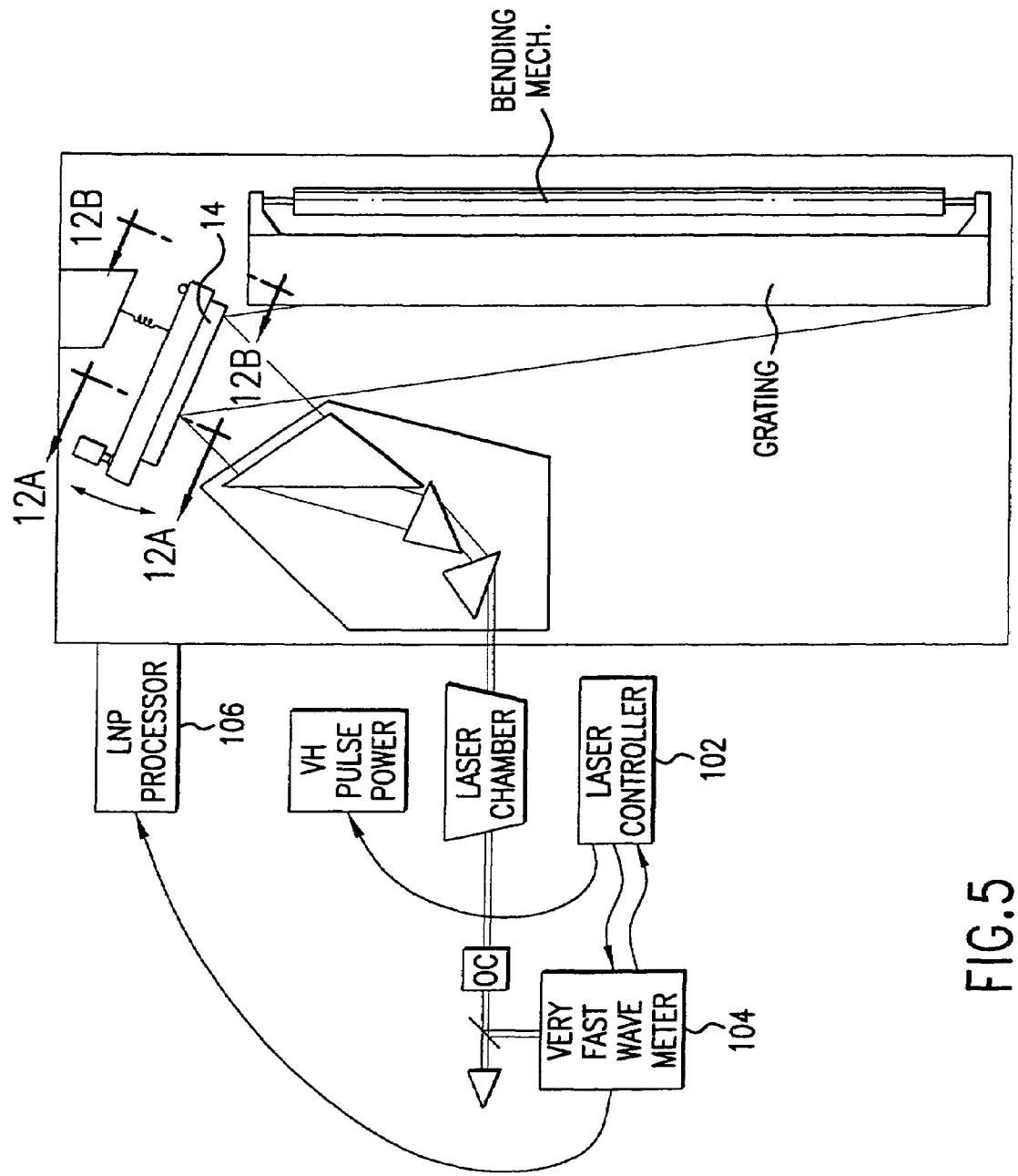
FIG. 5 is a drawing of a narrow band laser system.
Figure 6:
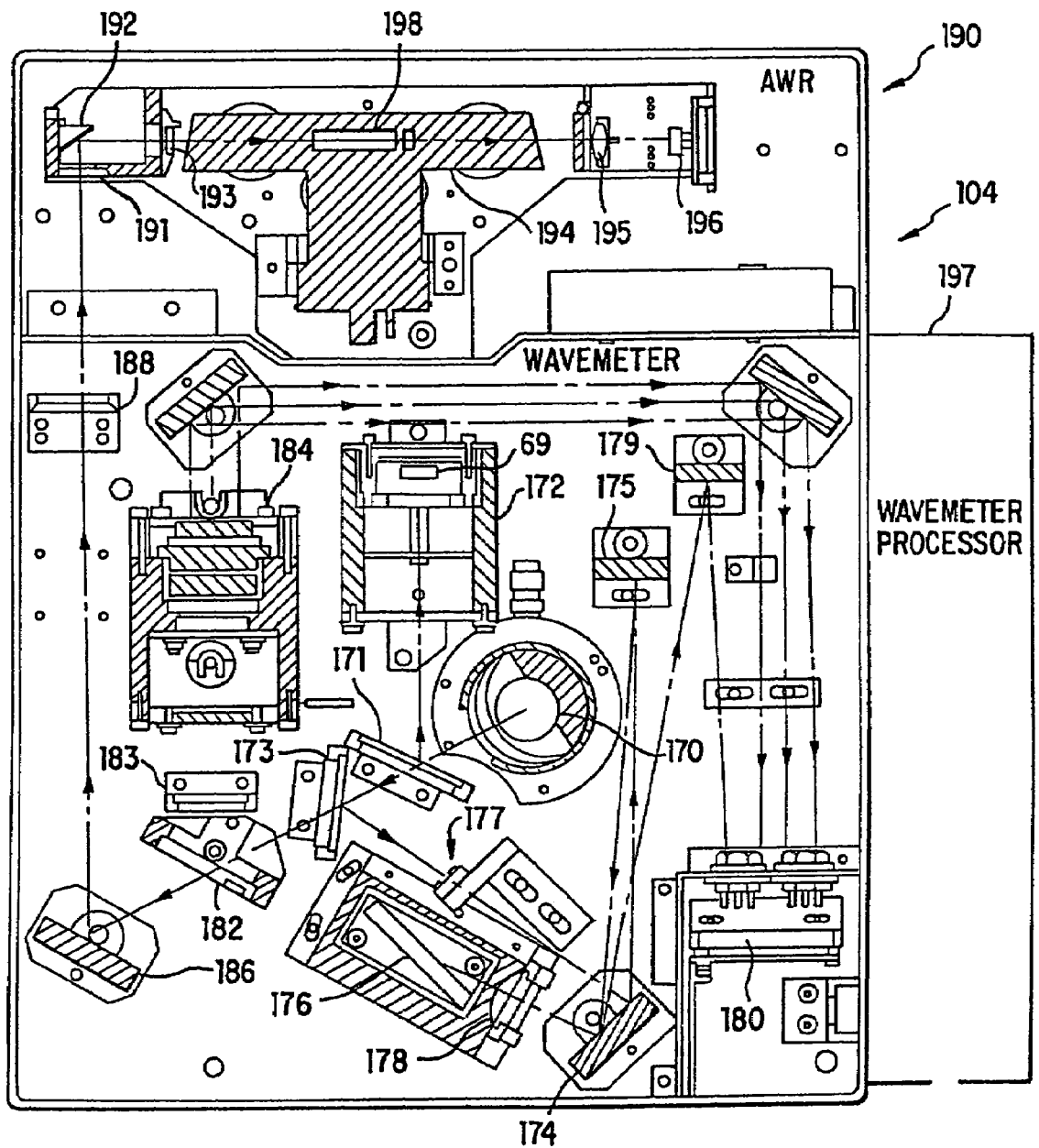
FIG. 6 is a drawing of a wavemeter.

The technique involves monitoring the bandwidth with wavemeter 104 shown in FIG. 5 and FIG. 6. If the bandwidth is less than the desired bandwidth the wavelength control equipment is utilized to dither mirror 14 shown in FIG. 5 at frequent intervals to cause very slight shifts in the spectrum on a pulse to pulse basis so that the average integrated spectrum over a window of pulses simulates approximately a constant spectrum with bandwidth approximating the desired bandwidth.

Figure 5A:
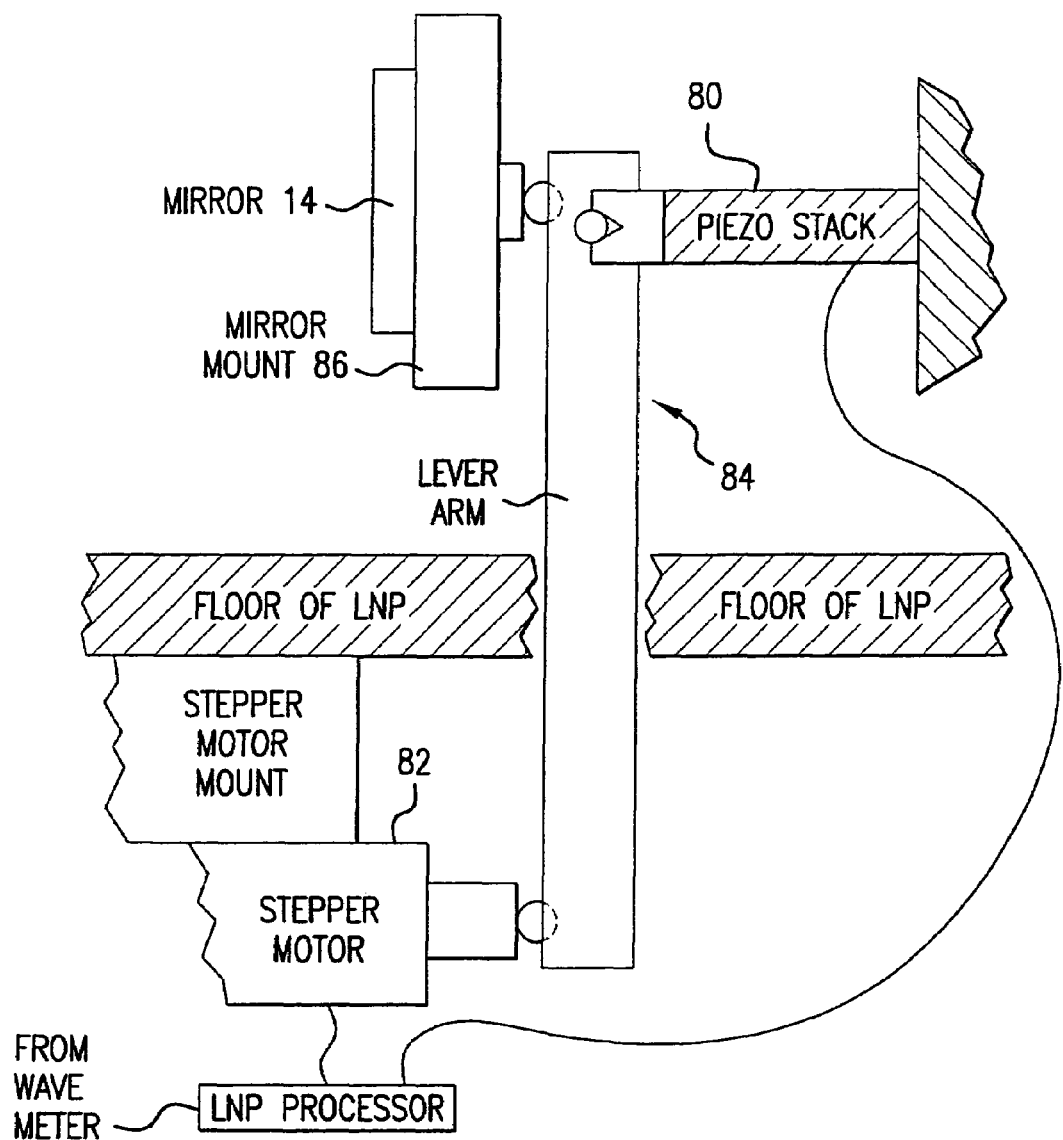
FIGS. 5A and B show features of a tuning mechanism.
Figure 5B:
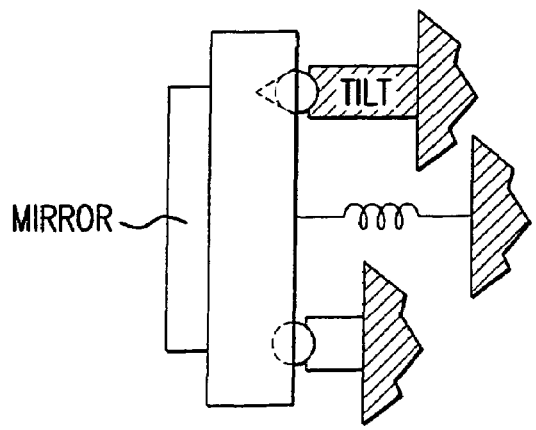

For example, if the optical equipment for a scanner is designed for a bandwidth of 0.4 pm and because of a decrease in the fluorine concentration the bandwidth of individual pulses is 0.3 pm, mirror 14 may be dithered about its nominal position to produce plus and minus shifts in the nominal wavelength of about 0.05 pm in order to maintain the same nominal wavelength with the effective increase by 0.1 pm. For a typical commercial excimer laser of the type discussed above, a change in the pivot position of mirror 14 of about 2 nm is required to produce a 0.05 pm shift in the wavelength. This change in mirror position is easily provided by the piezoelectric drivers referred to above and shown in FIG. 5A as item 80. Typically in the integrated circuit fabrication each spot on the wafer is illuminated with a number of pulses usually in the range of about 30 to 150 pulses so that the dither rate should be sufficient so that each die spot receives about equal portions of pulses from both sides of the dither.

Thus, if the number of pulses illuminating a spot is 30 the dither rate should be at least about ¼ the pulse rate. So if the pulse rate is 2000 Hz the dither rate preferably would be at least 500 Hz. This is no problem for the equipment and software referred to above.

Spectral Engineering

Figure 2A:
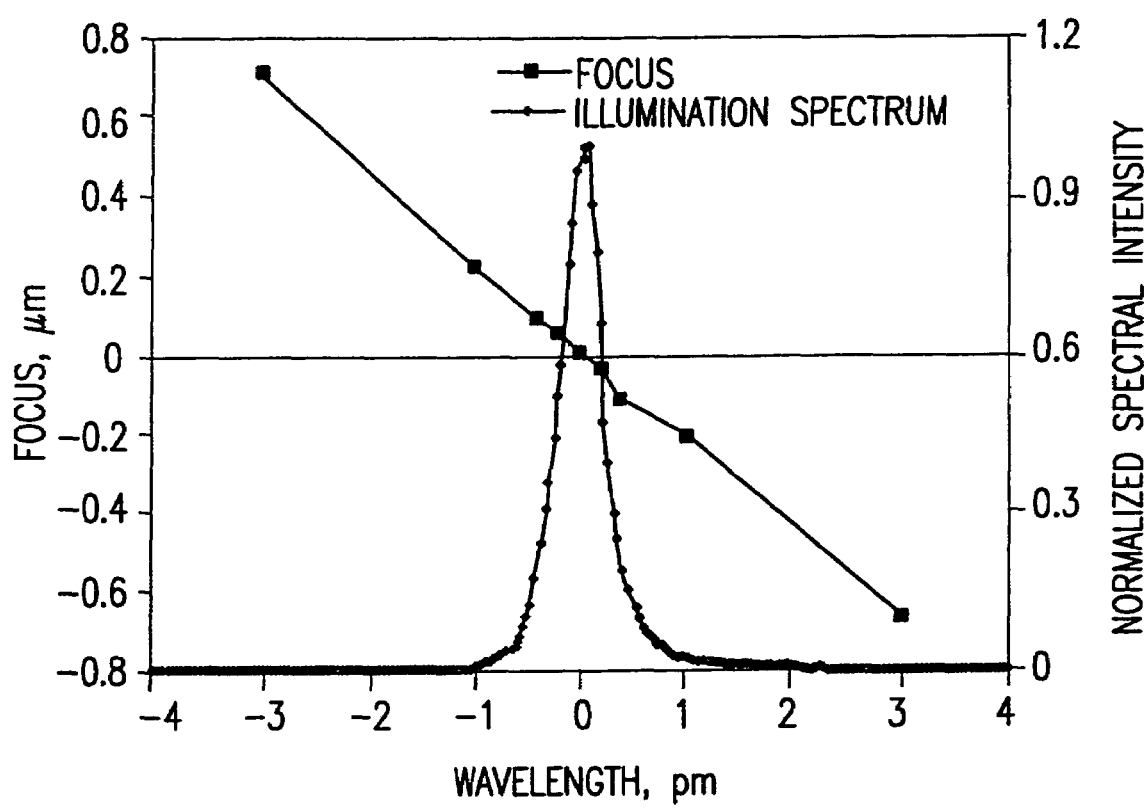

FIG. 2A shows the variation of focus with centerline wavelength for a modern 0.6 NA stepper type lithography using a line narrowed KrF light source having a FWHM bandwidth of about 0.35 pm. FIG. 2A also include a plot of the laser spectrum plotted as normalized intensity versus deviation from the centerline wavelength. The focus versus centerline wavelength slope for this system is $-0.23$ $\phi$m/pm.

Applicants have shown that substantial improvements in lithographic imaging can be provided using a spectral engineering techniques developed by Applicants. Applicants refer to this technique as RELAX which is an acronym for Resolution Enhancement by Laser-Spectrum Adjusted Exposure. In these techniques, the wafer is illuminated with two or more specific narrowband centerline wavelength during a single illumination period. This produces results which are improved over the dither technique referred to above. The results are similar to the FLEX technique discussed in the background section of this specification but constitutes a major improvement over FLEX since Applicants' technique involves only one positioning of the lithography equipment. Therefore, errors associated with adjustments of this equipment are avoided.

Dual Mode Illumination

Figure 2B:
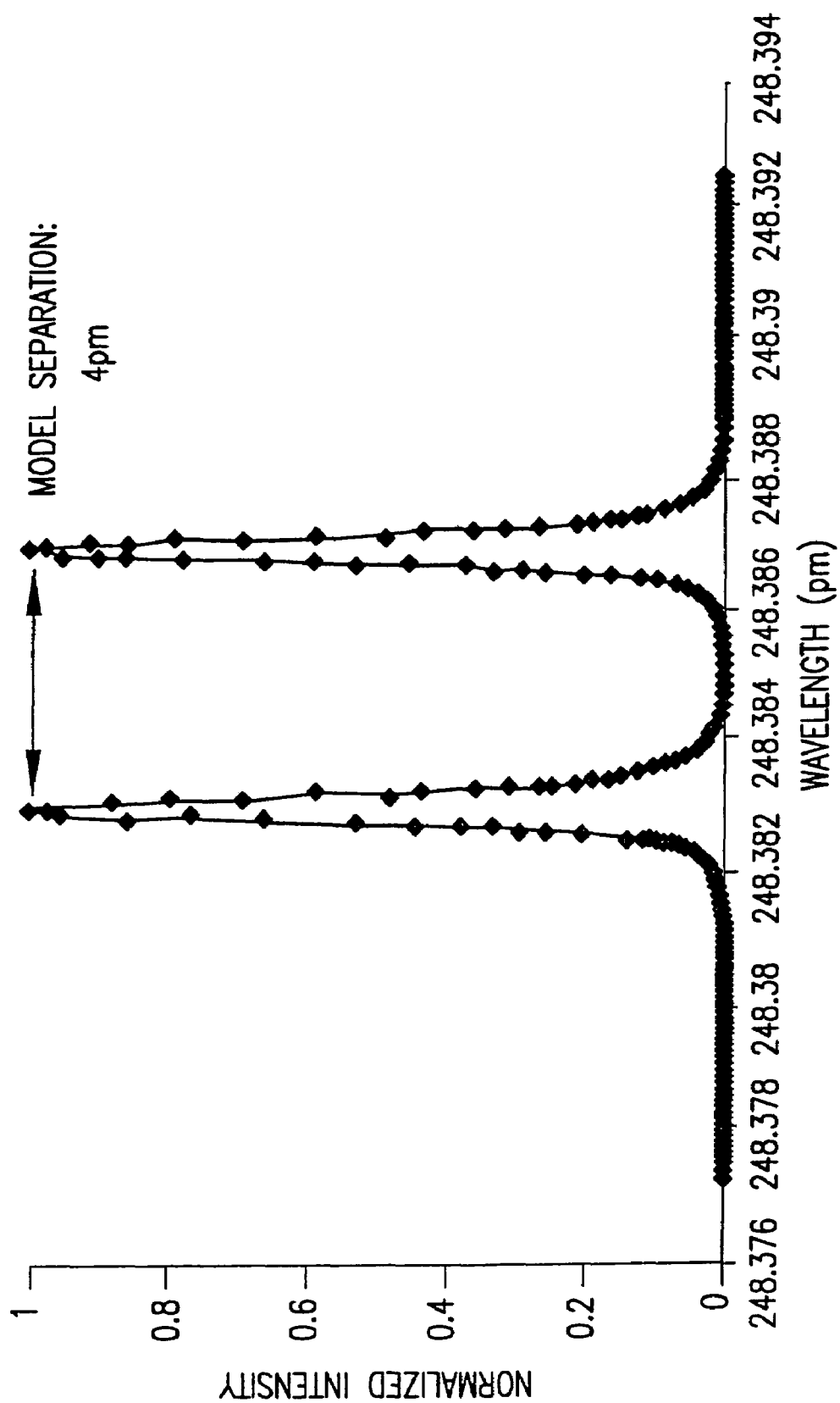

The results of simulations performed by Applicants show proof of concept for use of a dual-mode illumination spectrum to improve resolution in photo resist film. In this dual mode simulation work, Applicants simulated the process parameters for 200 nm isolated, semi-dense (1:2) and dense (1:1) contact hole patterns. A binary (chrome on glass) reticle pattern and conventional illumination (e.g., a stepper system with a numerical aperture, NA of 0.7 and a 0.75 sigma) at KrF exposure central wavelengths, ($8_m$, =248.385 nm) were modeled in the simulation. The photo resist was modeled as UV6, 5200A casting thickness on AR2 bottom anti-reflective coating in order to quantify the obtained resolution enhancement of the imaged pattern. The double-mode spectrum used as the simulation input is shown in FIG. 2B. In this case, the spectrum is generated by summation of a single mode (nominal) spectrum (bandwidth: FWHM=0.45 pm, E95%=1.86 pm) and its copy with a 4 pm wavelength offset. If S(8) represents the spectral density function of the nominal (0.45 pm/1.86 pm FWHM/E95%) spectrum, the spectral density of the double-peak RELAX spectrum [$S_{RELAX}(8)$] can be expressed as $S_{RELAX}(8)=S(8)+S(8+4\text{ pm})$. Technologies for actual generation of such spectral properties are discussed in the following section. The longitudinal focus plane to centerline wavelength slope used for this model is $-0.225$:m/pm which is shown in FIG. 2A.

The results of this simulation of the double-peak RELAX technique are compared in FIG. 2C with similar simulations of a monochromatic beam and a conventional single peak spectrum with FWHM bandwidth of 0.45 pm and a 95% integral bandwidth of 1.86 pm. The critical dimension response to focus and dose are presented for 1:1 dense contact holes for three illumination spectral distributions; (1) monochromatic illumination, (2) conventional laser spectrum and (3) the 4 pm double mode RELAX illumination with a spectrum as shown in FIG. 2B (i.e., two 0.45 pm FWHM spectral bands with centerlines separated by 4.0 pm).

FIG. 2D presents plots of the resist feature widths of holes which have a target diameter of 200 nm as a function of depth of the holes. The figures are plotted for several doses ranging from 17 $J/cm^2$ to 26 $J/cm^2$ in the monochromatic example and from 25 $J/cm^2$ to 32 $J/cm^2$ in the RELAX example. This ordinant is feature width and the absissa is labeled focus but actually represents the depth of the feature in microns with zero taken as the focal plane of the centerline wavelength. An "ideal" graph would be a straight line at 200 nm over a depth of at least 1.0 micron, with insignificant variation in width with exposure dose. The FIG. 1D plots reveal that the RELAX simulation produces a set of plots much closer to the "ideal" graph than either the conventional or monochromatic example.

FIG. 2D is another set of graphs made from the same data as was used for the FIG. 2C plots. In this case, Applicants selected the plot for each of the examples and plotted for that exposure the exposure latitude (i.e., the percent of the dose can vary without causing the critical dimension to vary more than 10% from a target value) as a function of the depth of a hole having a target width of 200 nm. Again, these three graphs show a great improvement in performance resulting from the use of the RELAX techniques.

The dramatic improvement in the depth for which the critical dimension can be controlled to within 10% with the RELAX approach is apparent. The improvement in depth of focus is larger than fourfold at the 5% exposure latitude level compared to the monochromatic and conventional results for dense contacts. Some exposure latitude loss is observed by using the double-mode spectrum. This loss in exposure latitude is most pronounced near best focus (i.e., 0.0 depth of focus). As compared with the conventional spectrum example, the slight increase in the target dose (from about 25 mJ/cm$^2$ to about 29 mJ/cm$^2$) for the RELAX case as compared to the conventional example should be noted.

The simulation results for the other pattern configurations referred to above were tested with the result that the two-peak RELAX technique produced better pattern resolution as compared to both monochromatic and the conventional spectrum for every example tested. Therefore, we conclude that the RELAX application (using a dual-mode spectrum with 4 pm mode separation) for focus drilling provides dramatic improvement in the overall process window area. A tradeoff is realized between depth of focus improvement and loss of exposure latitude, however, the DOF increases at a higher rate than the reduction of exposure latitude. In contact hole imaging especially, as well as many other imaging applications of lines and spaces, the DOF is a limiting process performance factor. Isolated lines and line-space patterns are also expected to exhibit process window changes for modified illumination spectra.

Examples Using Two Centerline Wavelengths

Figure 2E:
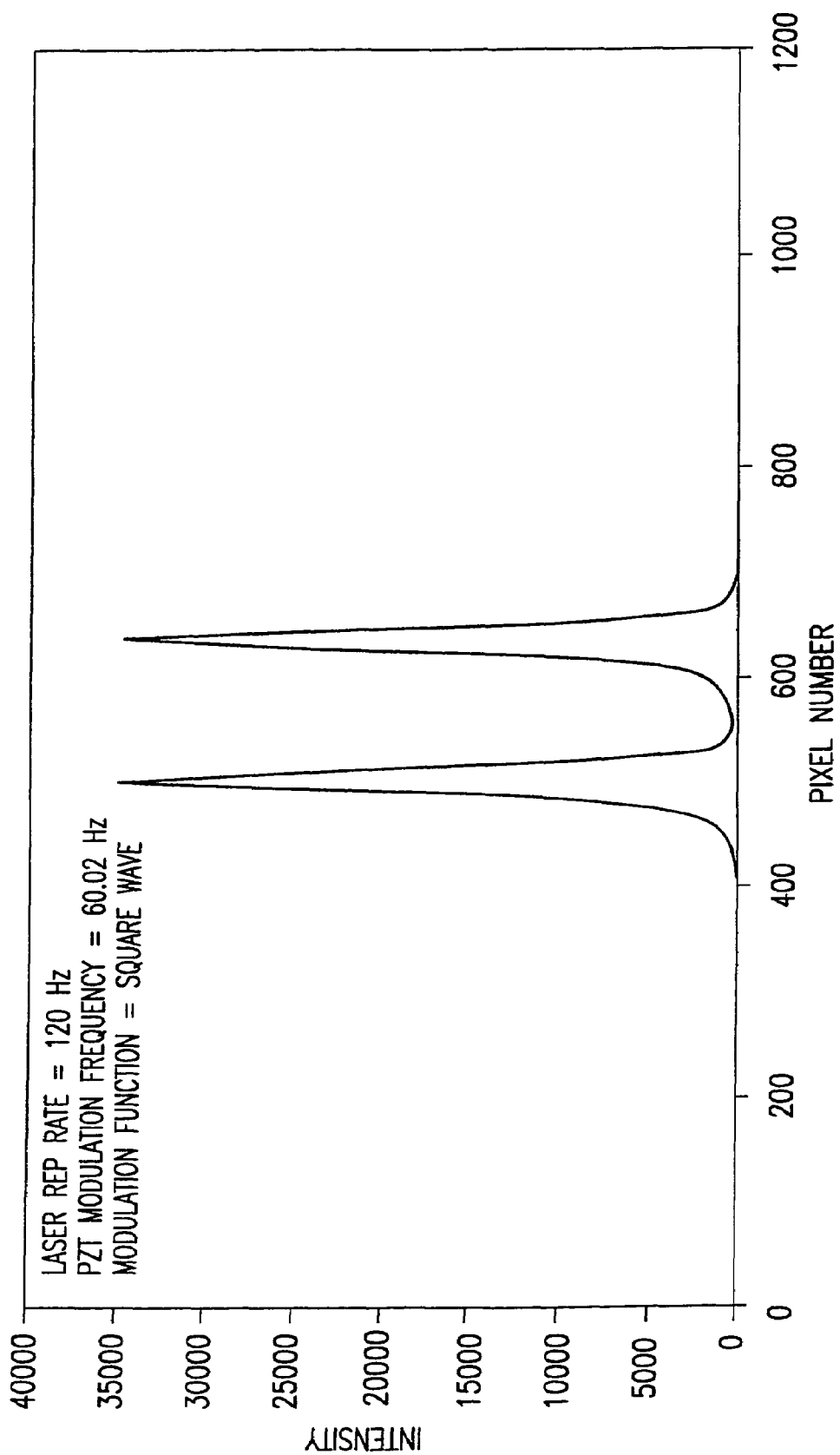

Applicants have demonstrated the feasibility of technique for wavelength control needed for this spectral engineering as shown in FIGS. 2E and 2F. PZT driver 80 shown in FIG. 5A was programmed to control the wavelength of a KrF laser operating at 120 Hz to adjust each pulse by plus or minus steps of 4.0 pm. The integrated intensity values recorded on wavemeter photodiode array 180 shown in FIG. 6 are plotted in FIG. 2E. This plot shows sharp peaks at pixel 450 and 618 which correspond to a centerline wavelength shift of 4.0 pm.

Similar results are shown in FIG. 2F where the PZT driver is driven in a sine wave to vary the wavelength by about 2 pm at a frequency of one half the laser pulse rate of 120 Hz.

Optimization of Laser Spectrum

The basic concept behind spectral engineering is to determine, using lithography simulation, the optimal spectral shape, which will provide the maximum improvement of a given parameter. In particular examples, lithography simulations are provided for two dual-mode illumination spectra and three three-mode illumination spectra shown in FIGS. 2G1, 2G2 and 2G3. In these examples, the parameter, which is maximized is the depth of focus, for 150 nm dense lines. From FIG. 2H1, we see that the two dual-peak spectra (3 pm and 4 pm separation) are least sensitive to defocus and therefore have a maximum depth of focus. From the depth of focus changes, it appears that spectral modification (going from monochromatic, to three to two mode illumination spectrum) provides significant (up to 2×) improvement of DOF. From this alone, either the 3 pm or 4 pm dual-mode illumination appears optimal for imaging of these features.

If we consider the tradeoff between exposure latitude (EL) and depth of focus as a function of the different illumination spectra (shown in FIG. 2H2), we may choose to use the 1.5 pm-offset 50% weighted three-mode illumination in order to prevent the reduction in exposure latitude below 12% at best focus. The three-mode spectrum still provides an appreciable increase in depth of focus. In addition the three-mode spectrum (with 1.5 pm peak separation) provides the least amount of contrast loss from the monochromatic case as shown in FIG. 2H3.

From this 150 nm dense line example, it is clear that the implementation of RELAX requires a very careful tradeoff design in order to maximize the benefits of a subset of imaging parameters at lowest cost to other parameters. The RELAX application will therefore be most successful in cases where a single parameter limits the overall process margin (process latitude). In that case, the limiting process parameter can be improved (relaxed) in order to improve to overall process margin for manufacturability. Optical proximity correction (OPC-resolution enhancement technique using reticle feature corrections) can be used in conjunction with RELAX for comprehensive lithography process engineering and maximum benefits.

Figure 2I:
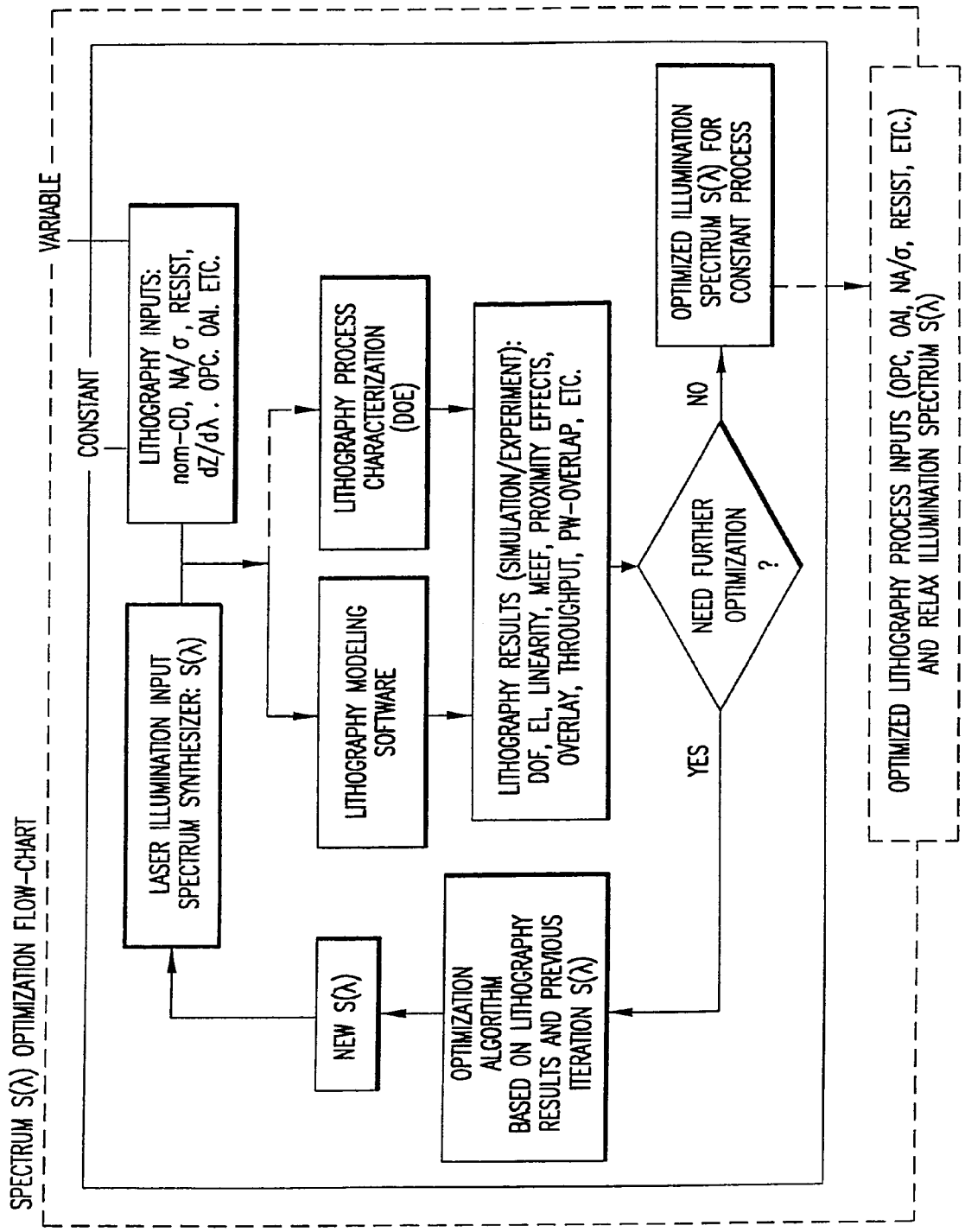

The tuning of the RELAX spectral illumination, from a continuum of theoretical choices can be done using lithography simulation and an iterative optimization algorithm. The simulation predictions also need to be verified and fine-tuned using experimental methods (such as design of experiments-DOE). Both approaches have been discussed in more detail previously (section IV-B May 25, 2001 disclosure). FIG. 2I shows the confluence of simulation and experiments (DOE) for either S(λ) spectrum optimization only or for a comprehensive lithography process optimization (variable lithography inputs) using RELAX.

Ultra Fast Wavemeter with Fast Control Algorithm

Controlling Pulse Energy, Wavelength and Bandwidth

In prior art devices the feedback control of pulse energy has been on a pulse-to-pulse basis, i.e., the pulse energy of each pulse is measured quickly enough so that the resulting data can be used in the control algorithm to control the energy of the immediately following pulse. For a 1,000 Hz system this means the measurement and the control for the next pulse must take less than 1/1000 second. For a 4000 Hz system speeds need to be four times as fast. A technique for controlling center wavelength and measuring wavelength and bandwidth is described in U.S. Pat. No. 5,025,455 System, and Method of Regulating the Wavelength of a Light Beam and in U.S. Pat. No. 5,978,394, Wavelength and System for an Excimer Laser. These patents are incorporated herein by reference.

Wavelength and bandwidths have been measured on a pulse to pulse basis for every pulse, but typically the feedback control of wavelength has taken about 7 milliseconds because prior art techniques for controlling center wavelength have taken several milli-seconds. Faster control is needed.

Preferred Embodiment for Fast Measurement and Control of Beam Parameters

A preferred embodiment of the present invention is an ArF excimer laser system capable of operation in the range of 4,000 Hz to 6,000 Hz with very fast measurement of laser beam parameters and very fast control of pulse energy and center wavelength. The beam parameter measurement and control for this laser is described below.

The wavemeter used in the present embodiment is very similar to the one described in U.S. Pat. No. 5,978,394 and some of the description below is extracted from that patent.

Measuring Beam Parameters

FIG. 6 shows the layouts of a preferred wavemeter unit 104, an absolute wavelength reference calibration unit 190, and a wavemeter processor 197. The optical equipment in these units measure pulse energy, wavelength and bandwidth. These measurements are used with feedback circuits to maintain pulse energy and wavelength within desired limits. The equipment calibrates itself by reference to an atomic reference source on the command from the laser system control processor. As shown in FIG. 6, the laser output beam intersects partially reflecting mirror 170, which passes about 95.5% of the beam energy as output beam 33 and reflects about 4.5% for pulse energy, wavelength and bandwidth measurement.

Pulse Energy

About 4% of the reflected beam is reflected by mirror 171 to energy detector 172 which comprises a very fast photo diode 69 which is able to measure the energy of individual pulses occurring at the rate of 4,000 pulses per second. The pulse energy for a typical ArF excimer laser is about 5 mJ, and the output of detector 69 is fed to a computer controller which uses a special algorithm to adjust the laser charging voltage to precisely control the pulse energy of future pulses based on stored pulse energy data in order to limit the variation of the energy of individual pulses and the integrated energy of bursts of pulses.

Linear Photo Diode Array

Figure 6A:
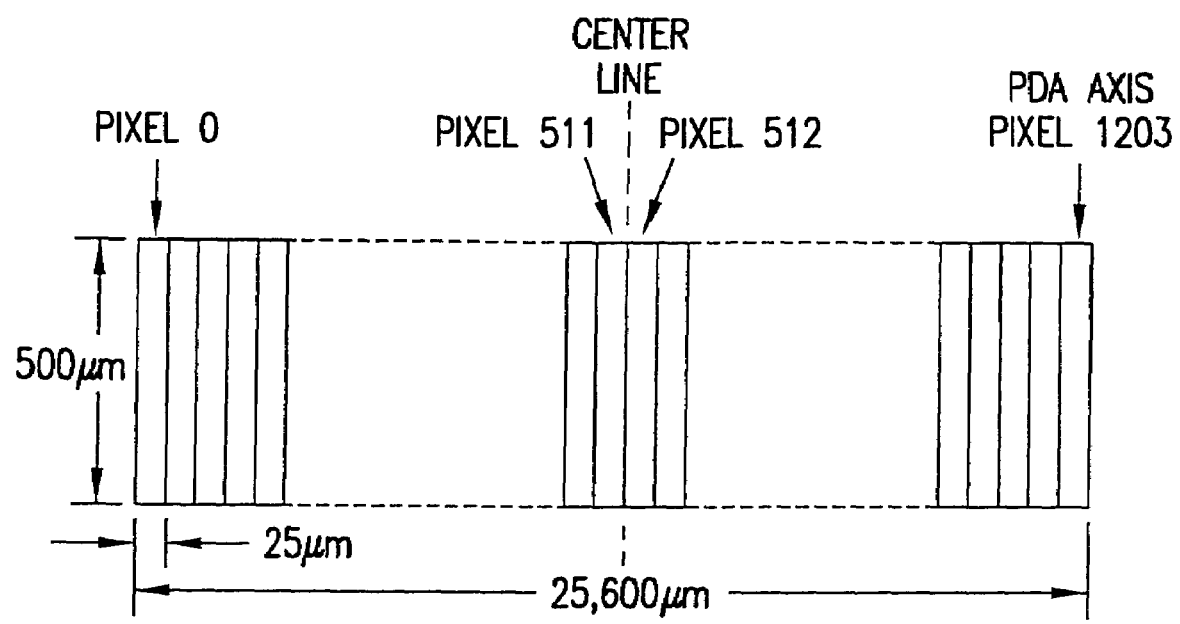
FIGS. 6A-D show how wavelength and bandwidth is calculated.

Photo diode array 180 is an integrated circuit chip comprising 1024 separate photo diode integrated circuits and an associated sample and hold readout circuit as shown in FIG. 6A. The photo diodes are on a 25 micrometer pitch for a total length of 25.6 mm (about one inch). Each photo diode is 500 micrometers long.

Photo diode arrays such as this are available from several sources. A preferred supplier is Hamamatsu. In our preferred embodiment, we use a Model S3903-1024Q which can be read at the rate of up to $4 \times 10^6$ pixels/sec on a FIFO basis in which complete 1024 pixel scans can be read at rates of 4,000 Hz or greater. The PDA is designed for $2 \times 10^6$ pixel/sec operation but Applicants have found that it can be over-clocked to run much faster, i.e., up to $4 \times 10^6$ pixel/sec. For pulse rates greater than 4,000 Hz, Applicants can use the same PDA but only a fraction (such as 60%) of the pixels are normally read on each scan.

Coarse Wavelength Measurement

Figure 6B:
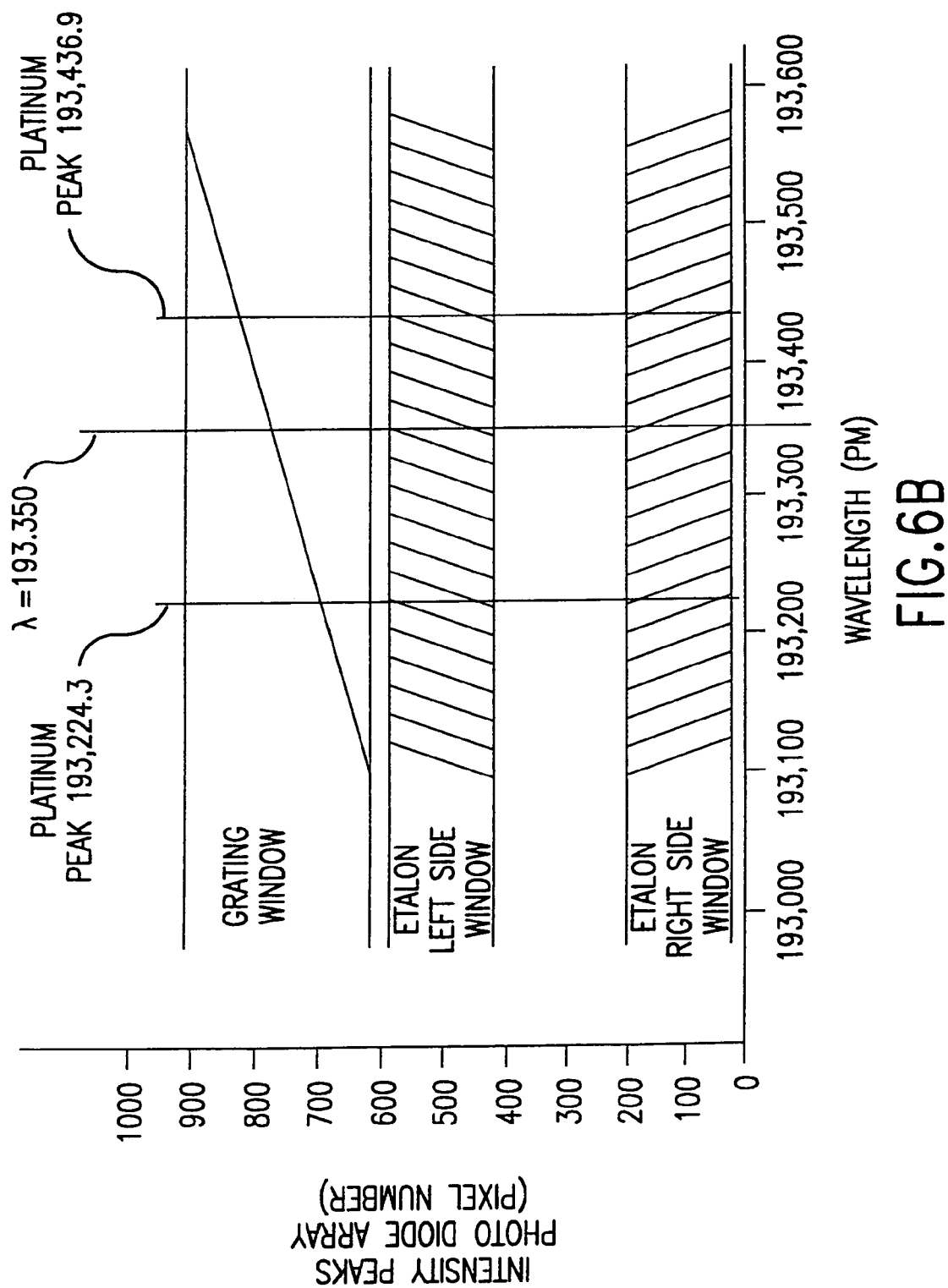

About 4% of the beam which passes through mirror 171 is reflected by mirror 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174, 175 and 174 again, and then is reflected from mirror 179 and focused onto the left side of 1024-pixel linear photo diode array 180 in the region of pixel 600 to pixel 950 as shown in the upper part of FIG. 6B (Pixels 0-599 are reserved for fine wavelength measurement and bandwidth.) The spatial position of the beam on the photo diode array is a coarse measure of the relative nominal wavelength of the output beam. For example, as shown in FIG. 6B, light in the wavelength range of about 193.350 pm would be focused on pixel 750 and its neighbors.

Calculation of Coarse Wavelength

Figure 6C:
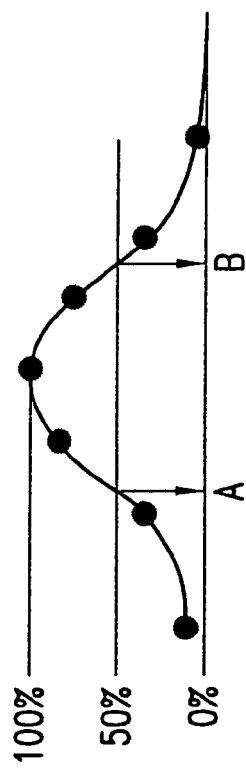

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received (as indicated in FIG. 6C) and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 \text{ pm/pixel})P + 191{,}625 \text{ pm}$$

where P=coarse image central positions.

Alternatively, additional precision could be added if desired by adding a second order term such as "+( ) $P^2$.

Fine Wavelength Measurement

About 95% of the beam which passes through mirror 173 as shown in FIG. 6 is reflected off mirror 182 through lens 183 onto a diffuser (preferably a diffraction diffuser as explained in a following section entitled "Improved Etalon") at the input to etalon assembly 184. The beam exiting etalon 184 is focused by a 458.4 mm focal length lens in the etalon assembly and produces interference fringes on the middle and right side of linear photo diode array 180 after being reflected off two mirrors as shown in FIG. 6.

The spectrometer must measure wavelength and bandwidth substantially in real time. Because the laser repetition rate may be 4,000 Hz to 6,000 Hz, it is necessary to use algorithms which are accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Figure 6D:
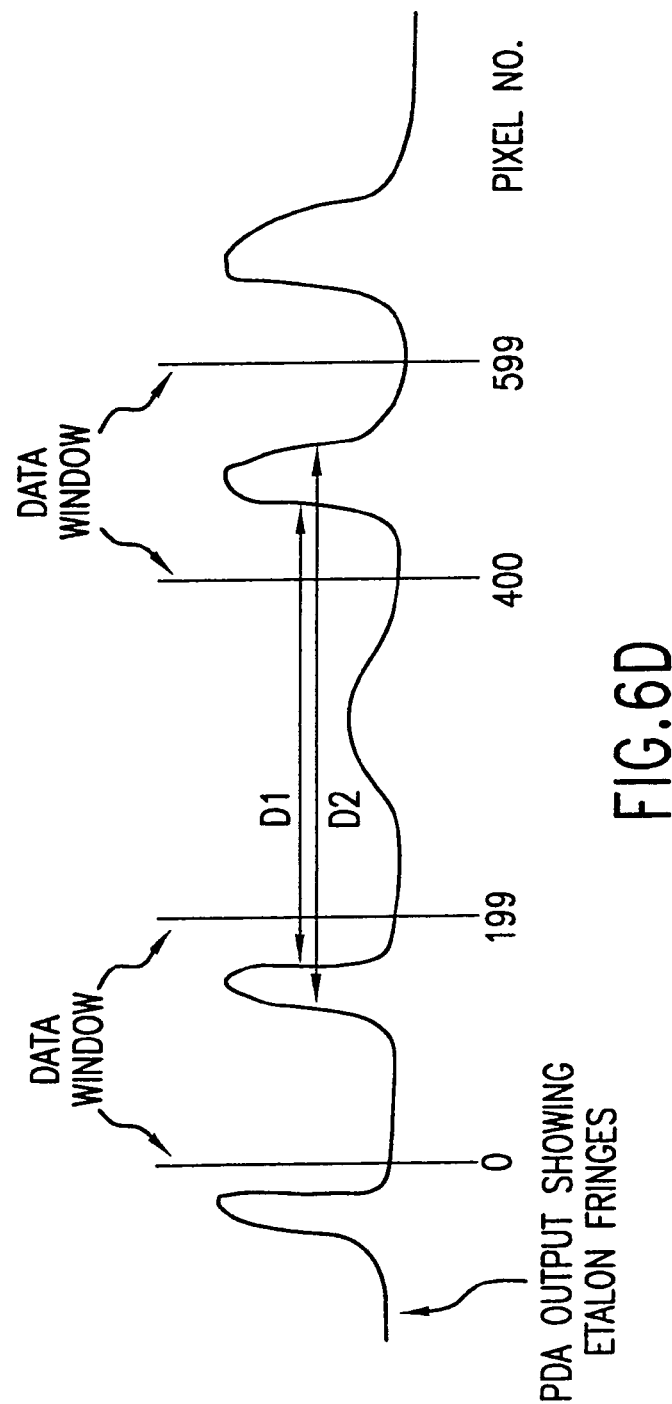

The specific details of a preferred algorithm used in this preferred embodiment will now be described. FIG. 6D is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks can be used to determine the wavelength, while their width measures the bandwidth of the laser. Two regions, each labeled data window, are shown in FIG. 6D. The data windows are located so that the fringe nearest the central peak is normally used for the analysis. However, when the wavelength changes to move the fringe too close to the central peak (which will cause distortion and resulting errors), the first peak is outside the window, but the second closest peak will be inside the window, and the software causes the processor in control module 197 to use the second peak. Conversely, when the wavelength shifts to move the current peak outside the data window away from the central peak the software will jump to an inner fringe within the data window. The data windows are also depicted on FIG. 6B.

For very fast computation of bandwidth for each pulse at repetition rates up to the range of 4,000 Hz to 6,000 Hz a preferred embodiment uses the hardware identified in FIG. 15. The hardware includes a microprocessor 400, Model MPC 823 supplied by Motorola with offices in Phoenix, Ariz.; a programmable logic device 402, Model EP 6016QC240 supplied by Altera with offices in San Jose, Calif.; an executive and data memory bank 404; a special very fast RAM 406 for temporary storage of photodiode array data in table form; a third 4×1024 pixel RAM memory bank 408 operating as a memory buffer; and an analog to digital converter 410.

As explained in U.S. Pat. No. 5,025,446 and U.S. Pat. No. 5,978,394, prior art devices were required to analyze a large mass of PDA data pixel intensity data representing interference fringes produced by etalon 184 an photodiode array 180 in order to determine center line wavelength and bandwidth. This was a relatively time consuming process even with a computer processor because about 400 pixel intensity values had to be analyzed to look for and describe the etalon fringes for each calculation of wavelength and bandwidth. A preferred embodiment of the present invention greatly speeds up this process by providing a processor for finding the important fringes which operates in parallel with the processor calculating the wavelength information.

The basic technique is to use programmable logic device 402 to continuously produce a fringe data table from the PDA pixel data as the pixel data are produced. Logic device 402 also identifies which of the sets of fringe data represent fringe data of interest. Then when a calculation of center wavelength and bandwidth are needed, microprocessor merely picks up the data from the identified pixels of interest and calculates the needed values of center wavelength and bandwidth. This process reduces the calculation time for microprocessor by about a factor of about 10.

Specific steps in the process of calculating center wavelength and bandwidth are as follows:

1) With PDA 180 clocked to operate at 2.5 MHz, PDA 180 is directed by processor 400 to collect data at a from pixels 1 to 600 at a scan rate of 4,000 Hz and to read pixels 1 to 1028 at a rate of 100 Hz.
2) The analog pixel intensity data produced by PDA 180 is converted from analog intensity values into digital 8 bit values (0 to 255) by analog to digital converter 410 and the digital data are stored temporily in RAM buffer 408 as 8 bit values representing intensity at each pixel of photodiode array 180.
3) Programmable logic device 402 analyzes the data passing out of RAM buffer 408 continuously on an almost real time basis looking for fringes, stores all the data in RAM memory 406, identifies all fringes for each pulse, produces a table of fringes for each pulse and stores the tables in RAM 406, and identifies for further analysis one best set of two fringes for each pulse. The technique used by logic device 402 is as follows:
  A) PLD 402 analyzes each pixel value coming through buffer 408 to determine if it exceeds an intensity threshold while keeping track of the minimum pixel intensity value. If the threshold is exceeded this is an indication that a fringe peak is coming. The PLD identifies the first pixel above threshold as the "rising edge" pixel number and saves the minimum pixel value of the pixels preceding the "rising edge" pixel. The intensity value of this pixel is identified as the "minimum" of the fringe.
  B) PLD 402 then monitors subsequent pixel intensity values to search for the peak of the fringe. It does this by keeping track of the highest intensity value until the intensity drops below the threshold intensity.
  C) When a pixel having a value below threshold is found, the PLD identifies it as the falling edge pixel number and saves the maximum value. The PLD then calculates the "width" of the fringe by subtracting the rising edge pixel number from the falling edge pixel number.
  D) The four values of rising edge pixel number, maximum fringe intensity, minimum fringe intensity and width of the fringe are stored in the circular table of fringes section of RAM memory bank 406. Data representing up to 15 fringes can be stored for each pulse although most pulses only produce 2 to 5 fringes in the two windows.
  E) PLD 402 also is programmed to identify with respect to each pulse the "best" two fringes for each pulse. It does this by identifying the last fringe completely within the 0 to 199 window and the first fringe completely within the 400 to 599 window.

The total time required after a pulse for (1) the collection of the pixel data, and (2) the formation of the circular table of fringes for the pulse is only about 200 micro seconds. The principal time saving advantages of this technique is that the search for fringes is occurring as the fringe data is being read out, digitized and stored. Once the two best fringes are identified for a particular pulse, microprocessor 400 secures the raw pixel data in the region of the two fringes from RAM memory bank 406 and calculates from that data the bandwidth and center wavelength. The calculation is as follows:

Typical shape of the etalon fringes are shown in FIG. 6D. Based on the prior work of PLD 402 the fringe having a maximum at about pixel 180 and the fringe having a maximum at about pixel 450 will be identified to microprocessor 400. The pixel data surrounding these two maxima are analyzed by microprocessor 400 to define the shape and location of the fringe. This is done as follows:

A half maximum value is determined by subtracting the fringe minimum from the fringe maximum dividing the difference by 2 and adding the result to the fringe minimum. For each rising edge and each falling edge of the two fringes the two pixels having values of closest above and closest below the half maximum value. Microprocessor then extrapolates between the two pixel values in each case to define the end points of D1 and D2 as shown in FIG. 6D with a precision of 1/32 pixel. From these values the inner diameter D1 and the outer diameter D2 of the circular fringe are determined.

Fine Wavelength Calculation

The fine wavelength calculation is made using the course wavelength measured value and the measured values of D1 and D2.

The basic equation for wavelength is:

$$\lambda = (2 * n * d/m)\cos(R/f) \tag{1}$$

where $\lambda$ is the wavelength, in picometers, n is the internal index of refraction of the etalon, about 1.0003, d is the etalon spacing, about 1542 um for KrF lasers and about 934:m for ArF lasers, controlled to +/−1 um, m is the order, the integral number of wavelengths at the fringe peak, about 12440, R is the fringe radius, 130 to 280 PDA pixels, a pixel being 25 microns, f is the focal distance from the lens to the PDA plane.

Expanding the cos term and discarding high order terms that are negligibly small yields:

$$\lambda=(2*n*d/m)[1-(½)(R/f)^2] \quad (2)$$

Restating the equation in terms of diameter D=2*R yields:

$$\lambda=(2*n*d/m)[1-(⅛)(D/f)^2] \quad (3)$$

The wavemeter's principal task is to calculate λ from D. This requires knowing f, n, d and m. Since n and d are both intrinsic to the etalon we combine them into a single calibration constant named ND. We consider f to be another calibration constant named FD with units of pixels to match the units of D for a pure ratio. The integer order m varies depending on the wavelength and which fringe pair we choose. m is determined using the coarse fringe wavelength, which is sufficiently accurate for the purpose.

A couple of nice things about these equations is that all the big numbers are positive values. The WCM's microcontroller is capable of calculating this while maintaining nearly 32 bits of precision. We refer to the bracketed terms as FRAC.

$$FRAC=[1-(⅛)(D/FD)^2] \quad (4)$$

Internally FRAC is represented as an unsigned 32 bit value with its radix point to the left of the most significant bit. FRAC is always just slightly less than one, so we get maximal precision there. FRAC ranges from [1-120E-6] to [1-25E-6] for D range of {560–260} pixels.

When the ND calibration is entered, the wavemeter calculates an internal unsigned 64 bit value named 2ND=2*ND with internal wavelength units of femtometers (fM)=$10^{-15}$ meter=0.001 pm. Internally we represent the wavelength λ as FWL for the fine wavelength, also in fm units. Restating the equation in terms of these variables:

$$FWL=FRAC*2ND/m \quad (5)$$

The arithmetic handles the radix point shift in FRAC yielding FWL in fm. We solve for m by shuffling the equation and plugging in the known coarse wavelength named CWL, also in fm units:

$$m=\text{nearest integer }(FRAC*2ND/CWL) \quad (6)$$

Taking the nearest integer is equivalent to adding or subtracting FSRs in the old scheme until the nearest fine wavelength to the coarse wavelength was reached. Calculate wavelength by solving equation (4) then equation (6) then equation (5). We calculate WL separately for the inner and outer diameters. The average is the line center wavelength, the difference is the linewidth.

Bandwidth Calculation

The bandwidth of the laser is computed as $(\lambda_2-\lambda_1)/2$. A fixed correction factor is applied to account for the intrinsic width of the etalon peak adding to the true laser bandwidth. Mathematically, a deconvulution algorithm is the formalism for removing the etalon intrinsic width from the measured width, but this would be far too computation-intensive, so a fixed correction)8, is subtracted, which provides sufficient accuracy. Therefore, the bandwidth is:

$$[\Delta]\lambda = \left(\frac{D_2 - D_1}{2}\right) - [\Delta\lambda\varepsilon],$$

$\Delta\lambda\varepsilon$, depends on both the etalon specifications and the true laser bandwidth. It typically lies in the range of 0.1-1 pm for the application described here.

Improved Etalon

This embodiment utilizes an improved etalon. Conventional etalon mounting schemes typically employ an elastomer to mount the optical elements to the surrounding structure, to constrain the position of the elements but minimize forces applied to the elements. A compound commonly used for this is room-temperature vulcanizing silicone (RTV). However, various organic vapors emitted from these elastomers can deposit onto the optical surfaces, degrading their performance. In order to prolong etalon performance lifetime, it is desirable to mount the etalon in a sealed enclosure that does not contain any elastomer compounds.

Figure 6E:
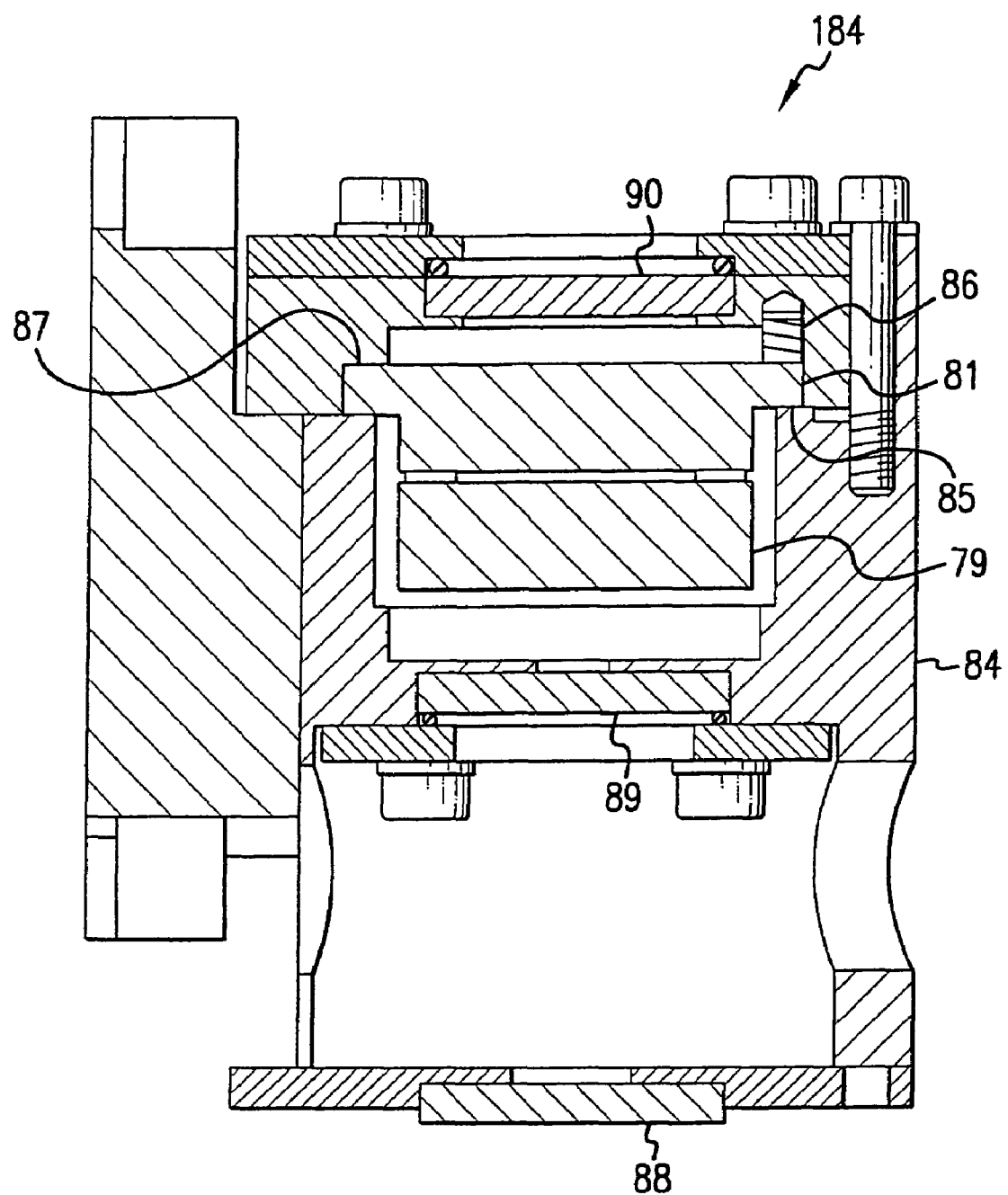
FIGS. 6E-H show features and details of preferred etalons.
Figure 6F:
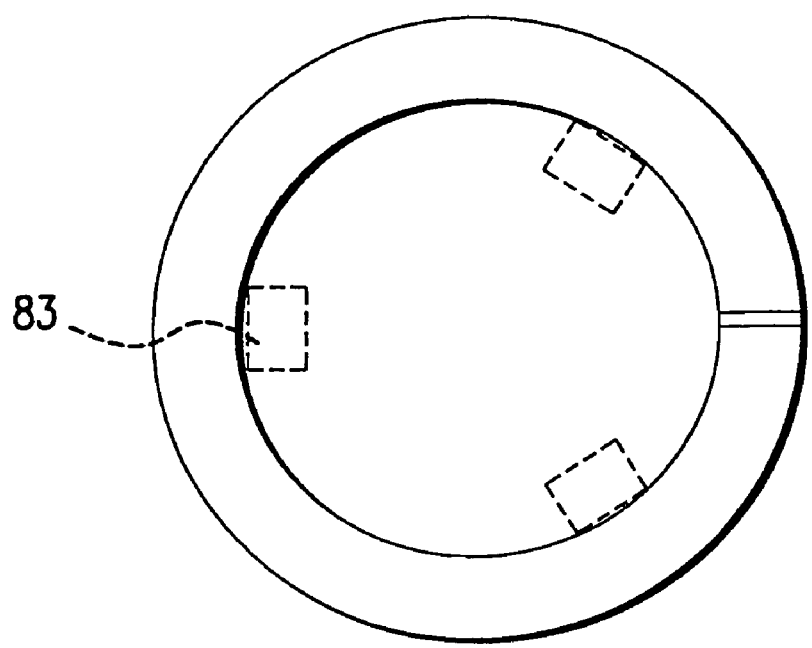
Figure 6G:
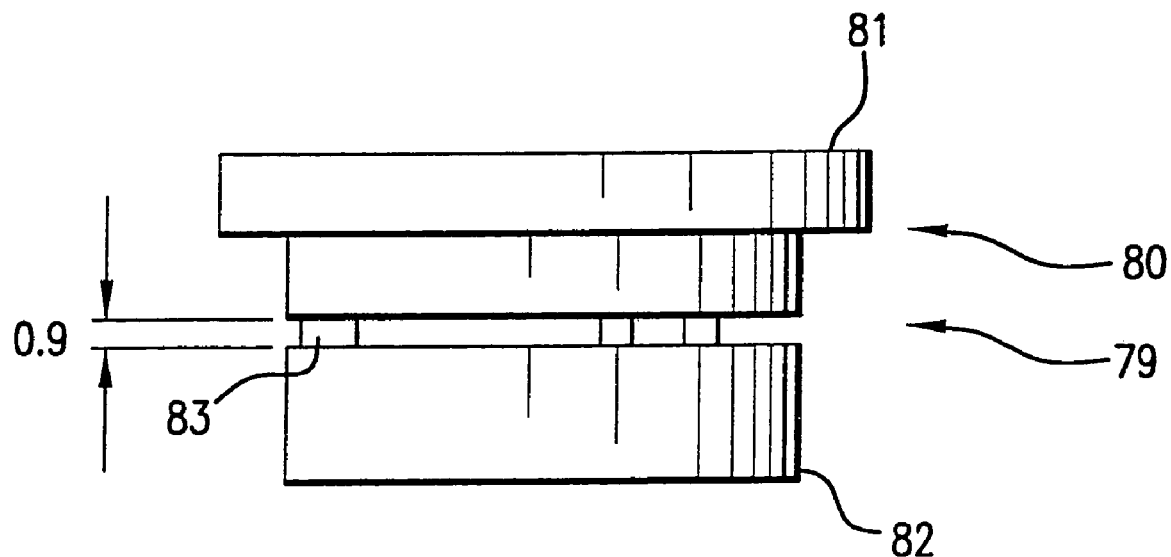

A preferred embodiment includes an improved etalon assembly shown at 184 in FIGS. 6 and 6E. The fused silica etalon 79 shown in FIG. 60 itself is comprised of a top plate 80 having a flange 81 and a lower plate 82, both plates being comprised of premium grade fused silica. The etalon is designed to produce fringes having free spectral range of 20.00 pm at 193.35 nm when surrounded by gas with an index of refraction of 1.0003 and a finesse equal to or greater than 25. Three fused silica spacers 83 with ultra low thermal expansion separate the plates and are 934 micrometer ±1 micrometer thick. These hold the etalon together by optical contact using a technique well known in the optics manufacturing art. The reflectance of the inside surfaces of the etalon are each about 88 percent and the outside surfaces are anti-reflection coated. The transmission of the etalon is about 50 percent.

The etalon 79 is held in place in aluminum housing 84 only by gravity and three low force springs 86 pressing the flange against three pads not shown but positioned on 120 degree centers under the bottom edge of flange 81 at the radial location indicated by leader 85. A clearance of only 0.004 inch along the top edge of flange 81 at 87 assures that the etalon will remain approximately in its proper position. This close tolerance fit also ensures that if any shock or impulse is transferred to the etalon system through the mounting, the relative velocities between the optical components and the housing contact points will be kept to a minimum. Other optical components of etalon assembly 184 include diffuser 88, window 89 and focusing lens 90 having a focal length of 458.4 mm.

The diffuser 88 may be a standard prior art diffuser commonly used up-stream of an etalon to produce a great variety of incident angles needed for the proper operation of the etalon. A problem with prior art diffusers is that about 90 percent of the light passing through the diffuser is not at a useful angle and consequently is not focused on the photo diode array. This wasted light, however, adds to the heating of the optical system and can contribute to degradation of optical surfaces. In a much preferred embodiment, a diffractive lens array is used as the diffuser 88. With this type of diffuser, a pattern is produced in the diffractive lens array which scatters the light thoroughly but only within an angle of about 5 degrees. The result is that about 90 percent of the light falling on the etalon is incident at useful angles and a much greater portion of the light incident on the etalon is ultimately detected by the photo diode array. The result is the light incident on the etalon can be greatly reduced which greatly increases optical component life. Applicants estimate that the incident light can be reduced to less than 5% or 10% of prior art values with equivalent light on the photo diode array.

Better Collimation With Diffractive Diffuser

Figure 6H:
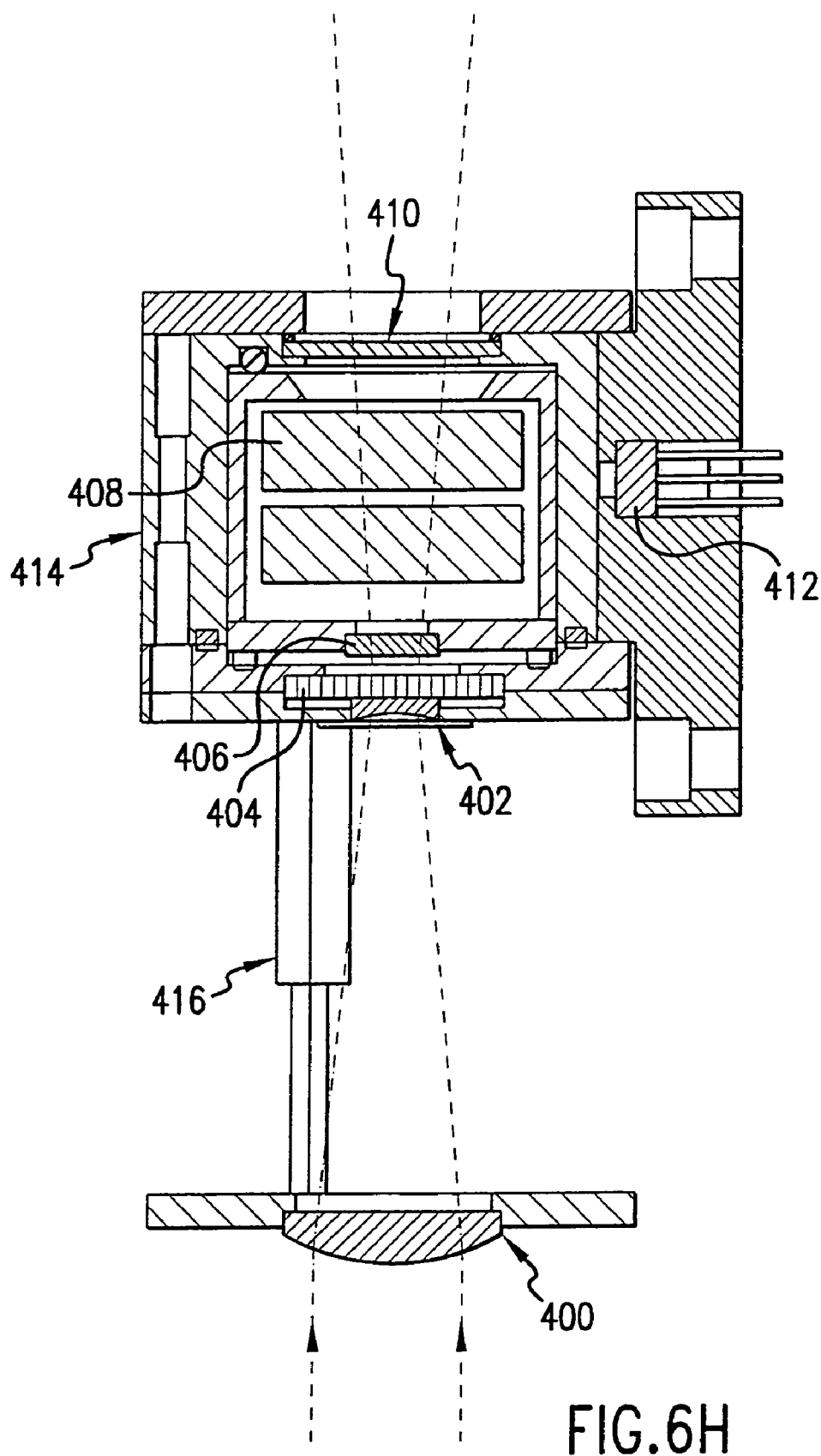
Figure 7:
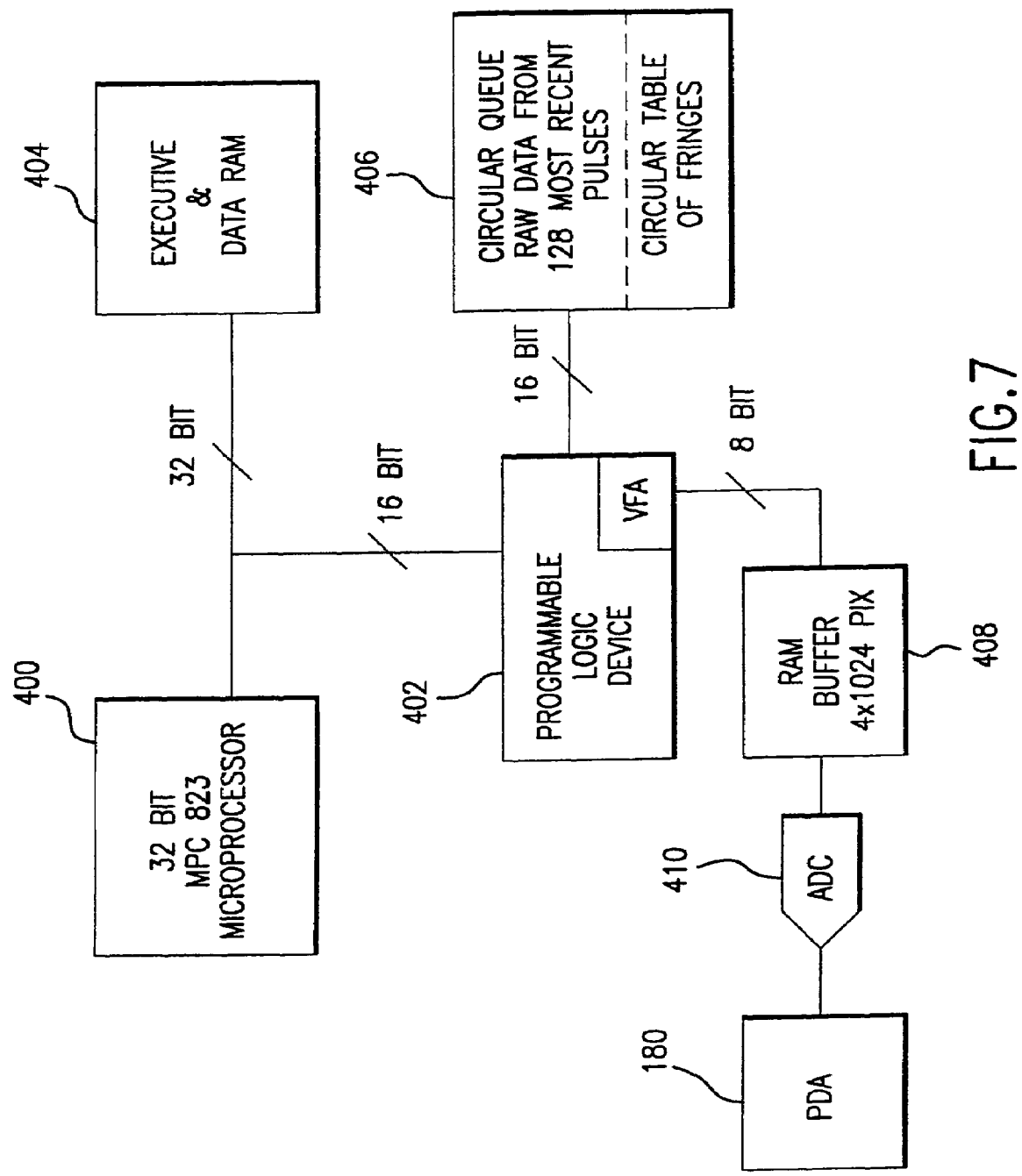
FIG. 7 show electronics and processors used in a preferred wavelength control system.

FIG. 6H shows features of a preferred embodiment providing even further reduction of light intensity passing through the etalon. This embodiment is similar to the embodiment discussed above. The sample beam from mirror 182 (approximately 15 mm×3 mm) passes upward through condensing lens 400 and is then re-collimated by lens 402. The beam now colliminated and reduced in dimension to about 5 mm×1 mm passes through etalon housing window 404 and then passes through a diffractive diffusing element 406 which in this case (for an ArF laser) is a diffractive diffusing element provided by Mems Optical, Inc. with offices in Huntsville, Ala. The element is part number D023-193 which converts substantially all 193 nm light in any incoming collimated beam of any cross sectional configuration into a beam expanding in a first direction at 2E and in a second direction perpendicular to the first direction at 4E. Lens 410 then Afocuses≅the expanding beam onto a rectangular pattern covering photodiode array 180 shown in FIG. 6. The active area of the photo diode array is about 0.5 mm wide and 25.6 mm long and the spot pattern formed by lens 410 is about 15 mm×30 mm. Diffractive diffusing element thoroughly mixes the spatial components of the beam but maintains substantially all of the beam energy within the 2E and 4E limits so that the light passing through the etalon can be substantially reduced and efficiently utilized. The reader should recognize that further reductions in beam energy passing through the etalon could be realized by reducing the spot pattern in the short dimension of the photo diode array. However, further reductions to less than 15 mm will make optical alignment more difficult. Therefore, the designer should consider the spot pattern size to be a trade-off issue.

In another system designed for a KrF laser operating at about 248.327 nm a similar design is provided with adjustments for wavelength. In this embodiment lens 400 has a focal length of about 50 mm. (The lens is Melles Griot Corporation part number OILQP001.) Collimating lens 402 has a focal length of −20 mm (EVI Laser Corporation part number PLCC-10.0-10.3-UV). The diffractive diffusing element 406 is Mems Optical Corporation part number D023-248. In this embodiment and in the ArF embodiment, the spacing between the two lenses can be properly positioned with spacer 416. Applicants estimate that the energy of the beam passing through the etalon with the laser operating at 2000 Hz is about 10 mw and is not sufficient to cause significant thermal problems in the etalon.

In other preferred embodiments, the beam could be allowed to come to a focus between lenses 400 and 402. Appropriate lenses would in this case be chosen using well known optical techniques.

Feedback Control of Pulse Energy and Wavelength

Based on the measurement of pulse energy of each pulse as described above, the pulse energy of subsequent pulses are controlled to maintain desired pulse energies and also desired total integrated dose of a specified number of pulses all as described in U.S. Pat. No. 6,005,879, Pulse Energy Control for Excimer Laser which is incorporated by reference herein.

Wavelength of the laser may be controlled in a feedback arrangement using measured values of wavelengths and techniques known in the prior art such as those techniques described in U.S. Pat. No. 5,978,394, Wavelength System for an Excimer Laser also incorporated herein by reference. Applicants have recently developed techniques for wavelength tuning which utilize a piezoelectric driver to provide extremely fast movement of tuning mirror. Some of these techniques are described in United States patent application Ser. No. 608,543, Bandwidth Control Technique for a Laser, filed Jun. 30, 2000 which is incorporated herein by reference. FIGS. 8B1 and 8B2 are extracted from that application and show the principal elements of this technique. A piezoelectric stack is used for very fast mirror adjustment and larger slower adjustments are provided by a prior art stepper motor operating a lever arm. The piezoelectrie stack adjusts the position of the fulcrum of the lever arm.

New LNP With Combination PZT-Stepper Motor Driven Tuning Mirror

Detail Design With Piezoelectric Drive

FIG. 8S is a block diagram showing features of the laser system which are important for controlling the wavelength and pulse energy of the output laser beam. Shown are a line narrowing module 15K which contains a three prism beam expander, a tuning mirror 14 and a grating. Wavemeter 104 monitors the output beam wavelength and provides a feedback signal to LNP processor 106 which controls the position of tuning mirror 14 by operation of a stepper motor and a PZT stack as described below. Operational wavelengths can be selected by laser controller 102. Pulse energy is also measured in wavemeter 104 which provides a signal used by controller 102 to control pulse energy in a feedback arrangement as described above. FIG. 8B1 is a block diagram showing PZT stack 80, stepper motor 82, mirror 14 and mirror mount 86.

FIG. 8B1 is a drawing showing detail features of a preferred embodiment of the present invention. Large changes in the position of mirror 14 are produced by stepper motor through a 26.5 to 1 lever arm 84. In this case a diamond pad 41 at the end of piezoelectric drive 80 is provided to contact spherical tooling ball at the fulcrum of lever arm 84. The contact between the top of lever arm 84 and mirror mount 86 is provided with a cylindrical dowel pin on the lever arm and four spherical ball bearings mounted (only two of which are shown) on the mirror mount as shown at 85. Piezoelectric drive 80 is mounted on the LNP frame with piezoelectric mount 80A and the stepper motor is mounted to the frame with stepper motor mount 82A. Mirror 14 is mounted in mirror mount 86 with a three point mount using three aluminum spheres, only one of which are shown in FIG. 8B1. Three springs 14A apply the compressive force to hold the mirror against the spheres.

FIG. 8B2 is a preferred embodiment slightly different from the one shown in FIG. 8B1. This embodiment includes a bellows 87 to isolate the piezoelectric drive from the environment inside the LNP. This isolation prevents UV damage to the piezoelectric element and avoid possible contamination caused by out-gassing from the piezoelectric materials.

Test Results

Figure 8C:
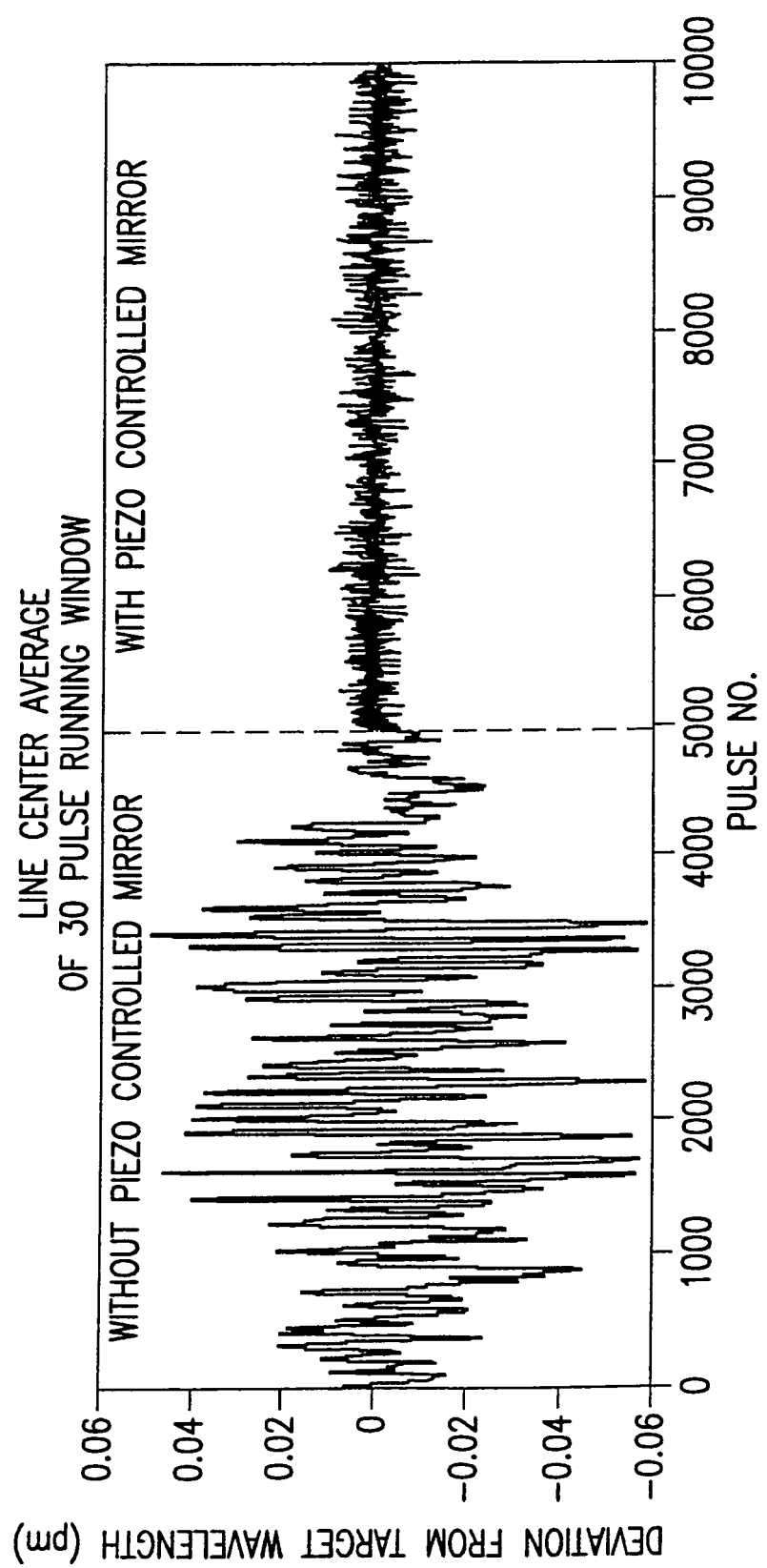
FIG. 8C shows the effect of PZT control.

FIG. 8C shows actual test data from a laser fitted with the FIG. 8B2 embodiment. The graph is a plot of the deviation from target wavelength of the average of 30 pulse windows. The deviation is reduced from about 0.05 pm to about 0.005 pm.

This embodiment is a major speed up as compared to the stepper motor drive system described above but not quite fast enough for pulse-to-pulse adjustment. Earlier methods of mirror positioning required about 7 ms to move mirror 14, making pulse-to-pulse wavelength correction at 2000 Hz out of the question. In that earlier technique, a lever arm pivoted about a pivot axis to produce a 1 to 26.5 reduction in the mirror movement compared to the stepper position movement. The prior art stepper has a total travel of ½ inch (12.7 mm) and 6000 steps so that each step is a distance of about 2 microns. With the 1-26.5 reduction, one step moves the mirror about 75 nm which typically changes the wavelength of the laser wavelength about 0.1 pm. In the fast acting technique shown in FIG. 12A, a piezo stack 80 has been added at the pivot position of the lever arm. A preferred piezo stack is Model P-840.10 supplied by Physik Instrumente GmbH with offices in Waldbronn, Germany.

This stack will produce linear adjustment of about 3.0 microns with a drive voltage change of 20 volts. This range is equivalent to about $\forall$20 steps of the stepper motor.

Figure 8D:
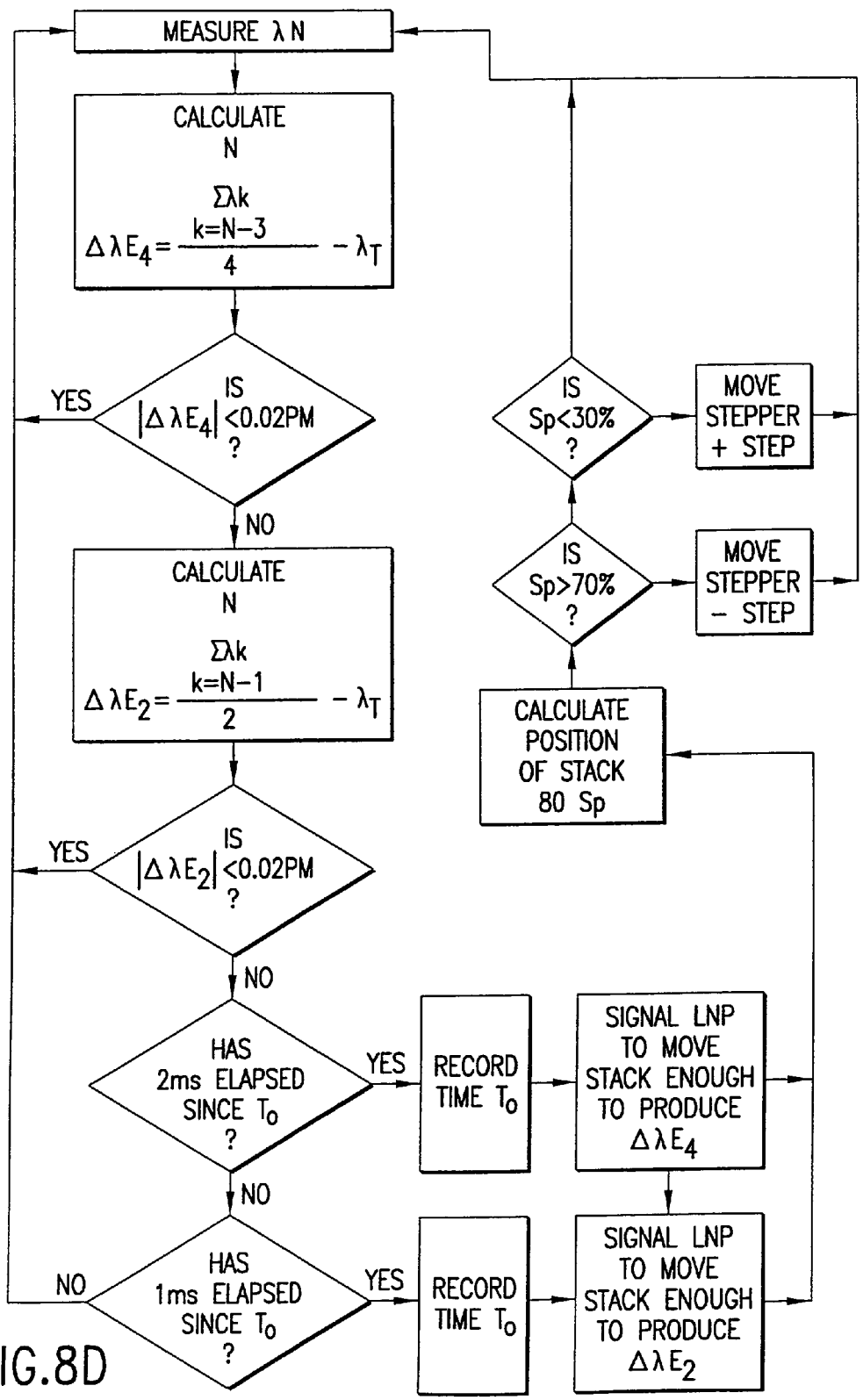
FIGS. 8D and E show control algorithms.
Figure 8E:
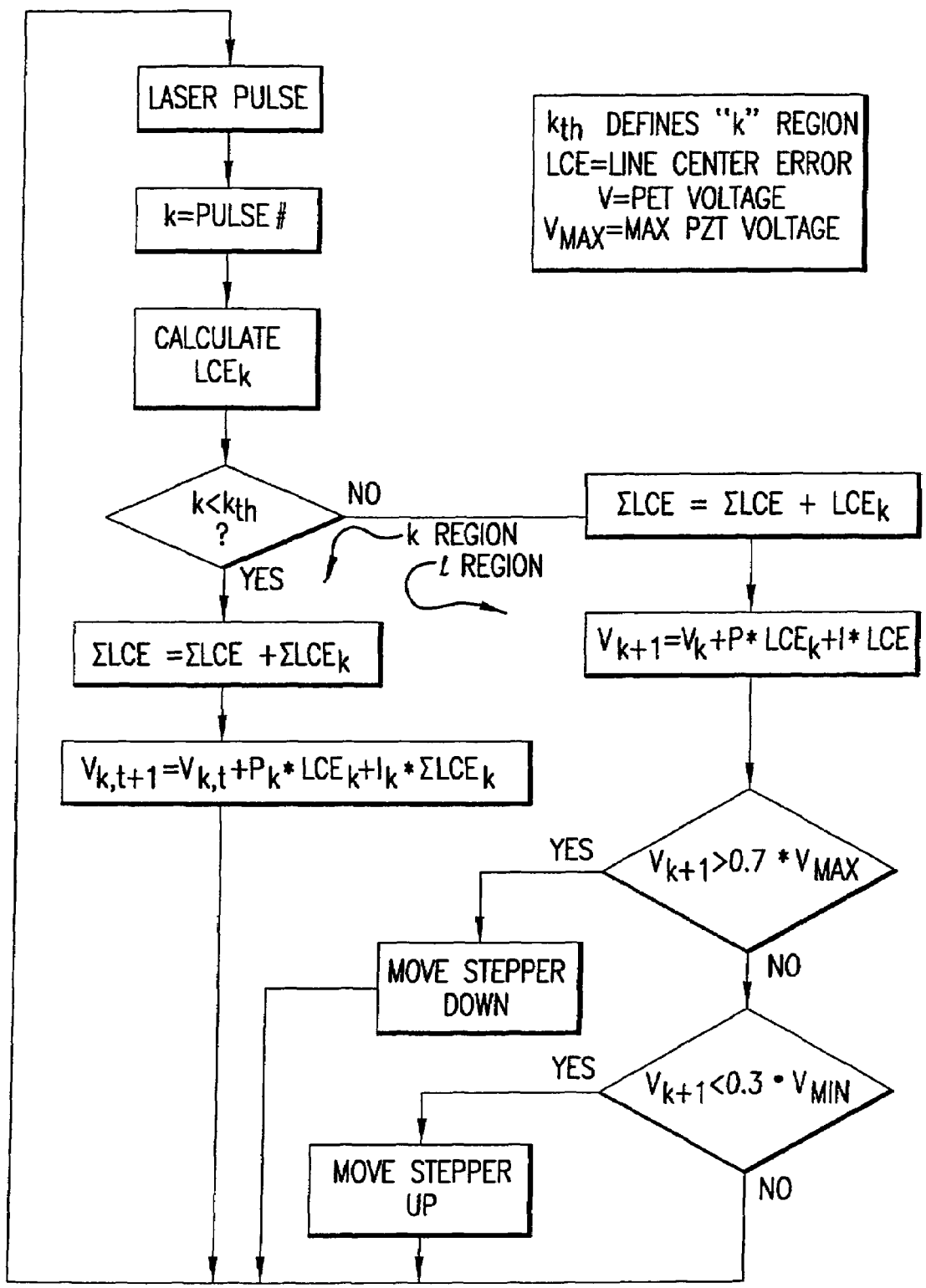

The stack responds to a control signal within less than 1 microsecond and the system can easily respond to updated signals at a frequency of 4000 Hz. In a preferred embodiment the control for each pulse at 4000 Hz pulse rate is based not on the previous pulse but the pulse prior to the previous pulse to allow plenty of time for the wavelength calculation. However, this embodiment provides a factor of 7 improvement over the prior art design with a 7 millisecond latency. Therefore, much faster feedback control can be provided. One preferred feedback control algorithm is described in FIG. 8D. In this algorithm the wavelength is measured for each pulse and an average wavelength for the last four and last two pulses is calculated. If either of the averages deviate from the target wavelength by less than 0.02 pm, no adjustment is made. If both deviate more than 0.02 pm from the target, an adjustment is made to the mirror assembly by piezoelectric stack 80 to provide a wavelength correction. Which of the two averages is used is determined by how much time had elapsed since the last adjustment. The piezoelectric stack is maintained within its control range by stepping the stepper motor as the stack approaches 30 and 70 percent of its range (or to provide more available range, 45 and 55 percent could be used instead of the 30 and 70 percent range values). Since the stepper motor requires about 7 ms to complete a step, the algorithm may make several piezo adjustments during a stepper motor step.

Issues Involved In Applying Periodic Inputs For Bandwidth Tuning (Mathematical Analysis)

Applicants have investigated methods of controlling the PZT to achieve desired broader bandwidth. The following is an example of analysis done by Applicants to achieve these results. The problem is to apply periodic voltages to PZT 80 which when filtered by dynamics of the tuning mirror system results in bandwidths having the desired values.

A method is needed to monitor the error between the desired and actual wavelength values and make adjustments to the applied voltage in real time. Such a method would detect the error caused by non-linearities or imperfect modeling of the system and could correct for them. It would also follow any drifting dynamics and maintain optimal periodic command following.

Described below are several different methods for determining and adjusting the applied voltage, u, to generate the desired wavelength pattern, r, in real time.

The first approach is to observe the error, e, for a single period of the desired pattern, r, and then compute an adjustment to the applied voltage, u, which will tend to reduce the error. The appropriate law can be found by first expressing the error, e, as the difference between the actual and desired patterns.

$$e = r - y \qquad (1)$$

The actual wavelength, y, is related to the periodic input, u, by the equation:

$$y(t) = \sum_{\tau=0}^{N-1} h_c(t-\tau)u(t) \qquad (2)$$

where N is the period of the command signal, $h_c$ is the cyclic pulse response of the voltage to wavelength system. The cyclic pulse response is related to the pulse response by the equation:

$$h_c(t) = \sum_{\tau=0}^{\infty} h(t + N\tau) \qquad (3)$$

Define an error function which is the sum of squares of the error:

$$J \equiv \sum_{t=0}^{N-1} e^2(t) \qquad (4)$$

The derivative of this error function with respect to the value of the periodic control voltage at any instant in time, u(t) is found to be:

$$\frac{\partial J}{\partial u(t)} = -2 \sum_{\tau=0}^{N-1} e(\tau) h_c(\tau - t) \qquad (5)$$

The control law is then simply to update all of the values of the control signal, u, according to the equation:

$$u(t) \rightarrow u(t) + \mu \sum_{\tau=0}^{N-1} e(\tau) h_c(\tau - t) \qquad (6)$$

where the parameter, μ is adjusted to trade convergence speed for stability and noise insensitivity. If the value of μ is chosen small enough, this control law is guaranteed to converge to the optimal cancellation waveform.

A refinement of this method is to limit the number of degrees of freedom in the control signal, u. This might be done to limit the bandwidth of the signal being put into the actuator, or it might be used to improve the convergence time of the algorithm. The number of degrees of freedom can be reduced by expressing u as a some of basis functions, φ:

$$u(t) = \sum_{i=0}^{m-1} \phi_i(t) q_i \qquad (7)$$

Typical values for the basis functions might be sine waves corresponding to the first few harmonics of the fundamental frequency. This would in effect limit the bandwidth of the applied signal, u. Taking the derivatives of J with respect to $q_i$ gives yields a control law for adjusting the $q_i$'s every cycle:

$$\frac{\partial J}{\partial q_i} = -2 \sum_{t=0}^{N-1} e(t) \sum_{\tau=0}^{N-1} h_c(t-\tau) \phi_i(\tau) \qquad (8)$$

$$q_i \rightarrow q_i + \mu \sum_{t=0}^{N-1} e(t) \sum_{\tau=0}^{N-1} h_c(t-\tau) \phi_i(\tau) \qquad (9)$$

An improvement can be made to the algorithm by adjusting each component of the correction signal, u(t), just before it is applied. The data for the adjustment is the error signal from the previous N samples. Equation 6 can be rewritten as follows:

$$u(t) = u(t-N) + \mu \sum_{\tau=0}^{N-1} e(\tau + t - N) h_c(\tau - N) \qquad (10)$$

$$= u(t-N) + \mu \sum_{\tau=0}^{N-1} h_c(\tau) e(\tau - N + t)$$

The first line of the equation results from the fact that the control signal exactly N cycles previously corresponds to the control signal currently being adjusted. The second line follows by a change of variable in the summation. Taking the z-transform of Equation 10:

$$u(z) = z^{-N} u(z) + \mu \sum_{\tau=0}^{N-1} h_c(t) e(z) z^{\tau-N} \qquad (11)$$

The ratio of u(z) and e(z) yield an LTI filter which implements the adaptation law on a sample by sample basis.

$$K(z) = \frac{u(z)}{e(z)} = \mu \frac{\sum_{\tau=0}^{N-1} h_c(\tau) z^{\tau-N}}{1 - z^{-N}} \qquad (12)$$

Note that there are N controller poles equally spaced around the unit circle. This compensator will have infinite gain at each harmonic of the fundamental frequency. This control law can be refined by using a partial fraction expansion:

$$K(z) = \sum_{k=0}^{N-1} \frac{r_k}{z - z_k} \quad z_k = e^{j2\pi k/N} \qquad (13)$$

The residues, $r_k$, can be found from the following Equation:

$$r_k = \frac{\sum_{\tau=0}^{N-1} h_c(\tau) z_k^{\tau-N}}{\prod_{i \neq k} (z_k - z_i)} = \frac{\sum_{\tau=0}^{N-1} h_c(\tau) z_k^{\tau}}{\prod_{i \neq k} (z_k - z_i)} = \frac{G(z_k^{-1})}{\prod_{i \neq k} (z_k - z_i)} \qquad (14)$$

The last equality of this equation follows directly from Equation 3 and the definition of the z-transform. The term in the denominator can be found by applying L'Hopital's rule:

$$\prod_{i \neq k} (z_k - z_i) = \lim_{z \to z_k} \frac{(z^N - 1)}{z - z_k} = \lim_{z \to z_k} \frac{N z^{N-1}}{1} = N z_k^{N-1} = N z_k^{-1} \qquad (15)$$

Thus the residues are given by:

$$r_k = \frac{G(z_k^{-1})}{N z_k^{-1}} \qquad (16)$$

And the compensator is therefore:

$$K(z) = \mu \sum_{k=0}^{N-1} \frac{z_k G(z_k^{-1})}{N(z - z_k)} \qquad (17)$$

Figure 9A:
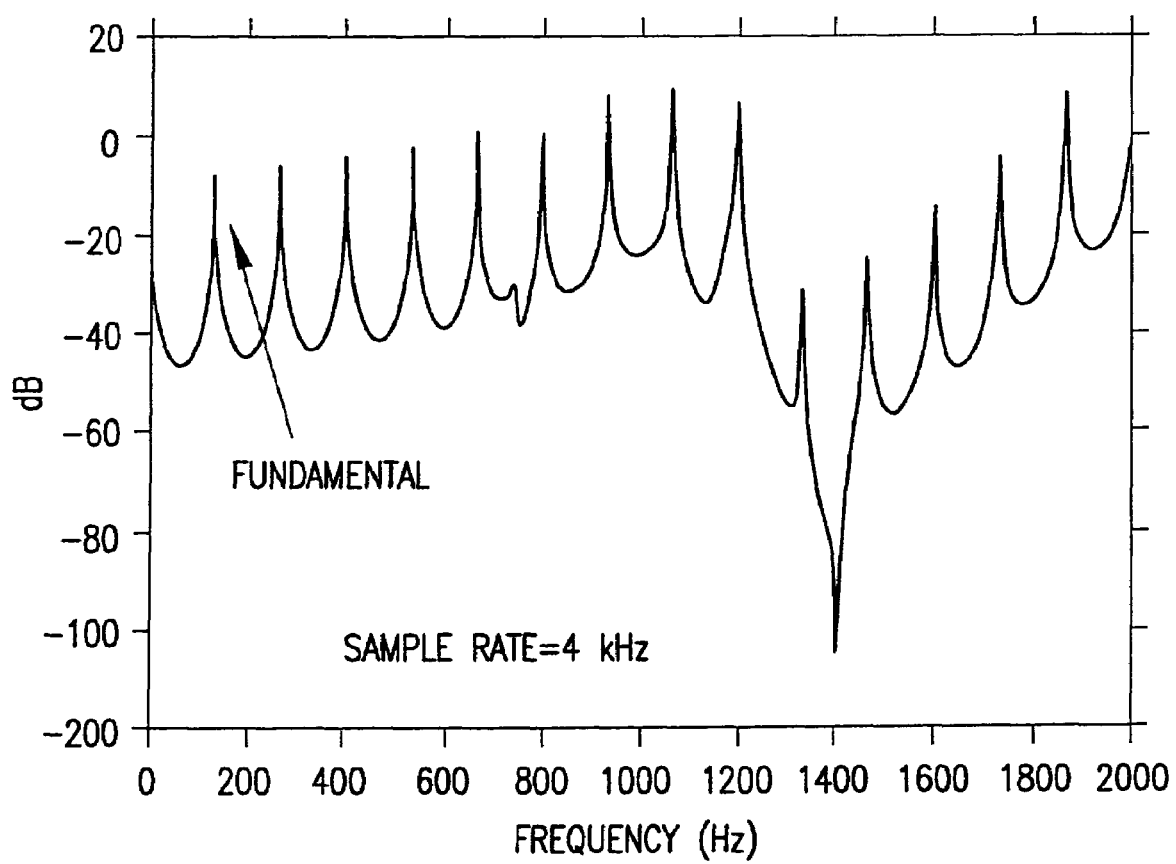
FIGS. 9A-D show the wavelength effects of two different PZT input patterns.

FIG. 9A shows the loop transfer function for the compensator in Equation 17 applied to a model based on measurements made from applied $R_{max}$ voltage to wavelength for an LNP from a 7000A laser. Note that the transfer function has infinite gain at DC, the fundamental frequency, and all of its harmonics. This filter will achieve perfect following of the periodic command, r, provided that it is closed loop stable. A Nyquist plot for the transfer function with a small amount of damping confirms that the filter is closed loop stable.

Figure 9B:
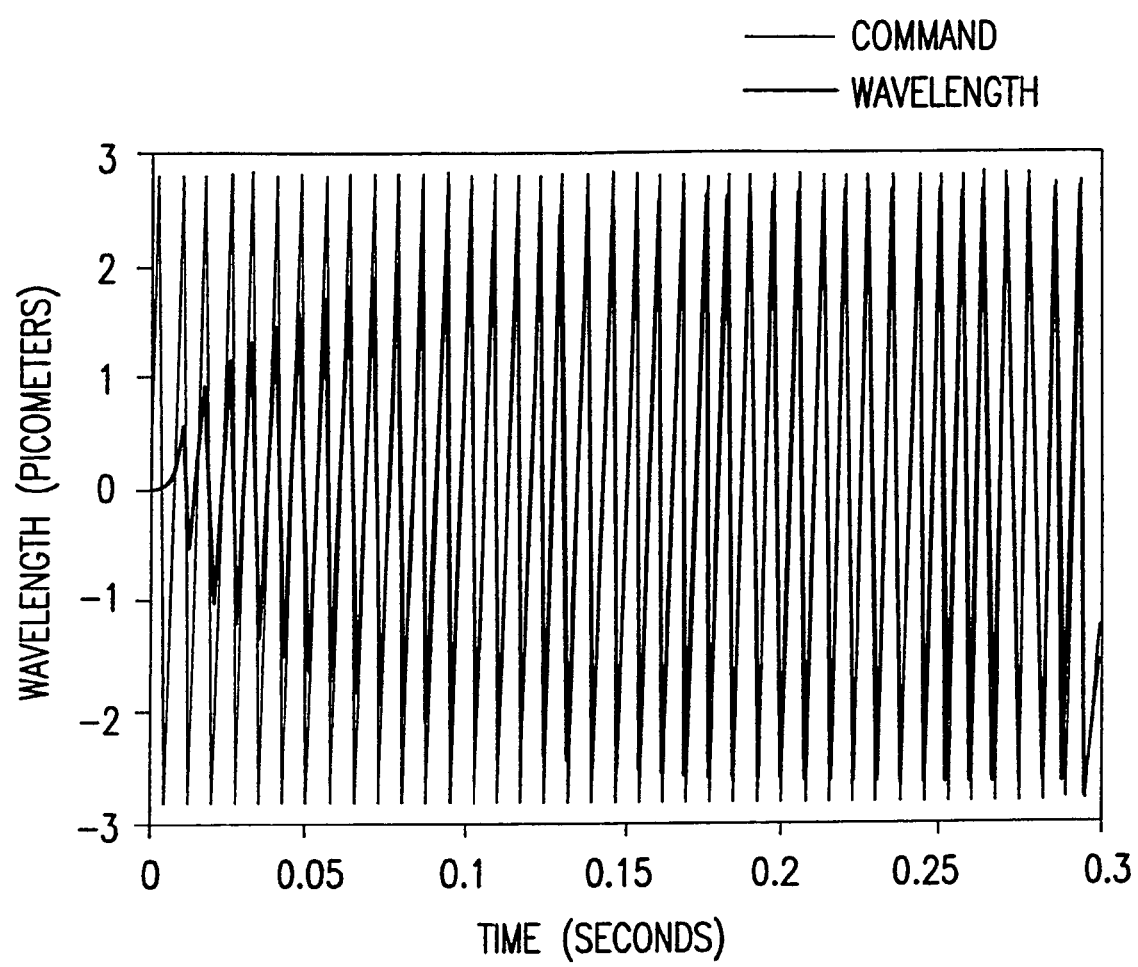

FIG. 9B shows a simulation of this algorithm. The simulation employed a model based on measurements taken from a 4000 Hz Arf excimer laser. The light line in the figure represents a wavelength pattern which will yield a desired spectrum when integrated over a slit width of 30 pulses. The heavy line represents the actual wavelength output by the laser. The simulation was started with the input signal to actuator, u(t), set equal to zero for all 30 pulses. The simulation shows that within 250 ms, nearly perfect following of the commanded input has been achieved.

An additional refinement can be made to the control law analogous to using the basis functions of Equation 7. Instead of allowing the controller to cancel the signal at all harmonics, we can limit the cancellation to just the first few harmonics by not including all of the terms in Equation 17.

$$K(z) = \mu \sum_{k=-n}^{n} \frac{z_k G(z_k^{-1})}{N(z-z_k)} \quad z_k = e^{j2\pi k/N} \quad (18)$$

Figure 9C:
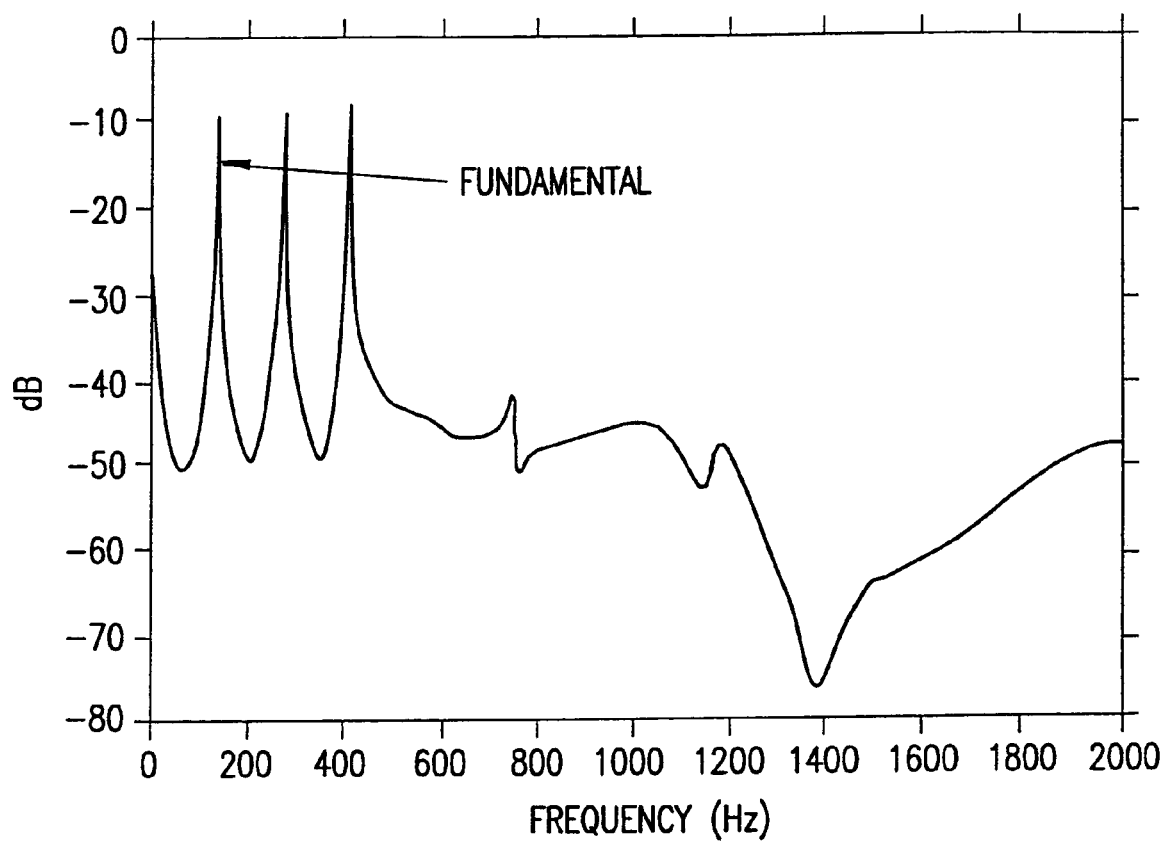

An example of the loop transfer function which results for n=3 is shown in FIG. 9C. Infinite gain is achieved only at DC and the first three harmonics. Again, a Nyquist plot (not shown) reveals that stability is still being maximized. Application of this control law would yield optimal matching of the desired wavelength pattern r, subject to the constraint that the control signal is band limited.

Figure 9D:
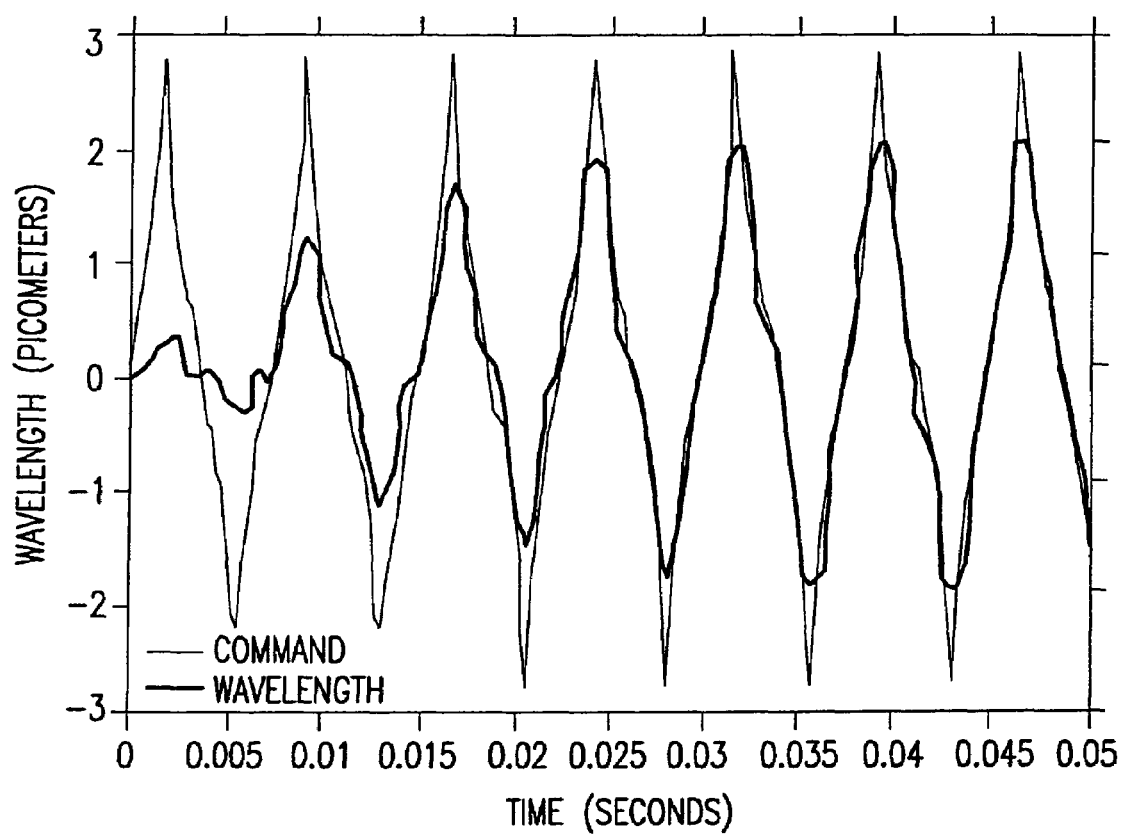

FIG. 9D shows the simulation using the FIG. 9C transfer function. As before the light line represents the desired pattern and the heavy line represents the actual wavelength of the laser. Note that while the cancellation is no longer perfect, convergence was achieved in only 40 ms, an 84% reduction over the full order case.

Techniques For Bandwidth Tuning Using PZT

For reasons discussed in the previous section, care must be exercised in applying controls to the PZT in order to vary the center line wavelength to simulate a broader bandwidth for a series of pulses. This is because the response of the PZT controlled tuning mirror system is not linear for periodic signal inputs. The apparent gain of the PZT device increases with higher voltage inputs. Further, even if the system were perfectly linear, the dynamics might vary over time. A system initially producing the desired wavelength and bandwidth values would eventually produce distorted values as the dynamics drifted away from the design point. In fact, substantial resonances are present in the typical system at high frequency input signals. FIGS. 9A and 9C indicate the general shapes of damping functions needed to compensate for resonances at frequencies higher than about 50 Hz.

Other Approaches

Figure 10A:
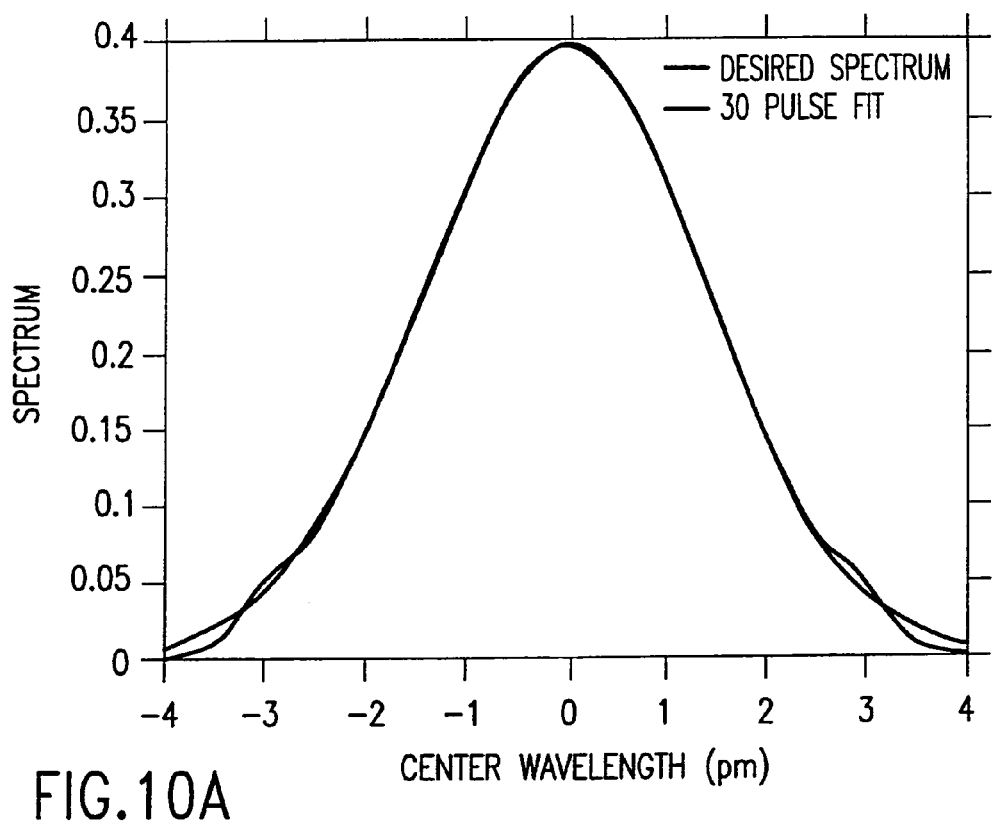
FIGS. 10A-I show various techniques for creating effective bandwidth patterns.
Figure 10B:
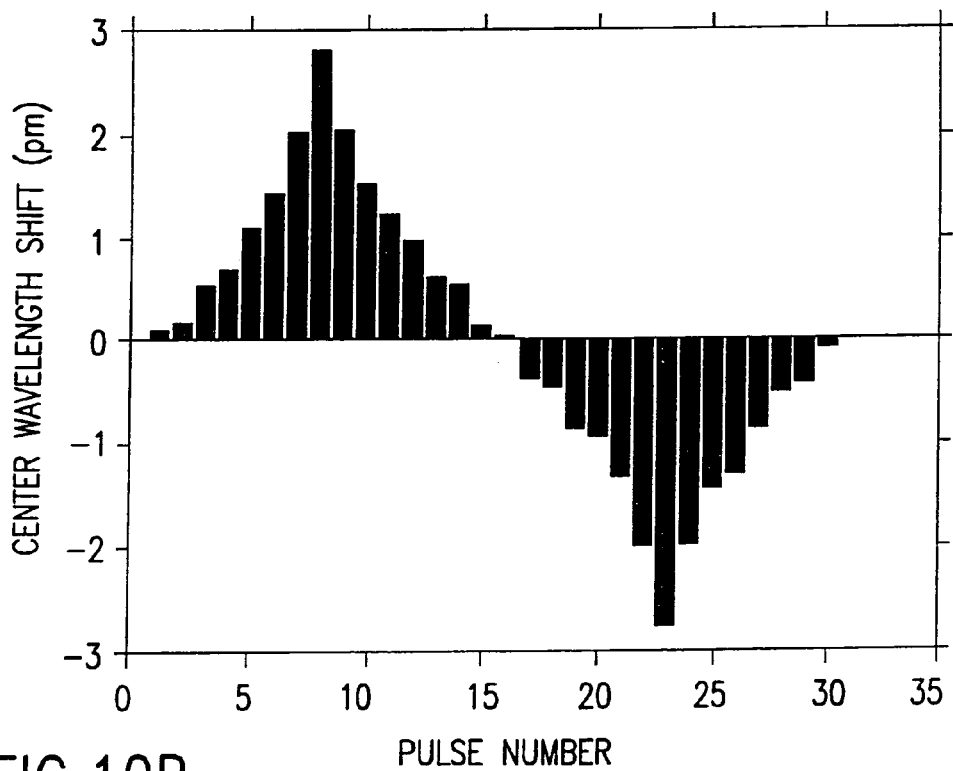
Figure 10C:
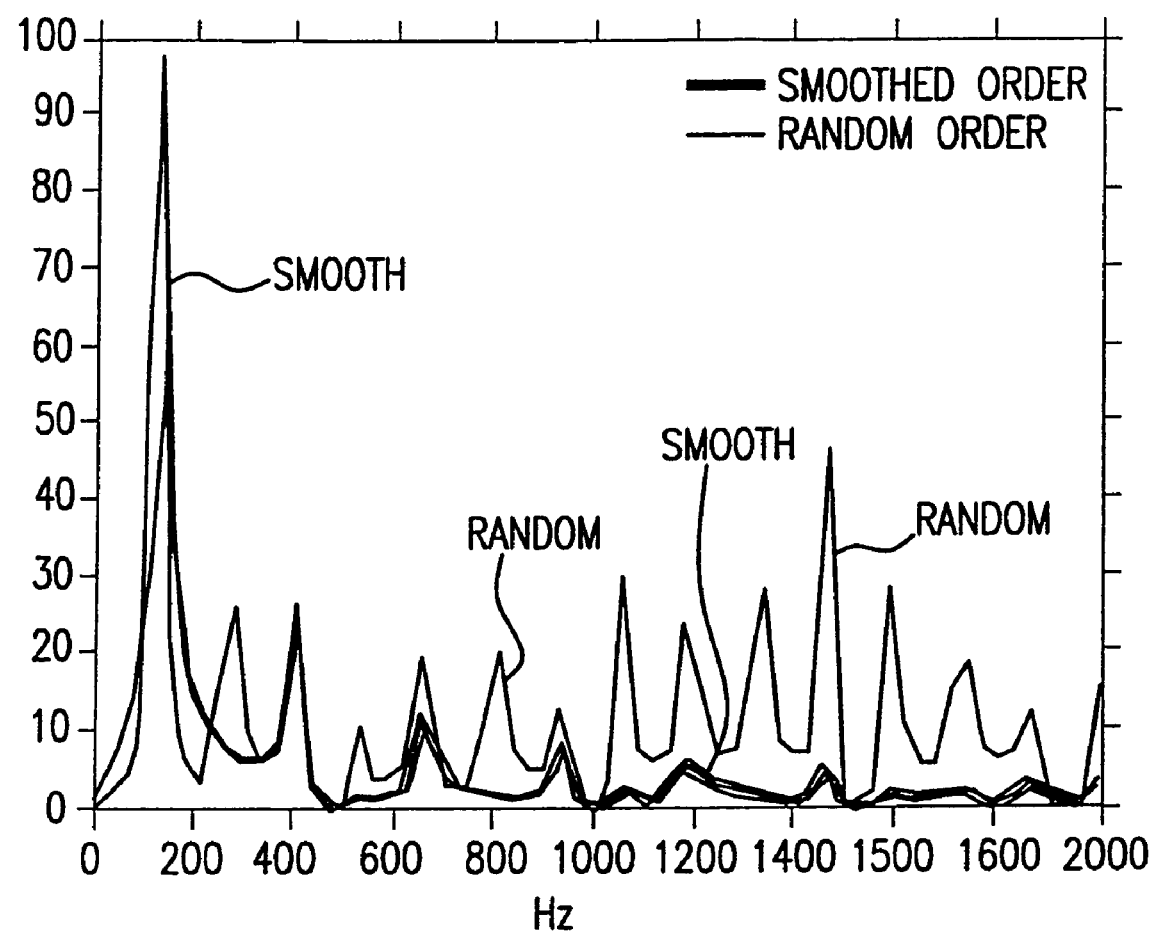
Figure 10D:
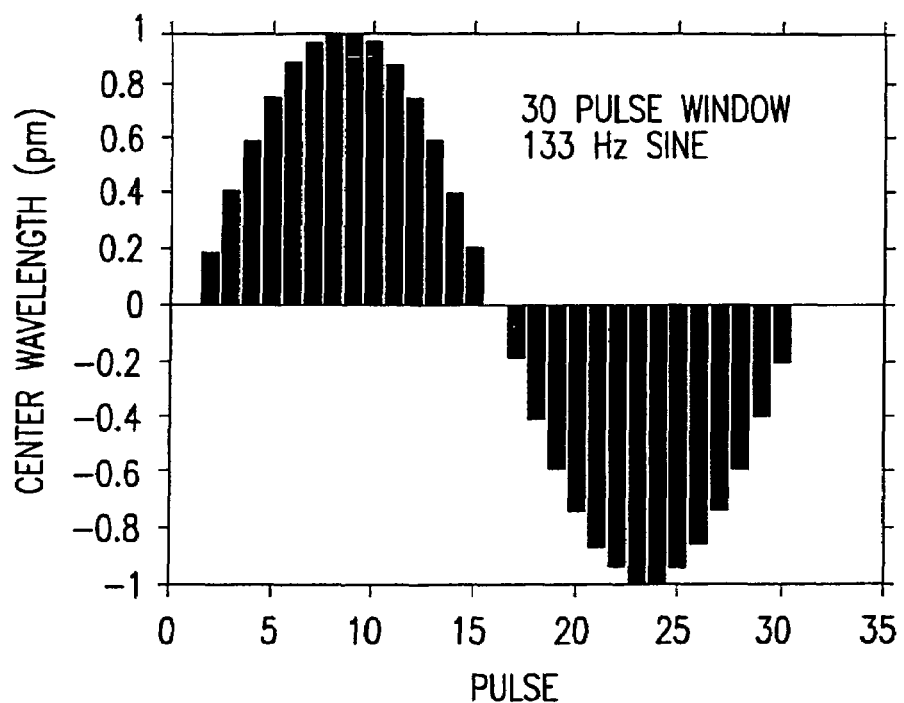
Figure 10E:
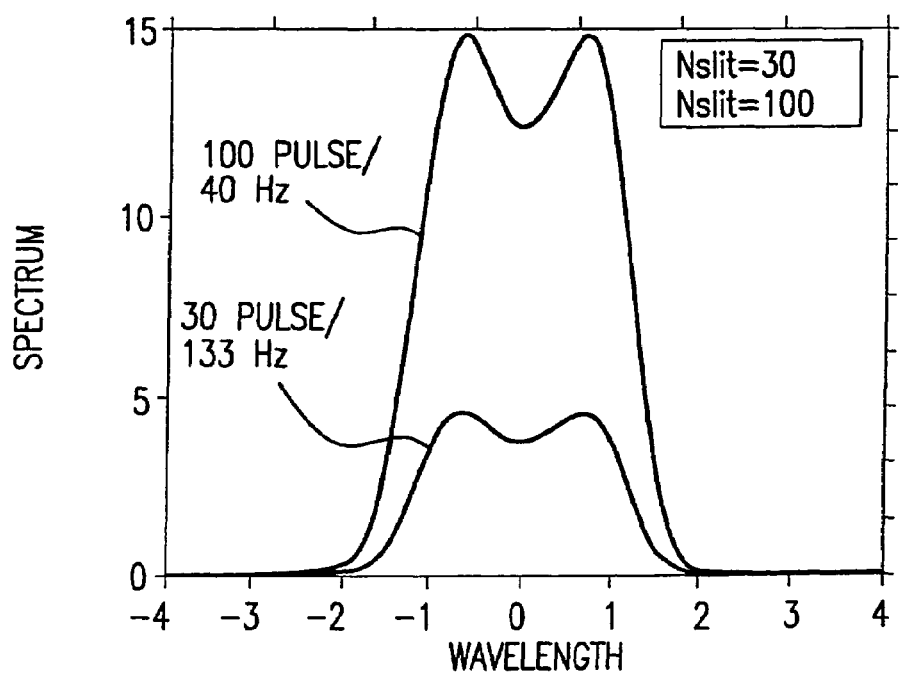
Figure 10F:
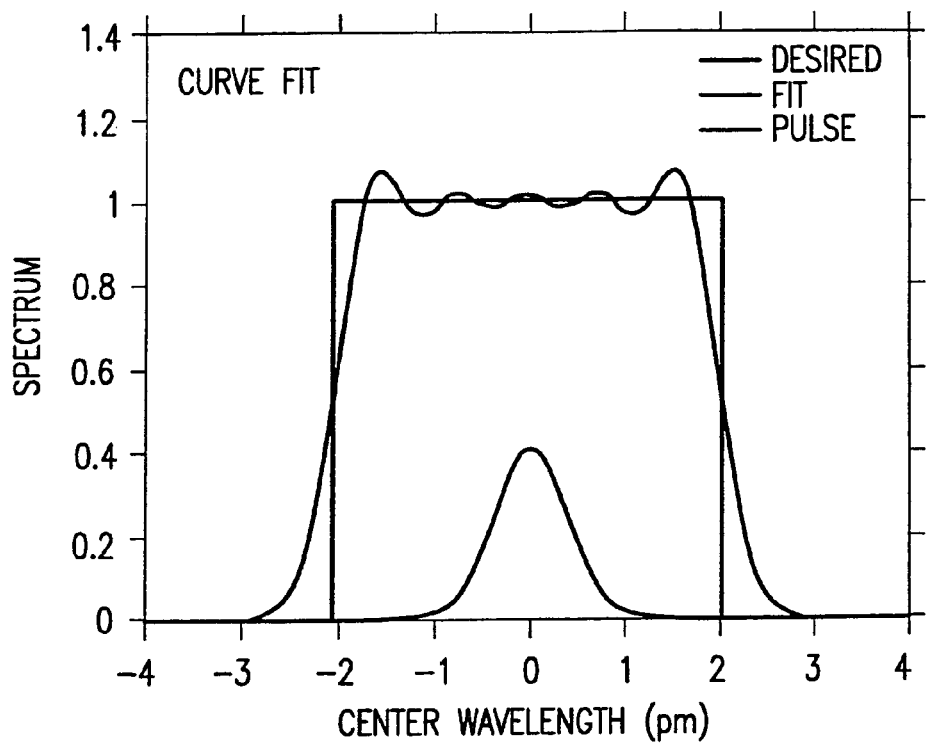
Figure 10G:
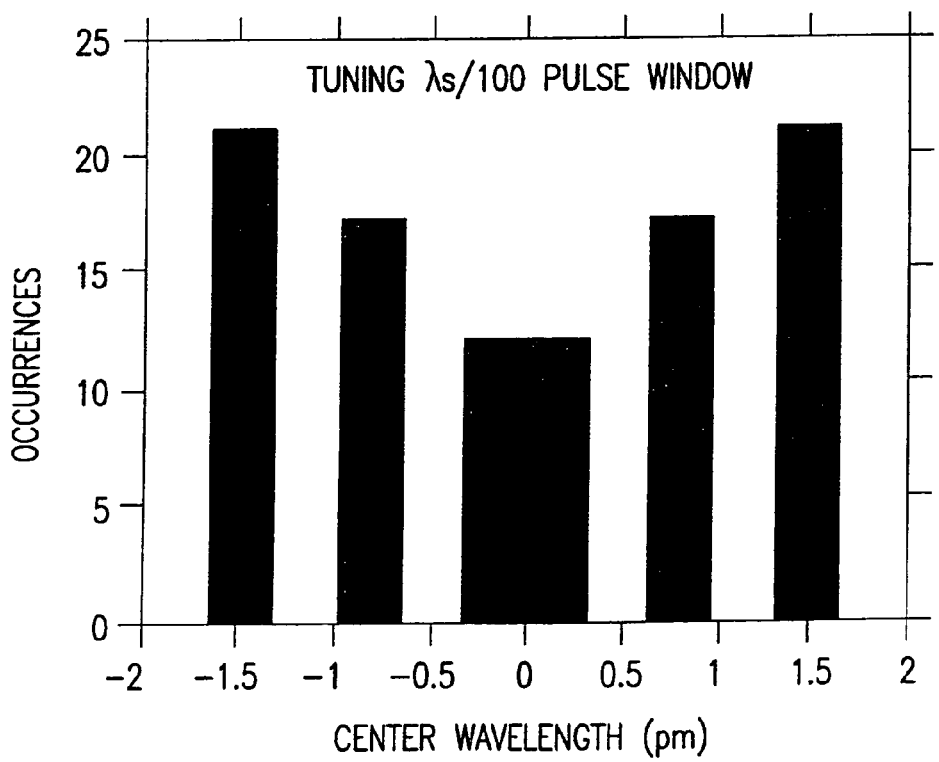

The PZT driver can be programmed to simulate virtually any desired spectrum. Some of the techniques for precisely controlling the wavelength with the PZT driving the tuning mirror 14 are described in U.S. patent application Ser. No. 10/027,210 filed simultaneously with this application and incorporated by reference herein. For example, FIG. 10A shows a desired Gaussian spectrum with FWHM of 3.3 pm and a simulated fit for a 30-pulse window of pulses having a FWHM of 0.8 pm. FIG. 10B shows a proposed sequence of pulses for the 30-pulse window in which the center line wavelength follows a generally sine pattern. FIG. 10C compares the frequency content of a smooth wavelength sequence such as the FIG. 10B with a random sequence. FIGS. 10D and 10E show the effect of 133 Hz sine pattern and a 30-pulse window and a 40 Hz sine with a 100-pulse window. FIGS. 10F and 10G show how to produce a flat-top spectrum.

Figure 10H:
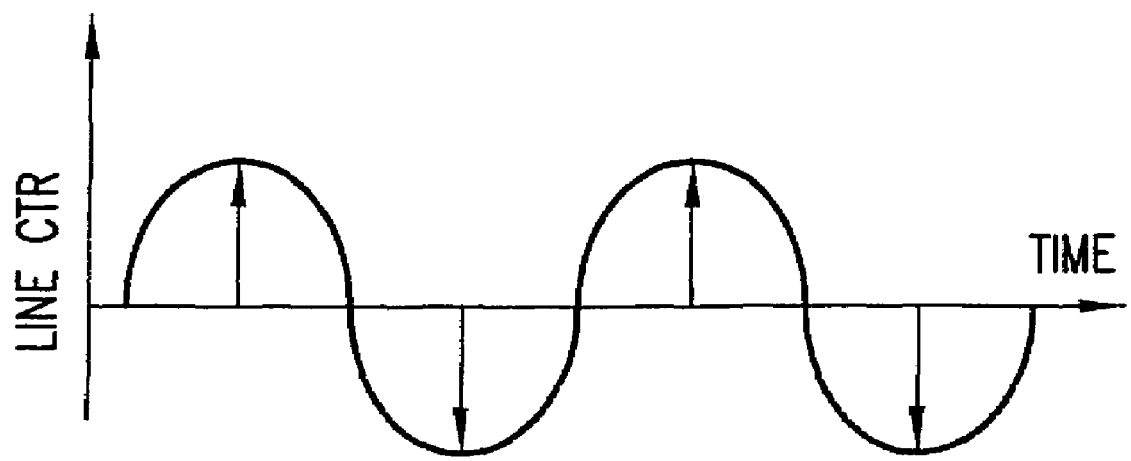
Figure 10I:
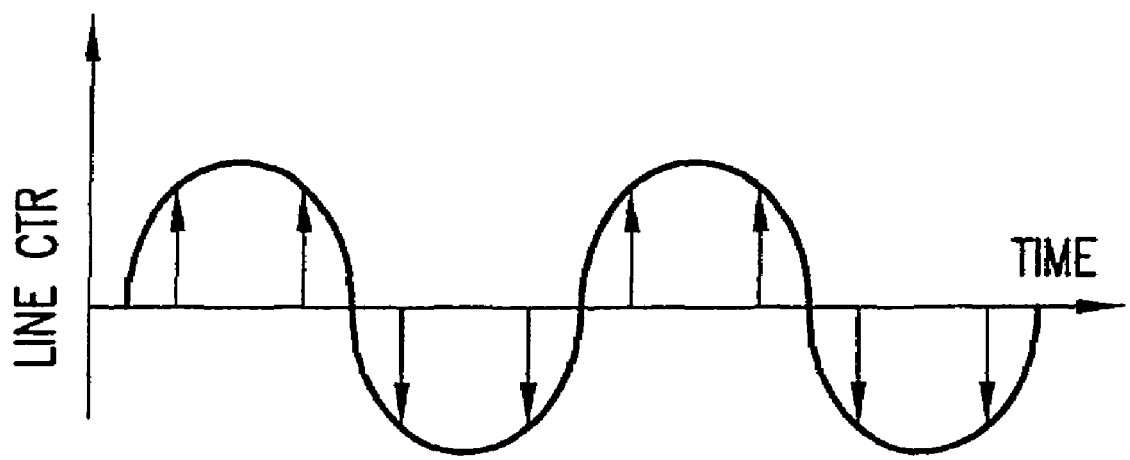

The reader should understand that rapid changes in mirror position result in substantial non-linearities. One solution could be to syncronize mirror motion with pulse repetition rate such as shown in FIG. 10H and FIG. 10I.

While particular embodiments of the present invention have been shown and described, it will be obvious to those skilled in the art that changes and modifications may be made without departing from this invention in its broader aspects. For example, partially line narrowed lasers where the bandwidth is line narrowed with a plurality of prisms and the beam is reflected with a tuning mirror. This technique would involve dithering the tuning mirror. The peak separation could vary from the examples shown. Normally, however, the peaks would be offset by at least 0.5 pm. In lithography, bursts of pulses normally contain about 20 to 400 pulses. Most lithography units now operate at 1000 Hz or greater. It should also be recognized that these dithering techniques helps to eliminate coherence problems. Instead of dithering the mirror to increase the effective bandwidth, the grating could be dithered with a dither pattern chosen to produce an effective larger bandwidth or desired effective spectrum. Therefore, the appended claims are to encompass within their scope all such changes and modifications as fall within the true spirit and scope of this invention.

We claim:

1. A process for providing lithographic exposures utilizing a line narrowed high repetition rate short pulse duration gas discharge laser, providing laser output light pulses in bursts of pulses comprising a selected number of pulses, and comprising a line narrowing package performing the line narrowing, comprising the steps of:
    utilizing a fast responding tuning mechanism within the line narrowing package to adjust the center wavelength of laser pulses in a burst of pulses on a pulse-to-pulse basis to achieve an integrated spectrum for the burst of pulses approximating a desired laser spectrum.

2. A process as in claim 1 wherein said burst of pulses are a number of pulse within the range of about 20 to 400 pulses.

3. A process as in claim 1 wherein said burst of pulses are produced as a repetition rate in excess of 1000 pulses per second.

4. A process as in claim 1 wherein a wavelength spectrum is measured for each pulse.

5. A process as in claim 1 wherein the wavelength measured for each pulse is used to control wavelength of one or more subsequent pulses.

6. A process as in claim 1 wherein said desired laser spectrum comprises two or more separate peaks.

7. A process as in claim 6 wherein said two or more peaks are separated by at least 0.5 picometer.

8. A process as in claim 6 wherein said desired spectrum comprises three separate peaks.

9. A microlithography light source comprising:
    a gas discharge laser;
    a line narrowing package,
    a fast responding tuning mechanism within the line narrowing package operative to achieve a multimode illumination spectrum for the burst of pulses, wherein the fast responding tuning mechanism comprises a tuning mirror controlled by a piezoelectric actuator.

10. The apparatus of claim 9 further comprising:
    the multi-mode illumination spectrum comprises two centerline wavelengths separated by a selected difference in centerline wavelength.

11. The apparatus of claim 9 further comprising:
    the multimode illumination spectrum is selected to illuminate a plurality of focal planes in a photoresist.

12. The apparatus of claim 10 further comprising:
    the multimode illumination spectrum is selected to illuminate a plurality of focal planes in a photoresist.

13. The apparatus of claim 10 further comprising:
    the multimode illumination spectrum is selected to illuminate a plurality of focal planes in a photoresist.

14. The apparatus of claim 11 further comprising:
    the multimode illumination spectrum is selected to produce an aerial image that is the sum of the aerial images in a plurality of focal planes.

15. The apparatus of claim 11 further comprising:
the multimode illumination spectrum is selected to produce an aerial image that is the sum of the aerial images in a plurality of focal planes.

16. The apparatus of claim 12 further comprising:
the multimode illumination spectrum is selected to produce an aerial image that is the sum of the aerial images in a plurality of focal planes.

17. The apparatus of claim 13 further comprising:
the multimode illumination spectrum is selected to produce an aerial image that is the sum of the aerial images in a plurality of focal planes.

18. The apparatus of claim 14 further comprising:
the multi-mode spectrum is a summation of a first single mode spectrum having a selected bandwidth and a second single mode spectrum having a selected bandwidth with a wavelength offset.

19. The apparatus of claim 15 further comprising:
the multi-mode spectrum is a summation of a first single mode spectrum having a selected bandwidth and a second single mode spectrum having a selected bandwidth with a wavelength offset.

20. The apparatus of claim 16 further comprising:
the multi-mode spectrum is a summation of a first single mode spectrum having a selected bandwidth and a second single mode spectrum having a selected bandwidth with a wavelength offset.

21. The apparatus of claim 17 further comprising:
the multi-mode spectrum is a summation of a first single mode spectrum having a selected bandwidth and a second single mode spectrum having a selected bandwidth with a wavelength offset.

22. The apparatus of claim 18 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

23. The apparatus of claim 19 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

24. The apparatus of claim 20 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

25. The apparatus of claim 21 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

26. The apparatus of claim 22 further comprising:
the voltage to the electro-actuated actuator is modulated.

27. The apparatus of claim 23 further comprising:
the voltage to the electro-actuated actuator is modulated.

28. The apparatus of claim 24 further comprising:
the voltage to the electro-actuated actuator is modulated.

29. The apparatus of claim 25 further comprising:
the voltage to the electro-actuated actuator is modulated.

30. A microlithography light source comprising:
a gas discharge laser;
a line narrowing package;
a fast responding tuning mechanism operative to adjust the center wavelength of laser pulses in a burst of pulses to achieve a multi-mode illumination spectrum for the burst, whereby the light delivered by the light source enables illumination with two or more narrow-band centerline wavelengths during a single illumination period during the burst.

31. The apparatus of claim 30 further comprising:
the fast responding tuning mechanism comprises a tuning mirror controlled by a piezoelectric actuator.

32. The apparatus of claim 30 further comprising:
the multi-mode illumination spectrum comprises two centerline wavelengths separated by a selected difference in centerline wavelength.

33. The apparatus of claim 31 further comprising:
the multi-mode illumination spectrum comprises two centerline wavelengths separated by a selected difference in centerline wavelength.

34. The apparatus of claim 30 further comprising:
the multimode illumination spectrum is selected to illuminate a plurality of focal planes in a photoresist.

35. The apparatus of claim 31 further comprising:
the multimode illumination spectrum is selected to illuminate a plurality of focal planes in a photoresist.

36. The apparatus of claim 32 further comprising:
the multimode illumination spectrum is selected to illuminate a plurality of focal planes in a photoresist.

37. The apparatus of claim 33 further comprising:
the multimode illumination spectrum is selected to illuminate a plurality of focal planes in a photoresist.

38. The apparatus of claim 34 further comprising:
the multimode illumination spectrum is selected to produce an aerial image that is the sum of the aerial images in a plurality of focal planes.

39. The apparatus of claim 35 further comprising:
the multimode illumination spectrum is selected to produce an aerial image that is the sum of the aerial images in a plurality of focal planes.

40. The apparatus of claim 36 further comprising:
the multimode illumination spectrum is selected to produce an aerial image that is the sum of the aerial images in a plurality of focal planes.

41. The apparatus of claim 37 further comprising:
the multimode illumination spectrum is selected to produce an aerial image that is the sum of the aerial images in a plurality of focal planes.

42. The apparatus of claim 38 further comprising:
the multi-mode spectrum is a summation of a first single mode spectrum having a selected bandwidth and a second single mode spectrum having a selected bandwidth with a wavelength offset.

43. The apparatus of claim 39 further comprising:
the multi-mode spectrum is a summation of a first single mode spectrum having a selected bandwidth and a second single mode spectrum having a selected bandwidth with a wavelength offset.

44. The apparatus of claim 40 further comprising:
the multi-mode spectrum is a summation of a first single mode spectrum having a selected bandwidth and a second single mode spectrum having a selected bandwidth with a wavelength offset.

45. The apparatus of claim 41 further comprising;
the multi-mode spectrum is a summation of a first single mode spectrum having a selected bandwidth and a second single mode spectrum having a selected bandwidth with a wavelength offset.

46. The apparatus of claim 42 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

47. The apparatus of claim 43 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

48. The apparatus of claim 44 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

49. The apparatus of claim 45 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

50. The apparatus of claim 46 further comprising:
the voltage to the electro-actuated actuator is modulated.

51. The apparatus of claim 47 further comprising:
the voltage to the electro-actuated actuator is modulated.

52. The apparatus of claim 48 further comprising:
the voltage to the electro-actuated actuator is modulated.

53. The apparatus of claim 49 further comprising:
the voltage to the electro-actuated actuator is modulated.

54. The process of claim 1 further comprising:
the fast responding tuning mechanism comprises a tuning mirror controlled by a piezoelectric actuator.

55. The apparatus of claim 30 further comprising:
the multi-mode illumination spectrum comprises two centerline wavelengths separated by a selected difference in centerline wavelength.

56. The apparatus of claim 54 further comprising:
the multi-mode illumination spectrum comprises two centerline wavelengths separated by a selected difference in centerline wavelength.

57. The apparatus of claim 30 further comprising:
the multimode illumination spectrum is selected to illuminate a plurality of focal planes in a photoresist.

58. The apparatus of claim 54 further comprising:
the multimode illumination spectrum is selected to illuminate a plurality of focal planes in a photoresist.

59. The apparatus of claim 55 further comprising:
the multimode illumination spectrum is selected to illuminate a plurality of focal planes in a photoresist.

60. The apparatus of claim 56 further comprising:
the multimode illumination spectrum is selected to illuminate a plurality of focal planes in a photoresist.

61. The apparatus of claim 57 further comprising:
the multimode illumination spectrum is selected to produce an aerial image that is the sum of the aerial images in a plurality of focal planes.

62. The apparatus of claim 58 further comprising:
the multimode illumination spectrum is selected to produce an aerial image that is the sum of the aerial images in a plurality of focal planes.

63. The apparatus of claim 59 further comprising:
the multimode illumination spectrum is selected to produce an aerial image that is the sum of the aerial images in a plurality of focal planes.

64. The apparatus of claim 60 further comprising:
the multimode illumination spectrum is selected to produce an aerial image that is the sum of the aerial images in a plurality of focal planes.

65. The apparatus of claim 61 further comprising:
the multi-mode spectrum is a summation of a first single mode spectrum having a selected bandwidth and a second single mode spectrum having a selected bandwidth with a wavelength offset.

66. The apparatus of claim 62 further comprising:
the multi-mode spectrum is a summation of a first single mode spectrum having a selected bandwidth and a second single mode spectrum having a selected bandwidth with a wavelength offset.

67. The apparatus of claim 63 further comprising:
the multi-mode spectrum is a summation of a first single mode spectrum having a selected bandwidth and a second single mode spectrum having a selected bandwidth with a wavelength offset.

68. The apparatus of claim 64 further comprising:
the multi-mode spectrum is a summation of a first single mode spectrum having a selected bandwidth and a second single mode spectrum having a selected bandwidth with a wavelength offset.

69. The apparatus of claim 65 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

70. The apparatus of claim 66 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

71. The apparatus of claim 67 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

72. The apparatus of claim 68 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

73. The apparatus of claim 69 further comprising:
the voltage to the electro-actuated actuator is modulated.

74. The apparatus of claim 70 further comprising:
the voltage to the electro-actuated actuator is modulated.

75. The apparatus of claim 71 further comprising:
the voltage to the electro-actuated actuator is modulated.

76. The apparatus of claim 72 further comprising:
the voltage to the electro-actuated actuator is modulated.

77. A microlithography method utilizing a light source comprising:
utilizing a gas discharge laser;
utilizing a line narrowing package,
utilizing a fast responding tuning mechanism within the line narrowing package, adjusting the center wavelength of laser pulses in a burst of pulses to achieve an integrated spectrum for the burst of pulses approximating a desired laser spectrum.

78. The method of claim 77 further comprising:
the fast responding tuning mechanism comprises a tuning minor controlled by a piezoelectric actuator.

79. The method of claim 77 further comprising:
the multi-mode illumination spectrum comprises two centerline wavelengths separated by a selected difference in centerline wavelength.

80. The method of claim 78 further comprising:
the multi-mode illumination spectrum comprises two centerline wavelengths separated by a selected difference in centerline wavelength.

81. The method of claim 77 further comprising:
the multimode illumination spectrum is selected to illuminate a plurality of focal planes in a photoresist.

82. The method of claim 78 further comprising:
the multimode illumination spectrum is selected to illuminate a plurality of focal planes in a photoresist.

83. The method of claim 79 further comprising:
the multimode illumination spectrum is selected to illuminate a plurality of focal planes in a photoresist.

84. The method of claim 80 further comprising:
the multimode illumination spectrum is selected to illuminate a plurality of focal planes in a photoresist.

85. The method claim 81 further comprising:
the multimode illumination spectrum is selected to produce an aerial image that is the sum of the aerial images in a plurality of focal planes.

86. The method of claim 82 further comprising:
the multimode illumination spectrum is selected to produce an aerial image that is the sum of the aerial images in a plurality of focal planes.

87. The method of claim 83 further comprising:
the multimode illumination spectrum is selected to produce an aerial image that is the sum of the aerial images in a plurality of focal planes.

88. The method of claim 84 further comprising:
the multimode illumination spectrum is selected to produce an aerial image that is the sum of the aerial images in a plurality of focal planes.

89. The method of claim 85 further comprising:
the multi-mode spectrum is a summation of a first single mode spectrum having a selected bandwidth and a second single mode spectrum having a selected bandwidth with a wavelength offset.

90. The method of claim 86 further comprising:
the multi-mode spectrum is a summation of a first single mode spectrum having a selected bandwidth and a second single mode spectrum having a selected bandwidth with a wavelength offset.

91. The method of claim 87 further comprising:
the multi-mode spectrum is a summation of a first single mode spectrum having a selected bandwidth and a second single mode spectrum having a selected bandwidth with a wavelength offset.

92. The method of claim 88 further comprising:
the multi-mode spectrum is a summation of a first single mode spectrum having a selected bandwidth and a second single mode spectrum having a selected bandwidth with a wavelength offset.

93. The method of claim 89 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

94. The method of claim 90 further comprising:
a control mechanism operative to apply a voltage to an electro-actuated actuator operative to tune the fast timing mechanism;
wherein the voltage is selected such that, when filtered by the dynamics of the tuning mirror, it results in the multi-mode spectrum having bandwidths of the desired values.

95. The method of claim 91 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

96. The method of claim 92 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

97. The method of claim 93 further comprising:
the voltage to the electro-actuated actuator is modulated.

98. The method of claim 94 further comprising:
the voltage to the electro-actuated actuator is modulated.

99. The method of claim 95 further comprising:
the voltage to the electro-actuated actuator is modulated.

100. The method of claim 96 further comprising:
the voltage to the electro-actuated actuator is modulated.

101. A microlithography method utilizing a light source comprising:
utilizing a gas discharge laser;
utilizing a line narrowing package;
utilizing a fast responding tuning mechanism contained in the line narrowing package adjusting the center wavelength of laser pulses in a burst of pulses to achieve a multi-mode illumination spectrum for the burst;

the light delivered by the light source illuminating with two or more narrowband centerline wavelengths during a single illumination period during the burst.

102. The method of claim 101 further comprising:
the fast responding tuning mechanism comprises a tuning mirror controlled by a piezoelectric actuator.

103. The method of claim 101 further comprising:
the multi-mode illumination spectrum comprises two centerline wavelengths separated by a selected difference in centerline wavelength.

104. The method of claim 102 further comprising:
the multi-mode illumination spectrum comprises two centerline wavelengths separated by a selected difference in centerline wavelength.

105. The method of claim 101 further comprising:
the multimode illumination spectrum is selected to illuminate a plurality of focal planes in a photoresist.

106. The method of claim 102 further comprising:
the multimode illumination spectrum is selected to illuminate a plurality of focal planes in a photoresist.

107. The method of claim 103 further comprising:
the multimode illumination spectrum is selected to illuminate a plurality of focal planes in a photoresist.

108. The method of claim 104 further comprising:
the multimode illumination spectrum is selected to illuminate a plurality of focal planes in a photoresist.

109. The method of claim 105 further comprising:
the multimode illumination spectrum is selected to produce an aerial image that is the sum of the aerial images in a plurality of focal planes.

110. The method of claim 106 further comprising:
the multimode illumination spectrum is selected to produce an aerial image that is the sum of the aerial images in a plurality of focal planes.

111. The method of claim 107 further comprising:
the multimode illumination spectrum is selected to produce an aerial image that is the sum of the aerial images in a plurality of focal planes.

112. The method of claim 108 further comprising:
the multimode illumination spectrum is selected to produce an aerial image that is the sum of the aerial images in a plurality of focal planes.

113. The method of claim 109 further comprising:
the multi-mode spectrum is a summation of a first single mode spectrum having a selected bandwidth and a second single mode spectrum having a selected bandwidth with a wavelength offset.

114. The method of claim 110 further comprising:
the multi-mode spectrum is a summation of a first single mode spectrum having a selected bandwidth and a second single mode spectrum having a selected bandwidth with a wavelength offset.

115. The method of claim 111 further comprising:
the multi-mode spectrum is a summation of a first single mode spectrum having a selected bandwidth and a second single mode spectrum having a selected bandwidth with a wavelength offset.

116. The method of claim 112 further comprising:
the multi-mode spectrum is a summation of a first single mode spectrum having a selected bandwidth and a second single mode spectrum having a selected bandwidth with a wavelength offset.

117. The method of claim 113 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

118. The method of claim 114 further comprising:
a control method operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

119. The method of claim 115 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

120. The method of claim 116 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

121. The method of claim 117 further comprising:
the voltage to the electro-actuated actuator is modulated.

122. The method of claim 118 further comprising:
the voltage to the electro-actuated actuator is modulated.

123. The method of claim 119 further comprising:
the voltage to the electro-actuated actuator is modulated.

124. The method of claim 120 further comprising:
the voltage to the electro-actuated actuator is modulated.

125. A process for providing lithographic exposures utilizing a line narrowed high repetition rate short pulse duration gas discharge laser, providing laser output light pulses in bursts of pulses comprising a selected number of pulses, and comprising a line narrowing package performing the line narrowing, comprising the steps of:
utilizing a fast responding tuning mechanism within the line narrowing package to adjust the center wavelength of laser pulses in a burst of pulses on a pulse-to-pulse basis;
the fast responding tuning mechanism comprising a modulatable field stimulated wavefront modifier comprising a material that changes properties in response to exposure to an electrical and/or magnetic field.

126. A process as in claim 125 wherein said burst of pulses are a number of pulse within the range of about 20 to 400 pulses.

127. A process as in claim 125 wherein said burst of pulses are produced as a repetition rate in excess of 1000 pulses per second.

128. A process as in claim 125 wherein a wavelength spectrum is measured for each pulse.

129. A process as in claim 125 wherein the wavelength measured for each pulse is used to control wavelength of one or more subsequent pulses.

130. A process as in claim 1 wherein said desired laser spectrum comprises two or more separate peaks.

131. A process as in claim 130 wherein said two or more peaks are separated by at least 0.5 picometer.

132. A process as in claim 129 wherein said desired spectrum comprises three separate peaks.

133. A microlithography light source comprising:
a gas discharge laser;
a line narrowing package,
a fast responding tuning mechanism within the line narrowing package operative to adjust the center wavelength of laser pulses in a burst of pulses to achieve an integrated spectrum for the burst of pulses comprising a modulatable field stimulated wavefront modifier comprising a material that changes properties in response to exposure to an electrical and/or magnetic field.

134. The apparatus of claim 133 further comprising:
the modulatable field stimulated wave front modifier comprises a tuning mirror controlled by a piezoelectric actuator.

135. The apparatus of claim 134 further comprising:
the multi-mode illumination spectrum comprises two centerline wavelengths separated by a selected difference in centerline wavelength.

136. The apparatus of claim 134 further comprising:
the multi-mode illumination spectrum comprises two centerline wavelengths separated by a selected difference in centerline wavelength.

137. The apparatus of claim 133 further comprising:
the multimode illumination spectrum is selected to illuminate a plurality of focal planes in a photoresist.

138. The apparatus of claim 134 further comprising:
the multimode illumination spectrum is selected to illuminate a plurality of focal planes in a photoresist.

139. The apparatus of claim 135 further comprising:
the multimode illumination spectrum is selected to illuminate a plurality of focal planes in a photoresist.

140. The apparatus of claim 136 further comprising:
the multimode illumination spectrum is selected to illuminate a plurality of focal planes in a photoresist.

141. The apparatus of claim 137 further comprising:
the multimode illumination spectrum is selected to produce an aerial image that is the sum of the aerial images in a plurality of focal planes.

142. The apparatus of claim 138 further comprising:
the multimode illumination spectrum is selected to produce an aerial image that is the sum of the aerial images in a plurality of focal planes.

143. The apparatus of claim 139 further comprising:
the multimode illumination spectrum is selected to produce an aerial image that is the sum of the aerial images in a plurality of focal planes.

144. The apparatus of claim 140 further comprising:
the multimode illumination spectrum is selected to produce an aerial image that is the sum of the aerial images in a plurality of focal planes.

145. The apparatus of claim 141 further comprising:
the multi-mode spectrum is a summation of a first single mode spectrum having a selected bandwidth and a second single mode spectrum having a selected bandwidth with a wavelength offset.

146. The apparatus of claim 142 further comprising:
the multi-mode spectrum is a summation of a first single mode spectrum having a selected bandwidth and a second single mode spectrum having a selected bandwidth with a wavelength offset.

147. The apparatus of claim 143 further comprising:
the multi-mode spectrum is a summation of a first single mode spectrum having a selected bandwidth and a second single mode spectrum having a selected bandwidth with a wavelength offset.

148. The apparatus of claim 144 further comprising:
the multi-mode spectrum is a summation of a first single mode spectrum having a selected bandwidth and a second single mode spectrum having a selected bandwidth with a wavelength offset.

149. The apparatus of claim 145 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

150. The apparatus of claim 146 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

151. The apparatus of claim 147 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

152. The apparatus of claim 148 further comprising:
a control mechanism operative to apply a voltage to an electro-actuated actuator operative to tune the fast tuning mechanism;
wherein the voltage is selected such that, when filtered by the dynamics of the tuning mirror, it results in the multi-mode spectrum having bandwidths of the desired values.

153. The apparatus of claim 149 further comprising:
the voltage to the electro-actuated actuator is modulated.

154. The apparatus of claim 150 further comprising:
the voltage to the electro-actuated actuator is modulated.

155. The apparatus of claim 151 further comprising:
the voltage to the electro-actuated actuator is modulated.

156. The apparatus of claim 152 further comprising:
the voltage to the electro-actuated actuator is modulated.

157. The process of claim 1 further comprising:
utilizing the fast responding tuning mechanism to adjust the center wavelength of laser pulses in a burst of pulses on a pulse-to-pulse basis to achieve any one of a plurality of different integrated spectra for the burst of pulses each different spectrum approximating a desired laser spectrum.

158. The apparatus of claim 9 further comprising:
the fast tuning mechanism comprising a mechanism to adjust the center wavelength of laser pulses in a burst of pulses to achieve any one of a plurality of different multimode illumination spectra for the burst of pulses each different spectrum approximating a different desired laser spectrum.

159. The apparatus of claim 30 further comprising:
the fast responding tuning mechanism comprising a mechanism to adjust the center wavelength of laser pulses in a burst of pulses to achieve any one of a plurality of multi-mode illumination spectra for the burst, whereby the light delivered by the light source enables illumination with two or more narrowband centerline wavelengths during a single illumination period during the burst, selected from the plurality of multi-mode illumination spectra.

160. The method of claim 77 further comprising utilizing a fast responding tuning mechanism within the line narrowing package, adjusting the center wavelength of laser pulses in a burst of pulses to achieve one of a plurality of different integrated spectra for the burst of pulses each different integrated spectrum approximating a different desired laser spectrum.

161. The method of claim 101 further comprising:
utilizing the fast responding tuning mechanism contained in the line narrowing package, adjusting the center wavelength of laser pulses in a burst of pulses to achieve one of a plurality of multi-mode illumination spectra for the burst;
the light delivered by the light source illuminating with two or more narrowband centerline wavelengths during a single illumination period during the burst achieving the one of the plurality of multi-mode illumination spectra.

162. The process of claim 125 further comprising:
the fast responding tuning mechanism comprising a modulatable field stimulated wavefront modifier comprising a material that changes properties in response to exposure to an electrical and/or magnetic field to achieve one of a plurality of different spectra, each different integrated spectrum approximating a different desired spectrum.

163. The apparatus of claim 133 further comprising:
the fast responding tuning mechanism within the line narrowing package operative to adjust the center wavelength of laser pulses in a burst of pulses to achieve one of a plurality of different integrated spectrum for the burst of pulses comprising a modulatable field stimulated wavefront modifier comprising a material that changes properties in response to exposure to an electrical and/or magnetic field, each different integrated spectrum approximating a different desired spectrum.

164. A microlithography light source producing laser output light pulses in bursts of pulses, comprising a selected number of pulses, comprising:
a gas discharge laser;
a line narrowing package,
a fast responding tuning mechanism within the line narrowing package operative to achieve an integrated multi-peak illumination spectrum for the burst of pulses, wherein the fast responding tuning mechanism comprises a tuning mirror controlled by a piezoelectric actuator.

165. The apparatus of claim 164 further comprising:
the multi-peak illumination spectrum comprises two centerline wavelengths separated by a selected difference in centerline wavelength.

166. The apparatus of claim 164 further comprising:
the multi-peak illumination spectrum is selected to illuminate a plurality of focal planes in a photoresist.

167. The apparatus of claim 165 further comprising:
the multi-peak illumination spectrum is selected to illuminate a plurality of focal planes in a photoresist.

168. The apparatus of claim 166 further comprising:
the multi-peak illumination spectrum is selected to illuminate a plurality of focal planes in a photoresist.

169. The apparatus of claim 166 further comprising:
the multi-peak illumination spectrum is selected to produce an aerial image that is the sum of the aerial images in a plurality of focal planes.

170. The apparatus of claim 167 further comprising:
the multi-peak illumination spectrum is selected to produce an aerial image that is the sum of the aerial images in a plurality of focal planes.

171. The apparatus of claim 168 further comprising:
the multi-peak illumination spectrum is selected to produce an aerial image that is the sum of the aerial images in a plurality of focal planes.

172. The apparatus of claim 169 further comprising:
the multi-peak spectrum is a summation of a first single peak spectrum having a selected bandwidth and a second single peak spectrum having a selected bandwidth with a wavelength offset.

173. The apparatus of claim 170 further comprising:
the multi-peak spectrum is a summation of a first single mode spectrum having a selected bandwidth and a second single mode spectrum having a selected bandwidth with a wavelength offset.

174. The apparatus of claim 171 further comprising:
the multi-peak spectrum is a summation of a first single mode spectrum having a selected bandwidth and a second single mode spectrum having a selected bandwidth with a wavelength offset.

175. The apparatus as in claim 164 wherein the burst of pulses are a number of pulses within the range of about 20 to 400 pulses.

176. The apparatus as in claim 164 wherein the burst of pulses are produced at a repetition rate in excess of 1000 pulses per second.

177. The apparatus as in claim 164 wherein a wavelength spectrum is measured for each pulse.

178. The apparatus as in claim 177 wherein the wavelength measured for each pulse is used to control wavelength of one or more subsequent pulses.

179. The apparatus in claim 164 the desired laser spectrum comprises two or more separate peaks.

180. The apparatus as in claim 179 wherein the two or more peaks are separated by at least 0.5 picometer.

181. The apparatus as in claim 179 wherein the desired spectrum comprises three separate peaks.

182. A microlithography light source producing laser output light pulses in bursts of pulses, comprising a selected number of pulses, comprising:
a gas discharge laser;
a fast responding tuning mechanism operative to achieve an integrated multi-peak illumination spectrum for the burst of pulses, wherein the fast responding tuning mechanism comprises a tuning mirror controlled by a piezoelectric actuator.

183. The apparatus of claim 182 further comprising:
the multi-peak illumination spectrum comprises two centerline wavelengths separated by a selected difference in centerline wavelength.

184. The apparatus of claim 182 further comprising:
the multi-peak illumination spectrum is selected to illuminate a plurality of focal planes in a photoresist.

185. The apparatus of claim 183 further comprising:
the multi-peak illumination spectrum is selected to illuminate a plurality of focal planes in a photoresist.

186. The apparatus of claim 184 further comprising:
the multi-peak illumination spectrum is selected to produce an aerial image that is the sum of the aerial images in a plurality of focal planes.

187. The apparatus of claim 185 further comprising:
the multi-peak illumination spectrum is selected to produce an aerial image that is the sum of the aerial images in a plurality of focal planes.

188. The apparatus of claim 186 further comprising:
the multi-peak spectrum is a summation of a first single peak spectrum having a selected bandwidth and a second single peak spectrum having a selected bandwidth with a wavelength offset.

189. The apparatus of claim 187 further comprising:
the multi-peak spectrum is a summation of a first single mode spectrum having a selected bandwidth and a second single mode spectrum having a selected bandwidth with a wavelength offset.

190. The apparatus as in claim 182 wherein the burst of pulses are a number of pulses within the range of about 20 to 400 pulses.

191. The apparatus as in claim 182 wherein the burst of pulses are produced at a repetition rate in excess of 1000 pulses per second.

192. The apparatus as in claim 182 wherein a wavelength spectrum is measured for each pulse.

193. The apparatus as in claim 192 wherein the wavelength measured for each pulse is used to control wavelength of one or more subsequent pulses.

194. The apparatus in claim 182 wherein the desired laser spectrum comprises two or more separate peaks.

195. The apparatus as in claim 194 wherein the two or more peaks are separated by at least 0.5 picometer.

196. The apparatus as in claim 195 wherein the desired spectrum comprises three separate peaks.

* * * * *